US012641881B2

(12) United States Patent
Hosoyachi et al.

(10) Patent No.: US 12,641,881 B2
(45) Date of Patent: May 26, 2026

(54) DISPLAY SUBSTRATE AND DISPLAY DEVICE

(71) Applicant: Sharp Display Technology Corporation, Kameyama City (JP)

(72) Inventors: Kohei Hosoyachi, Kameyama City (JP); Yuhichiroh Murakami, Kameyama City (JP); Shige Furuta, Kameyama City (JP); Takahiro Yamaguchi, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 0 days.

(21) Appl. No.: 19/007,714

(22) Filed: Jan. 2, 2025

(65) Prior Publication Data

US 2025/0234649 A1     Jul. 17, 2025

(30) Foreign Application Priority Data

Jan. 16, 2024    (JP) ................................. 2024-004416

(51) Int. Cl.
| | |
|---|---|
| *H10D 86/40* | (2025.01) |
| *G02F 1/1362* | (2006.01) |
| *G09G 3/00* | (2006.01) |

(52) U.S. Cl.
CPC ..... *H10D 86/441* (2025.01); *G02F 1/136286* (2013.01); *G09G 3/006* (2013.01); *G09G 2300/0426* (2013.01); *G09G 2310/0286* (2013.01); *G09G 2320/045* (2013.01); *G09G 2330/026* (2013.01); *G09G 2330/027* (2013.01); *G09G 2330/04* (2013.01)

(58) Field of Classification Search
CPC .. H10D 86/441; H10D 86/60; G02F 1/13454; G02F 1/136286; G02F 1/13452; G02F 1/1345; G02F 2201/56; G09G 3/006; G09G 2300/0426; G09G 2330/04
See application file for complete search history.

(56) References Cited

U.S. PATENT DOCUMENTS

| | | | |
|---|---|---|---|
| 10,181,462 B2 | 1/2019 | Kobashi | |
| 10,475,873 B2 * | 11/2019 | Matsueda | ............ H10K 59/131 |
| 2015/0022770 A1 * | 1/2015 | Yamaguchi | ....... G02F 1/136286 |
| | | | 349/139 |
| 2018/0330653 A1 * | 11/2018 | Zhou | ...................... G09G 3/006 |
| 2022/0231055 A1 * | 7/2022 | Qin | ...................... H10D 86/441 |
| 2022/0343843 A1 * | 10/2022 | Du | ...................... G09G 3/3233 |

* cited by examiner

*Primary Examiner* — Xuemei Zheng
(74) *Attorney, Agent, or Firm* — ScienBiziP, P.C.

(57) ABSTRACT

A display substrate includes: a first wiring line located in a display region where an image is displayed; a second wiring line located in a non-display region where the image is not displayed; a first circuit unit located in the non-display region and including a first output section connected to the first wiring line and a first input section connected to the second wiring line; and a second circuit unit located in the non-display region and connected to the second wiring line but not connected to the first wiring line, wherein the second circuit unit is located adjacent to the first circuit unit along the second wiring line in the non-display region.

16 Claims, 30 Drawing Sheets

DISPLAY SUBSTRATE AND DISPLAY DEVICE

CROSS-REFERENCE TO RELATED APPLICATIONS

This application claims the benefit of priority to Japanese Patent Application Number 2024-004416 filed on Jan. 16, 2024. The entire contents of the above-identified application are hereby incorporated by reference.

BACKGROUND

Technical Field

The techniques disclosed herein relate to display substrates and display devices.

A circuit substrate provided in a display device described in U.S. Pat. No. 10,181,462 is known as an example of a circuit substrate in the related art. U.S. Pat. No. 10,181,462 discloses a semiconductor device as an example of a circuit substrate. The semiconductor device described in the specification of U.S. Pat. No. 10,181,462 includes, on a substrate, multiple semiconductor circuits, wiring lines electrically connected to the multiple semiconductor circuits, input terminals electrically connected to the wiring lines for supplying electrical signals, and protection circuits connected to the wiring lines for protecting the wiring lines and the semiconductor circuits from static electricity and noise, and at least one of the multiple semiconductor circuits is positioned between the input terminals and the protection circuits.

SUMMARY

In the semiconductor device described in the specification of U.S. Pat. No. 10,181,462 mentioned above, multiple protection circuits are arranged in groups at an end portion on a side of the terminals and another end portion on the opposite side with respect to a scanning line drive circuit, which is the semiconductor circuit. Thus, a space is required for arranging the protection circuits in a frame region of an active matrix substrate, which is a semiconductor device, making it difficult to narrow the frame of the active matrix substrate.

The technique described herein has been made based on the circumstances described above, and is directed to making the frame smaller.

(1) A display substrate according to the technique described herein includes a first wiring line located in a display region where an image is displayed, a second wiring line located in a non-display region where the image is not displayed, a first circuit unit located in the non-display region and including a first output section connected to the first wiring line and a first input section connected to the second wiring line, and a second circuit unit located in the non-display region and connected to the second wiring line but not connected to the first wiring line, and the second circuit unit is located adjacent to the first circuit unit along the second wiring line in the non-display region.

(2) In addition to (1), in the display substrate, the second wiring line may include a linear portion being linear along a first direction and a curved portion being curved and intersecting the first direction, at least two first wiring lines, each first wiring line being identical to the first wiring line, may be arranged side by side with a space in the first direction, at least two first circuit units, each first circuit unit being identical to the first circuit unit, may be arranged side by side with a space along the curved portion, and the second circuit unit may be located adjacent to the first circuit unit along the curved portion and may be located between the two first circuit units.

(3) In addition to (1), in the display substrate, the second wiring line may include a linear portion being linear along a first direction and an inclined linear portion being inclined with respect to the first direction, at least two first wiring lines, each first wiring line being identical to the first wiring line, may be arranged side by side with a space in the first direction, at least two first circuit units, each first circuit unit being identical to the first circuit unit, may be arranged side by side with a space along the inclined linear portion, and the second circuit unit may be located adjacent to the first circuit unit along the inclined linear portion and may be located between the two first circuit units.

(4) In addition to any one of (1) to (3), in the display substrate, the first circuit unit may be elongated in a direction intersecting the second wiring line, the display substrate may include, in the non-display region, a third wiring line extending parallel to the second wiring line and located on one end side of the first circuit unit in a longitudinal direction and a fourth wiring line extending parallel to the second wiring line and located on the another end side of the first circuit unit in the longitudinal direction, and the second circuit unit may be located within a range sandwiched between the third wiring line and the fourth wiring line.

(5) In addition to any one of (1) to (3), in the display substrate, the first circuit unit may be elongated in a direction intersecting the second wiring line, and the second circuit unit may be elongated in parallel to a longitudinal direction of the first circuit unit and may be located within a range of the first circuit unit in the longitudinal direction.

(6) In addition to any one of (1) to (5), the display substrate may include a fifth wiring line extending along a first direction intersecting the first wiring line in the display region, a switching element connected to the first wiring line and the fifth wiring line in the display region, and a pixel electrode connected to the switching element in the display region, and a signal supply unit connected to the fifth wiring line and configured to supply an image signal to the fifth wiring line, in the non-display region, and multiple first wiring lines, each first wiring line being identical to the first wiring line, and multiple first circuit units, each first circuit unit being identical to the first circuit unit, may be located side by side in the first direction, and the multiple first circuit units may constitute a shift register circuit configured to sequentially supply a scanning signal to the multiple first wiring lines.

(7) In addition to (6), in the display substrate, the second wiring line may be a power source wiring line, and the second circuit unit may be connected to the fifth wiring line and may constitute a first protection circuit configured to protect the fifth wiring line and the switching element from electrostatic discharge.

(8) In addition to (6), the display substrate may include an inspection circuit located on a side opposite to a side of the signal supply unit with respect to the fifth wiring line and connected to the fifth wiring line, in the non-display region, and an inspection wiring line extending along the second wiring line and connected to the inspection circuit, in the non-display region, and the second wiring line may be a power source wiring line, and the second circuit unit may be connected to the inspection wiring line and may constitute a second protection circuit configured to protect the inspection wiring line and the inspection circuit from electrostatic discharge.

(9) In addition to (6), the display substrate may include a charge removal wiring line extending along the second wiring line and set to a common potential or a ground potential, in the non-display region, and the second wiring line may be a first drive wiring line connected to the signal supply unit and receive a first drive signal from the signal supply unit in response to execution of a power-off sequence, and the second circuit unit may include a second input section connected to the fifth wiring line and a second output section connected to the charge removal wiring line, and may constitute a charge removal circuit configured to move a charge of the pixel electrode to the charge removal wiring line via the fifth wiring line in response to supply of the first drive signal from the first drive wiring line.

(10) In addition to (6), the display substrate may include a position detection electrode in the display region in the display region, a position detection wiring line connected to the position detection electrode and the signal supply unit and configured to receive a position detection signal from the signal supply unit during a position detection period in which position detection is performed by the position detection electrode, in the display region, and a common wiring line extending along the second wiring line and having a common potential, in the non-display region, and the second wiring line may be a second drive wiring line connected to the signal supply unit and configured to receive a second drive signal from the signal supply unit during a display period in which an image is displayed, and the second circuit unit may include a third output section connected to the position detection wiring line and a third input section connected to the common wiring line, and may constitute a common potential supply circuit configured to supply a common potential to the position detection electrode via the position detection wiring line in response to supply of the second drive signal from the second drive wiring line.

(11) In addition to (10), the display substrate may include a low potential wiring line connected to the signal supply unit and configured to receive a low potential signal from the signal supply unit, in the non-display region, and the first circuit unit may include an N-channel transistor, the common potential supply circuit may include a P-channel transistor, the N-channel transistor may include a first gate electrode connected to the second wiring line, a first source electrode connected to the low potential wiring line, and a first drain electrode connected to the first wiring line, and the P-channel transistor may include a second gate electrode connected to the second wiring line, a second source electrode connected to the common wiring line, and a second drain electrode connected to the position detection wiring line.

(12) In addition to any one of (1) to (5), the display substrate may include a sixth wiring line intersecting the first wiring line in the display region, a switching element connected to the first wiring line and the sixth wiring line in the display region, a pixel electrode connected to the switching element in the display region, a first signal supply unit connected to the first wiring line and configured to supply an image signal to the first wiring line, in the non-display region, and a second signal supply unit connected to the sixth wiring line and configured to supply a scanning signal to the sixth wiring line, in the non-display region, and multiple first wiring lines, each first wiring line being identical to the first wiring line, may be arranged side by side, the second wiring line may be located intersecting the multiple first wiring lines, and the first circuit unit may be connected to the multiple first wiring lines, may be interposed between the first signal supply unit and the multiple first wiring lines, and may constitute a switch circuit configured to distribute the image signal supplied from the first signal supply unit to the multiple first wiring lines.

(13) In addition to (12), the display substrate may include a power source wiring line extending along the second wiring line in the non-display region, and the second wiring line may be a switch wiring line connected to the first circuit unit and configured to supply a switch signal for switching the first wiring line configured to supply the image signal, and the second circuit unit may be connected to both the switch wiring line and the power source wiring line and may constitute a third protection circuit configured to protect the switch circuit from electrostatic discharge.

(14) A display device according to the technique described herein includes the display substrate according to any one of (1) to (13), and a counter substrate facing the display substrate.

According to the technique described herein, it is possible to make a frame smaller.

BRIEF DESCRIPTION OF DRAWINGS

The disclosure will be described with reference to the accompanying drawings, wherein like numbers reference like elements.

FIG. 1 is a plan view of a liquid crystal panel, a driver, and a flexible substrate according to a first embodiment.

FIG. 8 is a plan view of a liquid crystal panel, a driver, and a flexible substrate according to a second embodiment.

DESCRIPTION OF EMBODIMENTS

First Embodiment

A first embodiment will be described with reference to FIG. 1 to FIG. 7. In the present embodiment, a liquid crystal panel (display device) 10 will be exemplified. Note that some drawings illustrate an X-axis, a Y-axis, and a Z-axis, and directions of these axes are drawn so as to be common in all the drawings.

Figure 1:
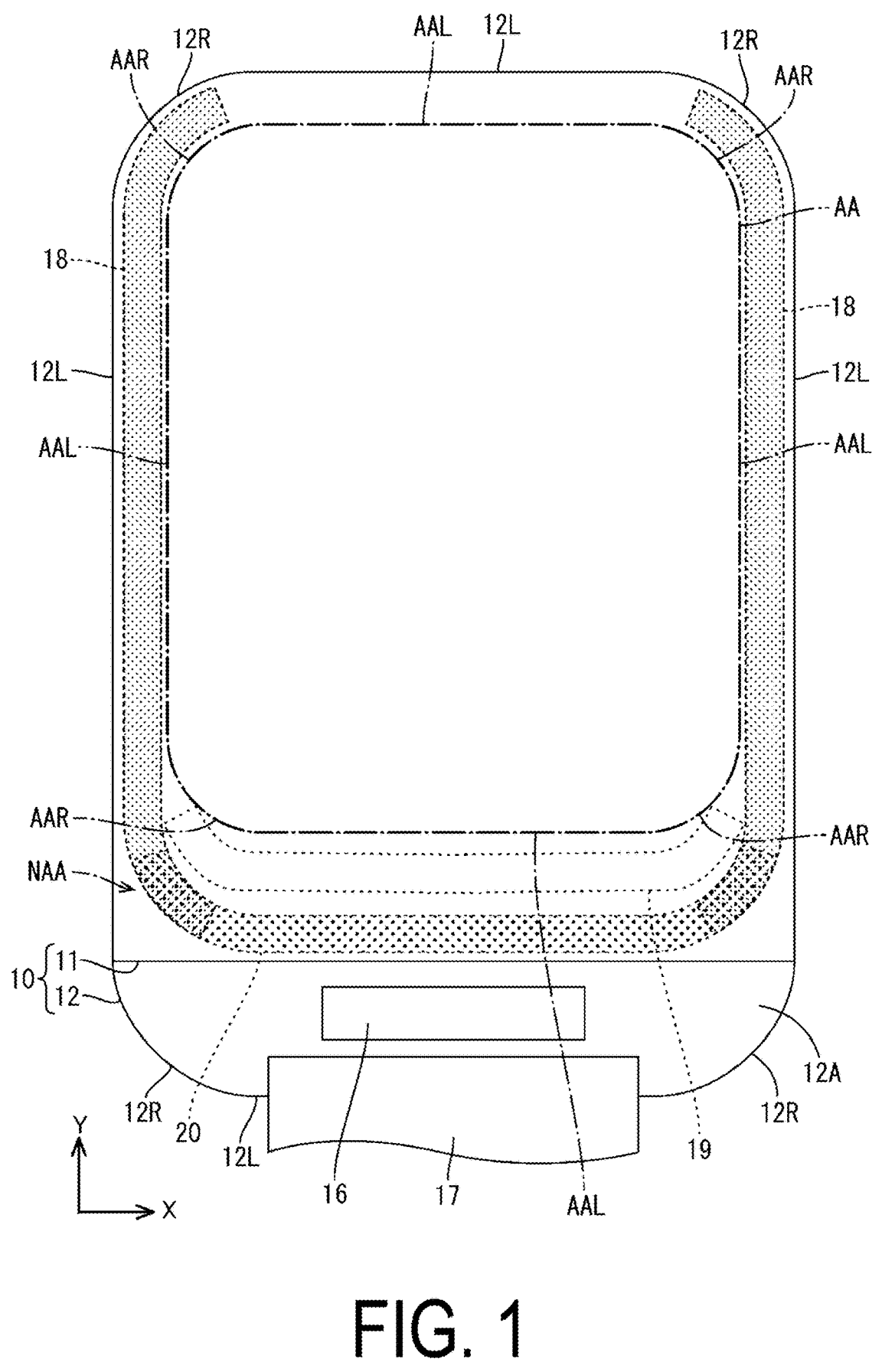

As illustrated in FIG. 1, a planar shape of the liquid crystal panel 10 according to the present embodiment is a substantially vertically long rectangle as a whole, with four rounded corners (arc-shaped). A short-side direction, a long-side direction, and a plate-thickness direction of the liquid crystal panel 10 match an X-axis direction, a Y-axis direction, and a Z-axis direction, respectively. The liquid crystal panel 10 can display an image by using illumination light emitted from a backlight device (illumination device). In the liquid crystal panel 10, a central side portion of a screen is a display region AA in which an image is displayed, while a frame-shaped peripheral side portion surrounding the display region AA in the screen is a non-display region NAA in which no image is displayed. A contour of the display region AA in a plan view is shaped to follow a contour of the liquid crystal panel 10 in a plan view, and the display region AA has four curved contours AAR, which are rounded corners. Contours of the display region AA, excluding the curved contours AAR, are linear contours AAL that are linear along the X-axis direction or the Y-axis direction. On the other hand, an inner contour of the non-display region NAA in a plan view is shaped to follow the contour of the display region AA in a plan view, and an outer contour of the non-display region NAA in a plan view is shaped to follow the contour of the liquid crystal panel 10 in a plan view. Note that a range surrounded by an alternating dotted-dashed line in FIG. 1 is the display region AA.

Figure 2:
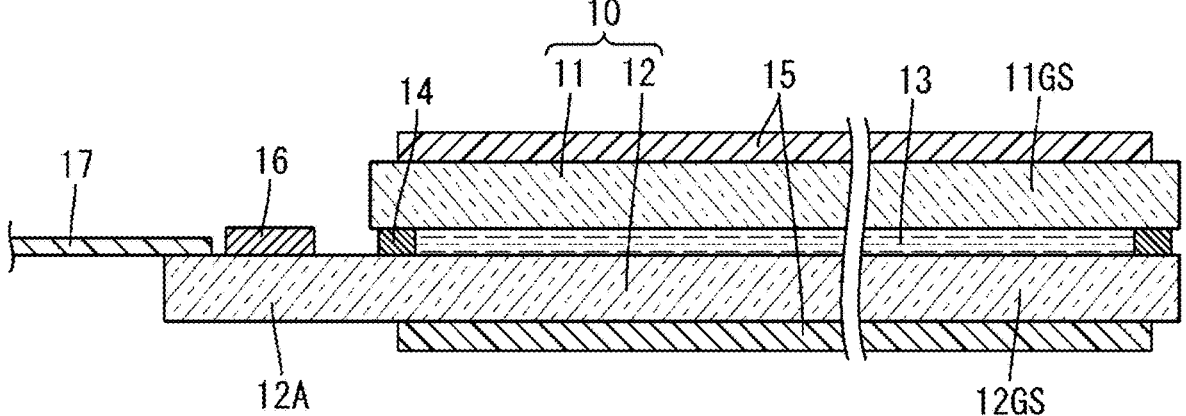
FIG. 2 is a cross-sectional view of the liquid crystal panel, the driver, and the flexible substrate according to the first embodiment.
Figure 2:
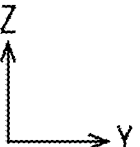

As illustrated in FIG. 2, the liquid crystal panel 10 is configured such that a liquid crystal layer 13 containing liquid crystal molecules being a substance having optical characteristics, which change in response to an applied electrical field, is sandwiched between a pair of glass substrates 11 and 12 that are almost transparent and have excellent light-transmitting properties. A sealing part 14 that seals the liquid crystal layer 13 is interposed between peripheral end portions of the pair of substrates 11 and 12. The sealing part 14 is formed in a rectangular frame shape (endless ring shape) to surround the liquid crystal layer 13. Polarizers 15 are bonded to outer faces of both the substrates 11 and 12, respectively. Of the pair of substrates 11 and 12, one placed on a front side is a counter substrate 11, and another one placed on a back side is an array substrate (display substrate, active matrix substrate) 12. The counter substrate 11 and the array substrate 12 are both formed by layering various films on inner face sides of glass substrates (substrate portions) 11GS and 12GS. Of these, the array substrate 12 has longer long sides than the counter substrate 11. The counter substrate 11 is bonded to the array substrate 12 with one end of the counter substrate 11 aligned with one end of the array substrate 12 in the long side direction. Thus, another end of the array substrate 12 in the long side direction is an exposed portion 12A that protrudes laterally relative to the counter substrate 11 and is exposed. A driver (signal supply unit) 16 and a flexible substrate 17 are mounted on the exposed portion 12A. In the present embodiment, as illustrated in FIG. 1, the array substrate 12 has four curved contours 12R, which are rounded corners. Contours of the array substrate 12, excluding the curved contours 12R, are linear contours 12L that are linear along the X-axis direction or the Y-axis direction. The counter substrate 11 has a pair of rounded corners at an end portion on a side opposite to a side of the flexible substrate 17 in the long side direction.

The driver 16 is an LSI chip with a drive circuit therein. The driver 16 is mounted on the exposed portion 12A of the array substrate 12 by a chip on glass (COG) method. The driver 16 processes various signals transmitted by the flexible substrate 17. The driver 16 supplies various signals (e.g., image signals, etc.) to various wiring lines (specifically, source wiring lines 22, etc., which will be described later) provided in the array substrate 12. The flexible substrate 17 has a configuration in which a large number of wiring line patterns are formed on a base material made of a synthetic resin material (such as polyimide resin) having insulating properties and flexibility. As illustrated in FIG. 1 and FIG. 2, the flexible substrate 17 is connected to the exposed portion 12A of the array substrate 12 on one end side, and is connected to an external circuit substrate (such as control substrate) on another end side. The flexible substrate 17 is connected to an end portion of the exposed portion 12A on a side opposite to a side of the display region AA in the Y-axis direction with respect to the driver 16.

As illustrated in FIG. 1, gate drive circuits 18, a switch circuit 19, and a first protection circuit 20 are provided in the non-display region NAA in the glass substrate 12GS of the array substrate 12. A pair of gate drive circuits 18 are provided to sandwich the display region AA from both sides thereof in the X-axis direction. The gate drive circuits 18 are provided in vertically long belt-shaped ranges extending along long side portions of the non-display region NAA (Y-axis direction). Planar shapes of the gate drive circuit 18 at both end side portions in a length direction (Y-axis direction) are curved along the curved contours AAR of the display region AA. The gate drive circuit 18 is for supplying scanning signals to gate wiring lines 21 described below, and is monolithically provided in the glass substrate 12GS of the array substrate 12. A specific circuit configuration of the gate drive circuit 18 and the like will be described later in detail.

As illustrated in FIG. 1, the switch circuit 19 and the first protection circuit 20 are located in the non-display region NAA at a position sandwiched between the display region AA and the driver 16 in the Y-axis direction. The switch circuit 19 and the first protection circuit 20 are both provided in a horizontally long belt-shaped range of the non-display region NAA extending along a short side portion (X-axis direction). Planar shapes of both the switch circuit 19 and the first protection circuit 20 at both end side portions in the length direction (X-axis direction) are curved along the curved contours AAR of the display region AA. The switch circuit 19 is located closer to the display region AA (farther from the driver 16) than the first protection circuit 20 in the Y-axis direction. The switch circuit 19 has a switching function of distributing image signals supplied from the driver 16 to the source wiring lines 22, which will be described later. The first protection circuit 20 is located farther from the display region AA (closer to the driver 16) than the switch circuit 19 in the Y-axis direction. The first protection circuit 20 is for protecting the source wiring lines 22 and the like described later from electrostatic discharge. Both end portions of the first protection circuit 20 in the length direction overlap end side portions of both the gate drive circuits 18 in the length direction, respectively, in a plan view. Specific circuit configurations of the switch circuit 19 and the first protection circuit 20 will be described later in detail.

Figure 3:
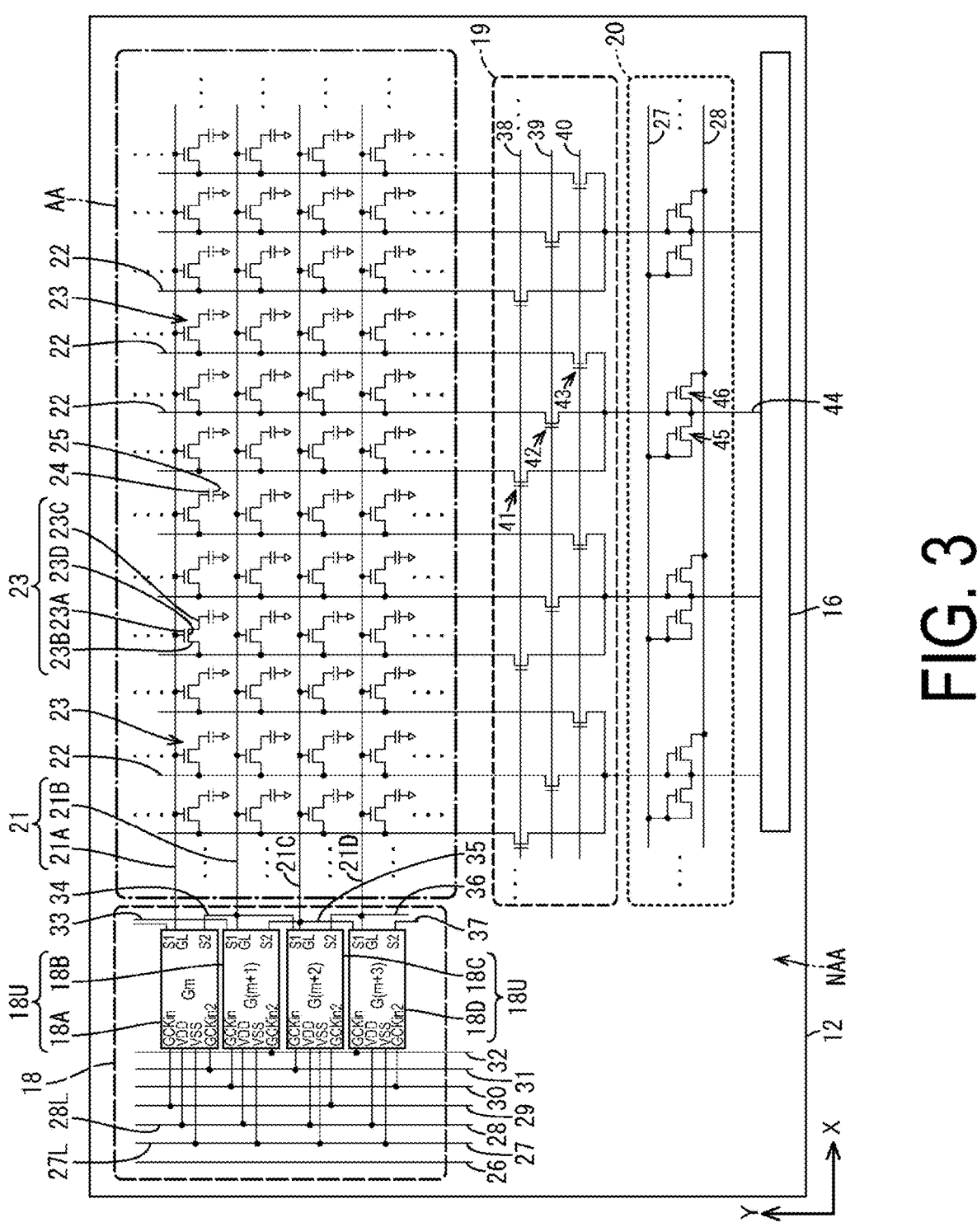
FIG. 3 is a circuit diagram illustrating an electrical configuration of the liquid crystal panel according to the first embodiment.

As illustrated in FIG. 3, on an inner face side of the array substrate 12 in the display region AA, gate wiring lines (first wiring lines, scanning wiring lines) 21 and source wiring lines (fifth wiring lines, signal wiring lines, data wiring lines) 22 that intersect with each other are provided. The multiple gate wiring lines 21 extend along the X-axis direction (second direction) horizontally across the display region AA, and are arranged side by side with spaces in the Y-axis direction. The multiple source wiring lines 22 extend along the Y-axis direction (first direction) vertically across the display region AA, and are arranged side by side with spaces in the X-axis direction. On the inner face side of the array substrate 12 in the display region AA, pixel TFTs (switching elements) 23 and pixel electrodes 24 are provided in regions surrounded by the gate wiring lines 21 and the source wiring lines 22. The multiple pixel TFTs 23 and the multiple pixel electrodes 24 are arranged in a matrix in plane, aligned regularly along the X-axis direction and the Y-axis direction. The pixel TFT 23 includes a gate electrode 23A connected to the gate wiring line 21, a source electrode 23B connected to the source wiring line 22, a drain electrode 23C connected to the pixel electrode 24, and a semiconductor portion 23D connected to the source electrode 23B and the drain electrode 23C. The pixel TFT 23 is driven based on a scanning signal supplied to the gate wiring line 21, and a potential based on an image signal (data signal) supplied to the source wiring line 22 is charged to the pixel electrode 24 in response to the driving of the pixel TFT 23.

In contrast, on an inner face side of the counter substrate 11 in the display region AA, three color filters that exhibit red (R), green (G), and blue (B) are arranged so as to overlap the pixel electrodes 24, respectively, a light blocking portion (black matrix) that partitions adjacent color filters, and the like are provided. In the liquid crystal panel 10, the R, G, and B color filters aligned along the X-axis direction and the three pixel electrodes 24 facing the respective color filters constitute three color pixels. A pixel is a display unit in the display region AA, and multiple pixels are arranged at predetermined pitches in both the X-axis direction and the Y-axis direction. As illustrated in FIG. 3, either the counter substrate 11 or the array substrate 12 is provided with a common electrode 25 made of a transparent electrode material similar to that of the pixel electrode 24 and located so as to overlap the pixel electrodes 24 with a space therebetween. In the liquid crystal panel 10, a predetermined electrical field is applied to the liquid crystal layer 13 based on a potential difference generated between the common electrode 25 and each of the pixel electrodes 24, thereby enabling each pixel to display a predetermined gray scale.

Next, the gate drive circuit 18, the switch circuit 19, and the first protection circuit 20 will be described in detail in this order. The gate drive circuit 18 is a so-called shift register circuit. To be specific, as illustrated in FIG. 3, the gate drive circuit 18 includes multiple unit gate circuit units (first circuit units) 18U arranged along the length direction thereof (substantially the Y-axis direction). The unit gate circuit unit 18U includes a gate output terminal (first output section) GL that is connected to the corresponding gate wiring line 21. The multiple unit gate circuit units 18U include, in order from the top, a first unit gate circuit unit 18A (denoted by "Gm" in FIG. 3), a second unit gate circuit unit 18B (denoted by "G (m+1)" in FIG. 3), a third unit gate circuit unit 18C (denoted by "G (m+2)" in FIG. 3), and a fourth unit gate circuit unit 18D (denoted by "G (m+3)" in FIG. 3). The gate drive circuit 18 is configured by repeatedly arranging a set of these four unit gate circuit units 18A to 18D. Note that the gate output terminal GL provided in the first unit gate circuit unit 18A is referred to as "first gate output terminal GL1", the gate output terminal GL provided in the second unit gate circuit unit 18B is referred to as "second gate output terminal GL2", the gate output terminal GL provided in the third unit gate circuit unit 18C is referred to as "third gate output terminal GL3", and the gate output terminal GL provided in the fourth unit gate circuit unit 18D is referred to as "fourth gate output terminal GL4". In a central side portion of the gate drive circuit 18 in the length direction, the multiple unit gate circuit units 18U are arranged linearly along the linear contour AAL (Y-axis direction). In both end side portions of the gate drive circuit 18 in the length direction, multiple unit gate circuit units 18U are arranged in curved lines along the curved contours AAR. Note that among the multiple gate wiring lines 21, the gate wiring line 21 connected to the first unit gate circuit unit 18A is referred to as "first gate wiring line 21A", the gate wiring line 21 connected to the second unit gate circuit unit 18B is referred to as "second gate wiring line 21B", the gate wiring line 21 connected to the third unit gate circuit unit 18C is referred to as "third gate wiring line 21C", and the gate wiring line 21 connected to the fourth unit gate circuit unit 18D is referred to as "fourth gate wiring line 21D". The number of each of the gate wiring lines 21A to 21D is the same as the number of sets of the unit gate circuit units 18U.

As illustrated in FIG. 3, the non-display region NAA of the array substrate 12 is provided with multiple wiring lines that extend along the length direction of the gate drive circuit 18 and are connected to the gate drive circuit 18. The multiple wiring lines include a gate start pulse wiring line 26 that transmits a gate start pulse signal GSP, a low potential power source wiring line (second wiring line, low potential wiring line) 27 that is constantly set to a low potential power supply voltage, a high potential power source wiring line (second wiring line) 28 that is constantly set to a high potential power supply voltage, a first clock wiring line 29 that transmits a clock signal GCK1, a second clock wiring line 30 that transmits a clock signal GCK2, a third clock wiring line 31 that transmits a clock signal GCK3, a fourth clock wiring line 32 that transmits a clock signal GCK4, a first set wiring line 33 that transmits a set signal, a second set wiring line 34 that transmits a set signal, a third set wiring line 35 that transmits a set signal, a fourth set wiring line 36 that transmits a set signal, and a fifth set wiring line 37 that transmits a set signal. These wiring lines 26 to 37 are all connected to the driver 16 and can receive various signals from the driver 16.

As illustrated in FIG. 3, the gate start pulse wiring line 26 is connected to a first set terminal S1 of the first unit gate circuit unit 18A in the uppermost set among the multiple unit gate circuit units 18U. The low potential power source wiring line 27 is connected to the power supply voltage terminals (first input sections) VSS of all the unit gate circuit units 18U. The high potential power source wiring line 28 is connected to the power supply voltage terminals (first input sections) VDD of all the unit gate circuit units 18U. The first clock wiring line 29 is connected to a first input terminal GCKin of the first unit gate circuit unit 18A and a second input terminal GCKin2 of the third unit gate circuit unit 18C. The second clock wiring line 30 is connected to a first input terminal GCKin of the second unit gate circuit unit 18B and a second input terminal GCKin2 of the fourth unit gate circuit unit 18D. The third clock wiring line 31 is connected to a second input terminal GCKin2 of the first unit gate circuit unit 18A and a first input terminal GCKin of the third unit gate circuit unit 18C. The fourth clock wiring line 32 is connected to a second input terminal GCKin2 of the second unit gate circuit unit 18B and a first input terminal GCKin of the fourth unit gate circuit unit 18D. The first set wiring line 33 is connected to the first gate wiring line 21A located in the uppermost row among the multiple gate wiring lines 21, and to a first set terminal S1 of the second unit gate circuit unit 18B in the uppermost set among the multiple unit gate circuit units 18U. The second set wiring line 34 is connected to a second set terminal S2 of the first unit gate circuit unit 18A, a first set terminal S1 of the third unit gate circuit unit 18C, and the second gate wiring line 21B. The third set wiring line 35 is connected to a second set terminal S2 of the second unit gate circuit unit 18B, a first set terminal S1 of the fourth unit gate circuit unit 18D, and the third gate wiring line 21C. The fourth set wiring line 36 is connected to a second set terminal S2 of the third unit gate circuit unit 18C, a first set terminal S1 of the first unit gate circuit unit 18A of the next set (among the multiple first unit gate circuit units 18A, excluding the first unit gate circuit unit 18A in the uppermost set), and the fourth gate wiring line 21D. The fifth set wiring line 37 is connected to a second set terminal S2 of the fourth unit gate circuit unit 18D, a first set terminal S1 of the second unit gate circuit unit 18B of the next set, and the first gate wiring line 21A of the next set. The set wiring lines 34 to 37 excluding the first set wiring line 33 are provided in the same number as the number of sets of the unit gate circuit units 18U.

Figure 4:
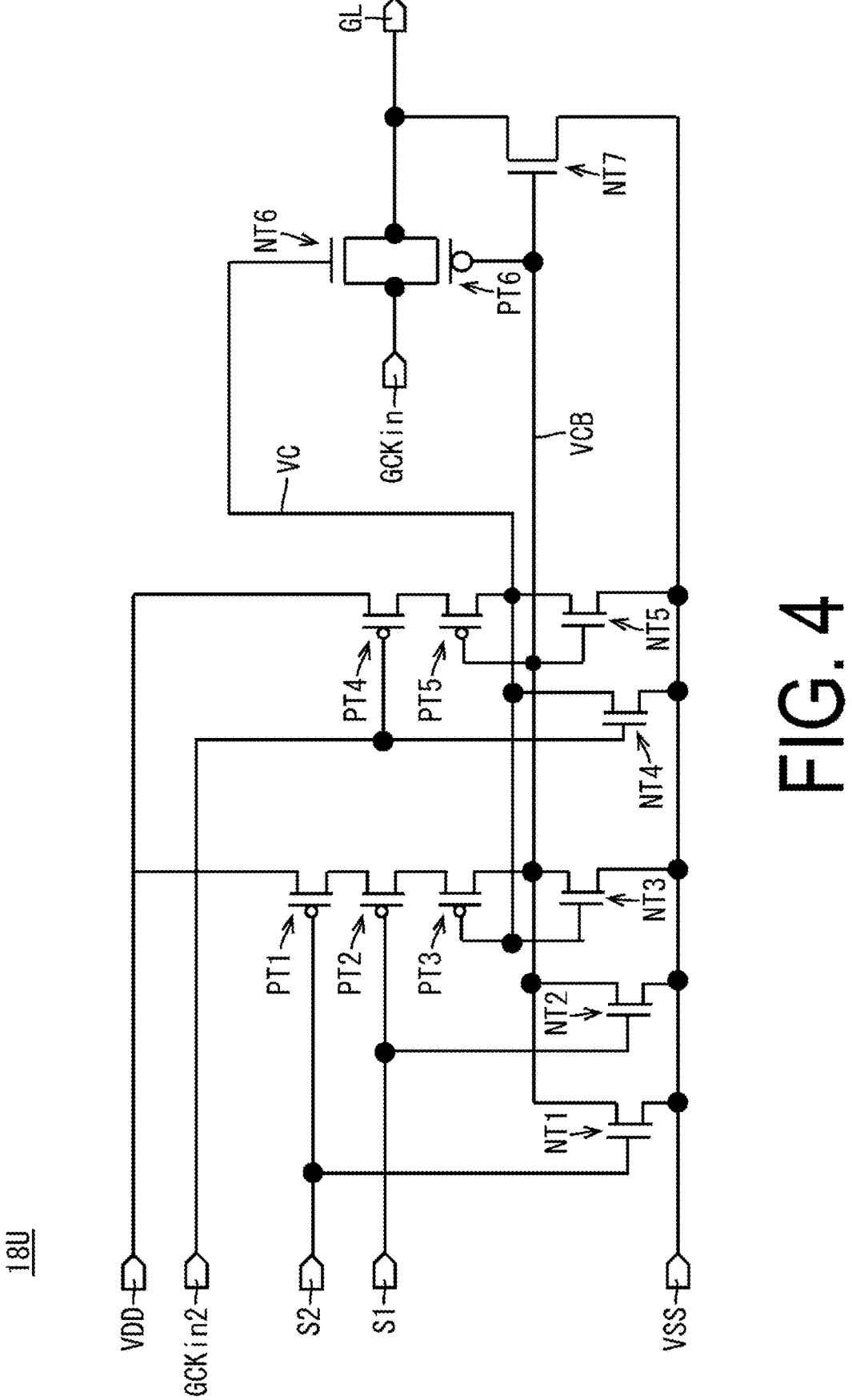
FIG. 4 is a circuit diagram illustrating a circuit configuration of a unit gate circuit unit, which is a component of a gate drive circuit provided in the liquid crystal panel according to the first embodiment.

As illustrated in FIG. 4, the unit gate circuit unit 18U includes multiple N-channel transistors NT1 to NT7 and multiple P-channel transistors PT1 to PT6. Threshold voltages (Vgs) of the N-channel transistors NT1 to NT7 are all set to a high potential (H). On the other hand, threshold voltages of the P-channel transistors PT1 to PT6 are all set to a low potential (L). The unit gate circuit unit 18U includes a first internal node VC and a second internal node VCB as connection wiring lines that connect predetermined transistors together.

As illustrated in FIG. 4, the first P-channel transistor PT1 includes a gate electrode connected to the second set wiring line 34, a source electrode connected to the power supply voltage terminal VDD, and a drain electrode connected to a source electrode of the second P-channel transistor PT2. The second P-channel transistor PT2 includes a gate electrode connected to the first set wiring line 33, the source electrode connected to the drain electrode of the first P-channel transistor PT1, and a drain electrode connected to a source electrode of the third P-channel transistor PT3. The third P-channel transistor PT3 includes a gate electrode connected to the first internal node VC, the source electrode connected to the drain electrode of the second P-channel transistor PT2, and a drain electrode connected to the second internal node VCB. The fourth P-channel transistor PT4 includes a gate electrode connected to the second input terminal GCKin2, a source electrode connected to the power supply voltage terminal VDD, and a drain electrode connected to a source electrode of the fifth P-channel transistor PT5. The fifth P-channel transistor PT5 includes a gate electrode connected to the second internal node VCB, the source electrode connected to the drain electrode of the fourth P-channel transistor PT4, and a drain electrode connected to the first internal node VC. The sixth P-channel transistor PT6 includes a gate electrode connected to the second internal node VCB, a source electrode connected to the first input terminal GCKin, and a drain electrode connected to the gate output terminal GL.

The first N-channel transistor NT1 includes a gate electrode connected to the second set terminal S2, a source electrode connected to the second internal node VCB, and a drain electrode connected to the power supply voltage terminal VSS. The second N-channel transistor NT2 includes a gate electrode connected to the first set terminal S1, a source electrode connected to the second internal node VCB, and a drain electrode connected to the power supply voltage terminal VSS. The third N-channel transistor NT3 includes a gate electrode connected to the first internal node VC, a source electrode connected to the second internal node VCB, and a drain electrode connected to the power supply voltage terminal VSS. The fourth N-channel transistor NT4 includes a gate electrode connected to the second input terminal GCKin2, a source electrode connected to the first internal node VC, and a drain electrode connected to the power supply voltage terminal VSS. The fifth N-channel transistor NT5 includes a gate electrode connected to the second internal node VCB, a source electrode connected to the first internal node VC, and a drain electrode connected to the power supply voltage terminal VSS. The sixth N-channel transistor NT6 includes a gate electrode connected to the first internal node VC, a source electrode connected to the first input terminal GCKin, and a drain electrode connected to the gate output terminal GL. The seventh N-channel transistor NT7 includes a gate electrode connected to the second internal node VCB, a source electrode connected to the gate wiring line 21, and a drain electrode connected to the power supply voltage terminal VSS.

Figure 5:
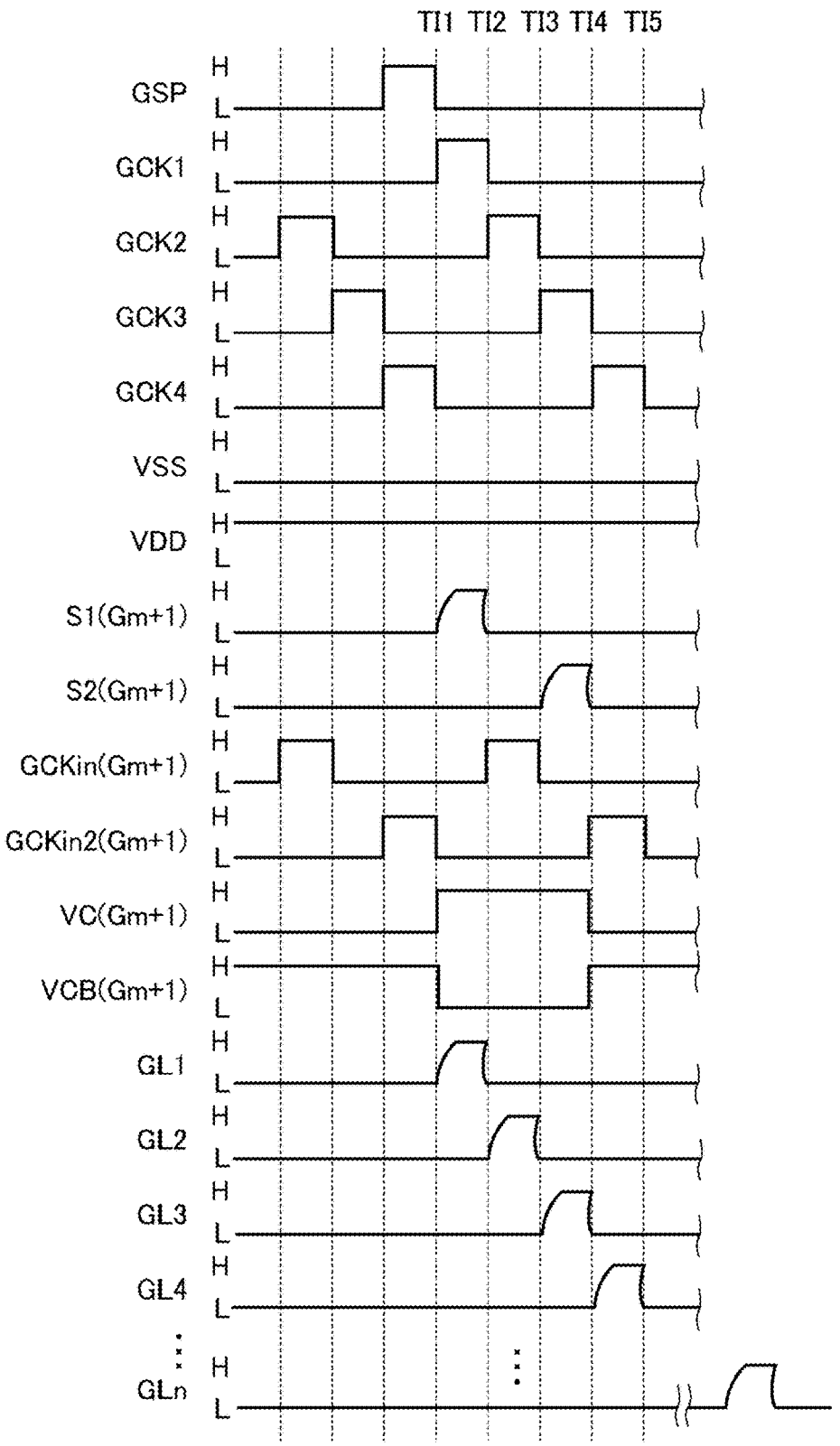
FIG. 5 is a timing chart for operation of the gate drive circuit according to the first embodiment.

Next, operation of the gate drive circuit 18 will be described with reference to FIG. 5. FIG. 5 is a timing chart for the operation relating to the gate drive circuit 18. Before describing the operation of the gate drive circuit 18, potentials of signals and terminals illustrated in FIG. 5 will be described. FIG. 5 illustrates, from top to bottom, potentials of the gate start pulse signal GSP, the clock signals GCK1, GCK2, GCK3, and GCK4, the power supply voltage terminal VSS, the power supply voltage terminal VDD, the first set terminal S1, the second set terminal S2, the first input terminal GCKin, the second input terminal GCKin2, the first internal node VC, the second internal node VCB, and the gate output terminals GL1, GL2, GL3, GL4, . . . . GLn. In the present embodiment, as illustrated in FIG. 5, the power supply voltage terminal VSS is always held at a low potential (denoted as "L" in FIG. 5), which is a constant low level potential. The power supply voltage terminal VDD is always held at a high potential (denoted as "H" in FIG. 5), which is a constant high level potential. The clock signals GCK1, GCK2, GCK3, and GCK4 are all rectangular waves, and low potentials and high potentials alternately repeated at constant periods. The gate start pulse signal GSP is a rectangular wave, and is set to a high potential immediately before the first clock signal GCK1 becomes a high potential during the first one-frame display period among multiple one-frame display periods, and is otherwise always set to a low potential.

The potentials of the gate output terminals GL1, GL2, GL3, GL4 . . . . GLn are all substantially rectangular waves. The first gate output terminal GL1 is provided in the first unit gate circuit unit 18A in the uppermost set, the second gate output terminal GL2 is provided in the second unit gate circuit unit 18B in the uppermost set, the third gate output terminal GL3 is provided in the third unit gate circuit unit 18C in the uppermost set, the fourth gate output terminal GL4 is provided in the fourth unit gate circuit unit 18D in the uppermost set, and the nth gate output terminal GLn is provided in the nth unit gate circuit unit 18U counting from the top. The potential of the first gate output terminal GL1 is synchronized with the clock signal GCK1, the potential of the second gate output terminal GL2 is synchronized with the clock signal GCK2, the potential of the third gate output terminal GL3 is synchronized with the clock signal GCK3, and the potential of the fourth gate output terminal GL4 is synchronized with the clock signal GCK4. The potentials of the first set terminal S1, the second set terminal S2, the first input terminal GCKin, the second input terminal GCKin2, the first internal node VC, and the second internal node VCB illustrated in FIG. 5 are the potentials of the terminals S1, S2, GCKin, and GCKin2, and the internal nodes VC and VCB provided in the second unit gate circuit unit 18B ("Gm+1" is written in parentheses in FIG. 5).

The potential of the first set terminal S1 is a rectangular wave, and matches the potential of the gate output terminal GL of the unit gate circuit unit 18U one row before the unit gate circuit unit 18U to which the first set terminal S1 belongs (see FIG. 3). The potential of the second set terminal S2 is a rectangular wave, and matches the potential of the gate output terminal GL of the unit gate circuit unit 18U one row after the unit gate circuit unit 18U to which the second set terminal S2 belongs (see FIG. 3). The potential of the first input terminal GCKin is a rectangular wave, and matches the clock signals GCK1 to GCK4 supplied by the clock wiring lines 29 to 32 connected to the first input terminals GCKin. The potential of the second input terminal GCKin2 is a rectangular wave, and matches the clock signals GCK1 to GCK4 supplied by the clock wiring lines 29 to 32 connected to the second input terminals GCKin2. The potential of the first internal node VC is a rectangular wave, and changes from a low potential to a high potential when a high potential is supplied to the first set terminal S1, and then changes from the high potential to a low potential when a high potential is supplied to the second input terminal GCKin2. The potential of the second internal node VCB is a rectangular wave, and changes from a high potential to a low potential when the high potential is supplied to the first set terminal S1, and then changes from the low potential to a high potential when the high potential is supplied from the second input terminal GCKin2.

The operation of the gate drive circuit 18 will be specifically described, taking in particular the second unit gate circuit unit 18B. First, immediately before TIL illustrated in FIG. 5, in the second unit gate circuit unit 18B, the first internal node VC, the first set terminal S1, and the second set terminal S2 are at a low potential, and the second internal node VCB and the second input terminal GCKin2 are at a high potential. During this period, the N-channel transistors NT1, NT2, NT3, and NT6 and the P-channel transistors PT4, PT5, and PT6 are off, and the N-channel transistors NT4, NT5, and NT7 and the P-channel transistors, PT1, PT2, and PT3 are on.

At a time point TIL illustrated in FIG. 5, the clock signal GCK1 is input to the first input terminal GCKin of the first unit gate circuit unit 18A. Then, a scanning signal is output from the first gate output terminal GL1 of the first unit gate circuit unit 18A to the first gate wiring line 21A, so that the first set terminal S1 of the second unit gate circuit unit 18B becomes a high potential. As a result, in the second unit gate circuit unit 18B, the second P-channel transistor PT2 is turned off, and the second N-channel transistor NT2 is turned on. Accordingly, the second internal node VCB of the second unit gate circuit unit 18B is held at a low potential. The first internal node VC of the second unit gate circuit unit 18B is held at a high potential.

At a time point TI2 illustrated in FIG. 5, the clock signal GCK2 is input to the first input terminal GCKin of the second unit gate circuit unit 18B. At this time, in the second unit gate circuit unit 18B, the first internal node VC is at the high potential, so the sixth N-channel transistor NT6 is turned on, and the second internal node VCB is at the low potential, so the sixth P-channel transistor PT6 is turned on. Therefore, the clock signal GCK2 input to the input terminal GCKin is output as a scanning signal from the second gate output terminal GL2 to the second gate wiring line 21B via the sixth N-channel transistor NT6 and the sixth P-channel transistor PT6.

At a time point TI3 illustrated in FIG. 5, the clock signal GCK3 is input to the first input terminal GCKin of the third unit gate circuit unit 18C. Then, a scanning signal is output from the third gate output terminal GL3 of the third unit gate circuit unit 18C to the third gate wiring line 21C, so that the second set terminal S2 of the second unit gate circuit unit 18B becomes a high potential. As a result, in the second unit gate circuit unit 18B, the first P-channel transistor PT1 is turned off, and the second N-channel transistor NT2 is turned on. Accordingly, the second internal node VCB of the second unit gate circuit unit 18B is held at a low potential. The first internal node VC of the second unit gate circuit unit 18B is held at a high potential.

At a time point TI4 illustrated in FIG. 5, the clock signal GCK4 is input to the first input terminal GCKin of the fourth unit gate circuit unit 18D. Then, a scanning signal is output from the fourth gate output terminal GL4 of the fourth unit gate circuit unit 18D to the fourth gate wiring line 21D. The clock signal GCK4 is also input to the second input terminal GCKin2 of the second unit gate circuit unit 18B. Then, in the second unit gate circuit unit 18B, the fourth P-channel transistor PT4 is turned off, and the fourth N-channel transistor NT4 is turned on. Accordingly, the first internal node VC of the second unit gate circuit unit 18B becomes a low potential, and the second internal node VCB of the second unit gate circuit unit 18B becomes a high potential. As a result, in the second unit gate circuit unit 18B, the seventh N-channel transistor NT7 is turned on, so that the second gate wiring line 21B is short-circuited with the power supply voltage terminal VSS and becomes a low potential. As described above, the clock signals GCK1, GCK2, GCK3, and GCK4 are repeatedly supplied in sequence, so that scanning signals are supplied to the multiple gate wiring lines 21 in sequence from the upper row side.

Next, a configuration of the switch circuit 19 will be described. The switch circuit 19 is a so-called source shared driving (SSD) circuit. As illustrated in FIG. 3, the switch circuit 19 includes multiple unit switch circuit units 19U arranged along a length direction thereof (substantially the X-axis direction). The number of the unit switch circuit units 19U is one third of the number of the source wiring lines 22. The unit switch circuit unit 19U includes three switch wiring lines 38 to 40 to which switch signals for switching are transmitted, and three switch TFTs 41 to 43 that are connected to the switch wiring lines 38 to 40 and the source wiring lines 22 and control supply of image signals, respectively. The three switch wiring lines 38 to 40 are arranged with spaces in the Y-axis direction and all extend along the X-axis direction. End portions of the three switch wiring lines 38 to 40 extend toward the driver 16 side and are connected to the driver 16. The three switch wiring lines 38 to 40 are, in order from the top in FIG. 3, a red switch wiring line 38, a green switch wiring line 39, and a blue switch wiring line 40. The three switch TFTs 41 to 43 are all N-channel transistors. The three switch TFTs 41 to 43 are, from the left in FIG. 3, a red switch TFT 41, a green switch TFT 42, and a blue switch TFT 43. The red switch TFT 41 includes a gate electrode connected to the red switch wiring line 38, and a drain electrode connected to the source wiring line 22 that supplies an image signal to the pixel electrode 24 that is a component of a red pixel. The green switch TFT 42 includes a gate electrode connected to the green switch wiring line 39, and a drain electrode connected to the source wiring line 22 that supplies an image signal to the pixel electrode 24 that is a component of a green pixel. The blue switch TFT 43 includes a gate electrode connected to the blue switch wiring line 40, and a drain electrode connected to the source wiring line 22 that supplies an image signal to the pixel electrode 24 that is a component of a blue pixel. Source electrodes of the switch TFTs 41 to 43 are all connected to a source trunk wiring line 44 provided in the non-display region NAA of the array substrate 12. One end of the source trunk wiring line 44 is connected to the driver 16, and another end is branched into three and connected to the source electrodes of the switch TFTs 41 to 43. The number of the source trunk wiring lines 44 is one third of the number of the source wiring lines 22. In this way, the number of wiring lines existing between the driver 16 and the switch circuit 19 (source trunk wiring lines 44) can be reduced to one third, compared to a case where all source wiring lines are directly connected to the driver 16. This allows the source trunk wiring lines 44 to be easily routed even when the frame of the liquid crystal panel 10 becomes narrower.

A red image signal for a red pixel, a green image signal for a green pixel, and a blue image signal for a blue pixel are supplied from the driver 16 to the source trunk wiring line 44 in a time-division manner. In synchronization with this, switch signals are supplied from the driver 16 to the three switch wiring lines 38 to 40. To be specific, at a timing when the red image signal is supplied from the driver 16 to the source trunk wiring line 44, a switch signal is supplied from the driver 16 to the red switch wiring line 38. Thus, the red switch TFT 41 among the three switch TFTs 41 to 43 is selectively turned on, so that the red image signal can be supplied to the pixel electrode 24, which is a component of the red pixel, via the selected source wiring line 22. At a timing when the green image signal is supplied from the driver 16 to the source trunk wiring line 44, a switch signal is supplied from the driver 16 to the green switch wiring line 39. Thus, the green switch TFT 42 among the three switch TFTs 41 to 43 is selectively turned on, so that the green image signal can be supplied to the pixel electrode 24, which is a component of the green pixel, via the selected source wiring line 22. At a timing when the blue image signal is supplied from the driver 16 to the source trunk wiring line 44, a switch signal is supplied from the driver 16 to the blue switch wiring line 40. Thus, the blue switch TFT 43 among the three switch TFTs 41 to 43 is selectively turned on, so that the blue image signal can be supplied to the pixel electrode 24, which is a component of the blue pixel, via the selected source wiring line 22. As described above, the switch circuit 19 can switch the source wiring lines 22 connected to the source trunk wiring line 44 in synchronization with the timings when the image signals are supplied from the driver 16 to the source trunk wiring line 44.

Next, a configuration of the first protection circuit 20 will be described. As illustrated in FIG. 3, the first protection circuit 20 includes multiple first unit protection circuit units (second circuit units) 20U arranged along a length direction thereof (substantially the X-axis direction). The number of the first unit protection circuit units 20U is equal to the number of the source trunk wiring lines 44. The first unit protection circuit unit 20U includes the low potential power source wiring line 27 and the high potential power source wiring line 28 described above, a first protection TFT 45 connected to the low potential power source wiring line 27 and the source trunk wiring line 44, and a second protection TFT 46 connected to the high potential power source wiring line 28 and the source trunk wiring line 44. These protection TFTs 45 and 46 are both N-channel transistors. The first protection TFT 45 includes a gate electrode and a drain electrode connected to the low potential power source wiring line 27, and a source electrode connected to the source trunk wiring line 44. The second protection TFT 46 includes a gate electrode and a source electrode connected to the source trunk wiring line 44, and a drain electrode connected to the high potential power source wiring line 28. A threshold voltage of the second protection TFT 46 is lower than the maximum potential of the image signal supplied to the source trunk wiring line 44. Therefore, even when an image signal is supplied from the driver 16 to the source trunk wiring line 44, the first protection TFT 45 and the second protection TFT 46 are not turned on. The potential of an image signal supplied to the source trunk wiring line 44 is equal to or higher than the low potential of the low potential power source wiring line 27 and equal to or lower than the high potential of the high potential power source wiring line 28. Here, when electrostatic discharge occurs and a surge outside the range from the low potential of the low potential power source wiring line 27 to the high potential of the high potential power source wiring line 28 is input to the source trunk wiring line 44, either the first protection TFT 45 or the second protection TFT 46 is turned on. This allows the surge to escape to the low potential power source wiring line 27 or the high potential power source wiring line 28. As a result, the circuit component (the driver 16) and the circuit elements (the source wiring lines 22, the switch TFTs 41 to 43 of the switch circuit 19, and the pixel TFTs 23) connected to the source trunk wiring line 44 can be protected from surges.

Figure 6:
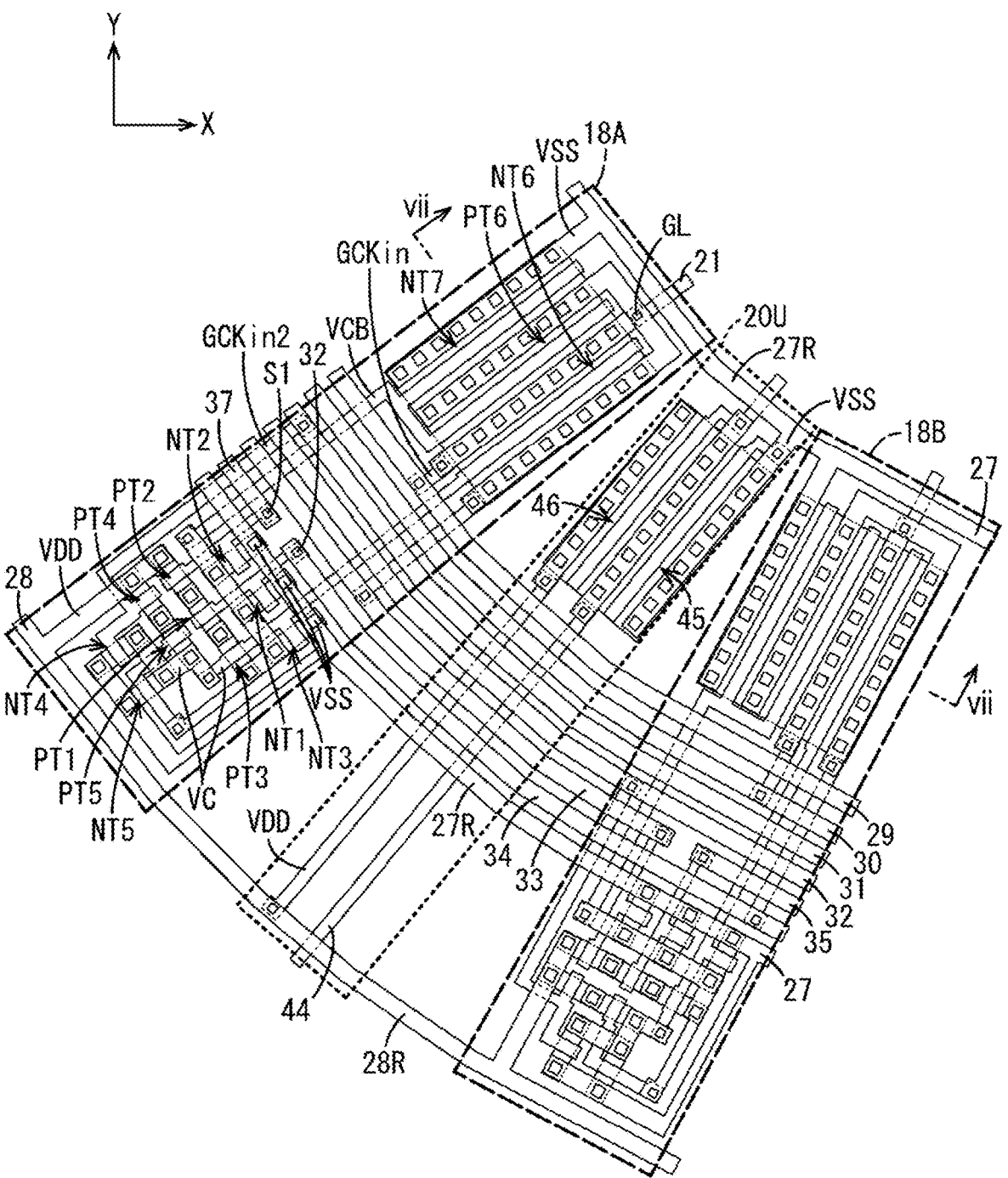
FIG. 6 is an enlarged plan view of the unit gate circuit units of the gate drive circuit and a first unit protection circuit unit of a first protection circuit according to the first embodiment.

As described above, as illustrated in FIG. 1, both end side portions of the first protection circuit 20 in the length direction overlap end side portions of both the gate drive circuits 18 in the length direction in a plan view. A configuration of an overlapping portion of the gate drive circuit 18 and the first protection circuit 20 will be described with reference to FIG. 6. FIG. 6 illustrates the first unit gate circuit unit 18A and the second unit gate circuit unit 18B as the unit gate circuit units 18U, which are components of the gate drive circuit 18, and one first unit protection circuit unit 20U, which is a component of the first protection circuit 20.

First, as illustrated in FIG. 6, the wiring lines 27 to 37 connected to the gate drive circuit 18 and the first protection circuit 20 are all curved along the curved contour AAR in the overlapping portion of the first protection circuit 20 and the gate drive circuit 18. In particular, the low potential power source wiring line 27 and the high potential power source wiring line 28 include curved portions 27R and 28R that are curved so as to intersect both the Y-axis direction and the X-axis direction. The unit gate circuit unit 18U and the first unit protection circuit unit 20U are both elongated in a direction intersecting the curved portions 27R and 28R in a plan view. The unit gate circuit unit 18U and the first unit protection circuit unit 20U are located side by side along the curved portions 27R and 28R described above. To be specific, the unit gate circuit units 18U and the first unit protection circuit units 20U are located alternately and repeatedly one by one along the curved portions 27R and 28R in the overlapping portion of the first protection circuit 20 and the gate drive circuit 18. Two unit gate circuit units 18U are arranged side by side with a space in the direction along the curved portions 27R and 28R, and one first unit protection circuit unit 200 is interposed between the two unit gate circuit units 18U. Conversely, two first unit protection circuit units 20U are arranged side by side with a space in the direction along the curved portions 27R and 28R, and one unit gate circuit unit 18U is interposed between the two first unit protection circuit units 20U. Note that the unit gate circuit unit 18U is connected to the gate wiring line 21, the low potential power source wiring line 27, the high potential power source wiring line 28, and the like, and is a component of the gate drive circuit 18, while the first unit protection circuit unit 200 is connected to the low potential power source wiring line 27, the high potential power source wiring line 28, and the like, but not connected to the gate wiring line 21, and is a component of the first protection circuit 20. Therefore, the unit gate circuit unit 18U and the first unit protection circuit unit 20U are functionally different circuit units.

Thus, in the non-display region NAA, the first unit protection circuit unit 20U is located adjacent to the unit gate circuit unit 18U, which is a different circuit unit, along the low potential power source wiring line 27 and the high potential power source wiring line 28, as illustrated in FIG. 6. Therefore, compared to a case where the first unit protection circuit unit is located adjacent to the unit gate circuit unit 18U along a direction intersecting the low potential power source wiring line 27 and the high potential power source wiring line 28, an arrangement space in the direction intersecting the low potential power source wiring line 27 and the high potential power source wiring line 28 can be reduced. This improves layout efficiency of the unit gate circuit units 18U and the first unit protection circuit units 20U in the non-display region NAA, thereby enabling the frame of the array substrate 12 to be narrowed. In particular, in the present embodiment, the first unit protection circuit unit 20U is adjacent to the unit gate circuit unit 18U along the curved portions 27R and 28R, and is located between the two unit gate circuit units 18U. A distance between the two unit gate circuit units 18U in the direction along the curved portions 27R and 28R is wider than a distance between the two unit gate circuit units 18U in the Y-axis direction (first direction). Therefore, a sufficient space can be secured for the first unit protection circuit unit 20U located between the two unit gate circuit units 18U. As described above, the first unit protection circuit units 20U can be located adjacent to the unit gate circuit units 18U that constitute the gate drive circuit (shift register circuit) 18. This allows the first unit protection circuit units 20U to be provided together with the unit gate circuit units 18U without increasing an arrangement space for the gate drive circuit (shift register circuit) 18. The low potential and the high potential to the gate circuit 18 and the first protection circuit 20 are supplied from two common wiring lines, respectively. When the first unit protection circuit unit 200 is located adjacent to the unit gate circuit unit 18U along the direction intersecting the low potential power source wiring line 27 and the high potential power source wiring line 28, the low potential power source wiring line 27 and the high potential power source wiring line 28 need to be located separately in both the gate circuit 18 and the first protection circuit 20. However, in the present embodiment, these wiring lines are used in common, which is advantageous for further narrowing the frame.

Note that as illustrated in FIG. 3, the wiring lines 27 to 37 connected to the gate drive circuit 18 are linear along the linear contour AAL in a portion of the gate drive circuit 18 that does not overlap the first protection circuit 20. In particular, the low potential power source wiring line 27 and the high potential power source wiring line 28 have linear portions 27L and 28L that are linear along the Y-axis direction (first direction). Both the wiring lines 27 and 28 connected to the first protection circuit 20 are linear along the linear contour AAL in a portion of the first protection circuit 20 that does not overlap the gate drive circuit 18, and extend substantially linear along the X-axis direction. The wiring lines 38 to 40 connected to the switch circuit 19 are linear along the linear contour AAL, and extend substantially linear along the X-axis direction.

A specific configuration of the overlapping portion of the gate drive circuit 18 and the first protection circuit 20 will be described. In the overlapping portion of the gate drive circuit 18 and the first protection circuit 20, as illustrated in FIG. 6, one low potential power source wiring line 27 is located at a position closest to the display region AA (the innermost position), and one high potential power source wiring line 28 is located at a position farthest from the display region AA (the outermost position). Between the low potential power source wiring line 27 at the innermost position and the high potential power source wiring line 28 at the outermost position, located are the transistors NT1 to NT7 and PT1 to PT6, which are components of the unit gate circuit unit 18U, the protection TFTs 45 and 46, which are components of the first unit protection circuit unit 20U, and a wiring line group consisting of the clock wiring lines 29 to 32, the set wiring lines 33 to 37, and the low potential power source wiring line 27. Note that in the present embodiment, a total of two low potential power source wiring lines 27 are provided, one at the innermost position and one at a middle position. Among the set wiring lines 33 to 37, the first set wiring line 33, the second set wiring line 34, the third set wiring line 35, and the fifth set wiring line 37 are illustrated in FIG. 6.

The sixth N-channel transistor NT6, the seventh N-channel transistor NT7, and the sixth P-channel transistor PT6, which are components of the unit gate circuit unit 18U, are located so as to be interposed between the low potential power source wiring line 27 at the innermost position and the wiring line group consisting of the clock wiring lines 29 to 32, the set wiring lines 33 to 37, and the low potential power source wiring line 27. The protection TFTs 45 and 46, which are components of the first unit protection circuit unit 200, are located to be interposed between the low potential power source wiring line 27 at the innermost position and the wiring line group consisting of the clock wiring lines 29 to 32, the set wiring lines 33 to 37, and the low potential power source wiring line 27. That is, the sixth N-channel transistor NT6, the seventh N-channel transistor NT7, and the sixth P-channel transistor PT6, which are components of the unit gate circuit unit 18U, and the protection TFTs 45 and 46, which are components of the first unit protection circuit unit 20U, are located adjacent to each other along the curved portions 27R and 28R and are positioned at substantially the same distance from the display region AA. The first N-channel transistor NT1 to the fifth N-channel transistor NT5 and the first P-channel transistor PT1 to the fifth P-channel transistor PT5, which are components of the unit gate circuit unit 18U, are located to be interposed between the high potential power source wiring line 28 at the outermost position and the wiring line group consisting of the clock wiring lines 29 to 32, the set wiring lines 33 to 37, and the low potential power source wiring line 27.

Figure 7:
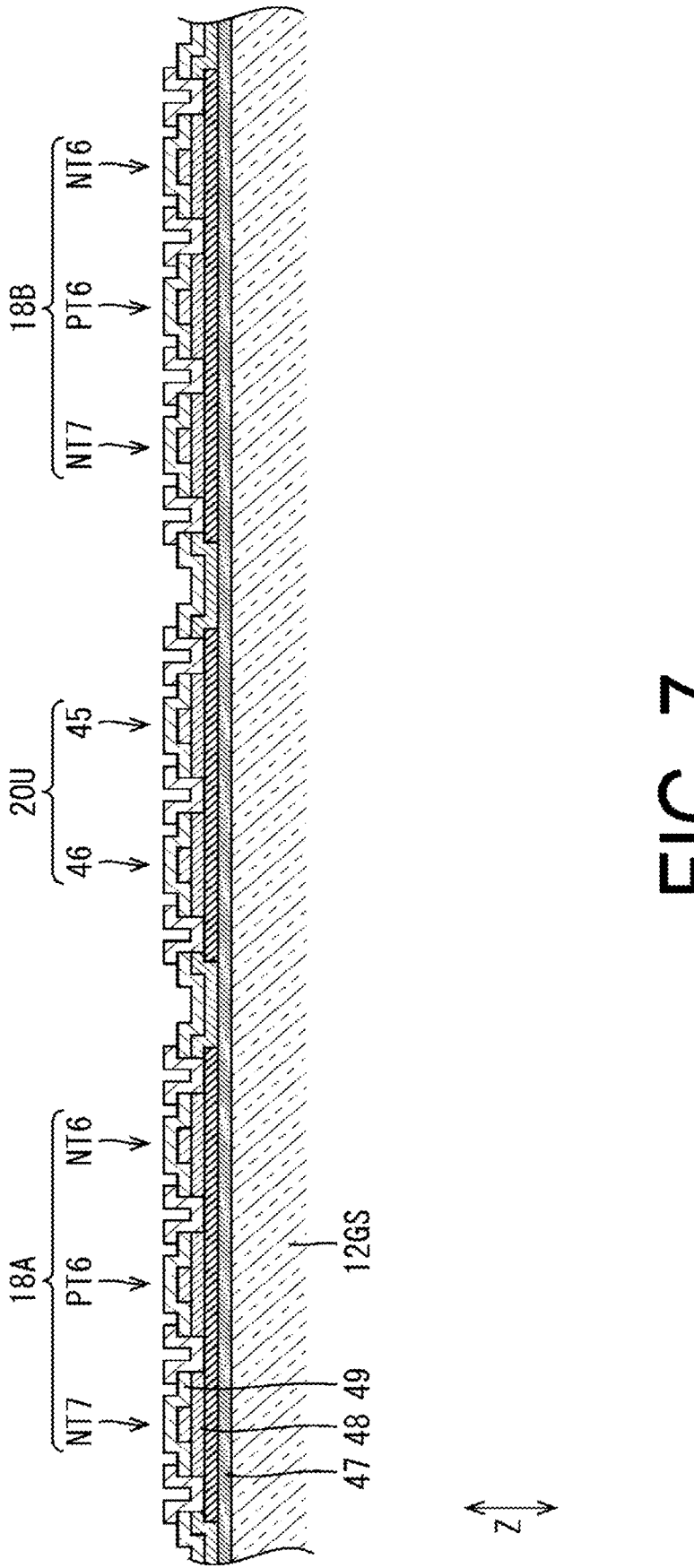
FIG. 7 is a cross-sectional view of an array substrate according to the first embodiment taken along line vii-vii in FIG. 6.

A cross-sectional configuration of the sixth N-channel transistor NT6, the seventh N-channel transistor NT7, and the sixth P-channel transistor PT6, which are components of the unit gate circuit unit 18U, and the protection TFTs 45 and 46, which are components of the first unit protection circuit unit 20U, will be described with reference to FIG. 7. FIG. 7 illustrates the films constituting the above-mentioned transistors NT6, NT7, and PT6 and the protection TFTs 45 and 46 among the various films layered on the inner face of the glass substrate 12GS, which is a component of the array substrate 12. To be specific, FIG. 7 illustrates, in order from the lower layer side (glass substrate 12GS side), a base coat film 47, a semiconductor film, a gate insulating film 48, a first metal film, an interlayer insulating film 49, and a second metal film.

The first metal film and the second metal film are both single-layer films made of one type of metal material, or layered films or alloys made of different types of metal materials, and thus have electrical conductivity. In the display region AA, the first metal film forms the gate wiring lines 21, the gate electrodes 23A of the pixel TFTs 23, and the like. In the non-display region NAA, the first metal film forms the source trunk wiring lines 44, the gate electrodes of the transistors NT1 to NT7 and PT1 to PT6, which are components of the unit gate circuit unit 18U, the gate electrodes of the protection TFTs 45 and 46, which are components of the first unit protection circuit unit 200, and the like. In the display region AA, the second metal film forms the source wiring lines 22, the source electrodes 23B and the drain electrodes 23C of the pixel TFTs 23, and the like. In the non-display region NAA, the second metal film forms the wiring lines 27 to 40, the source electrodes and the drain electrodes of the transistors NT1 to NT7 and PT1 to PT6, which are components of the unit gate circuit unit 18U, the source electrodes and the drain electrodes of the protection TFTs 45 and 46, which are components of the first unit protection circuit unit 20U, and the like.

The semiconductor film is made of a polysilicon semiconductor material (semiconductor material) having crystalline structure by a known method such as laser crystallization. The polysilicon semiconductor material of the semiconductor film has higher electron mobility than an amorphous silicon semiconductor material and an oxide semiconductor material. In the display region AA, the semiconductor film forms the semiconductor portions 23D of the pixel TFTs 23 and the like. In the non-display region NAA, the semiconductor film forms the semiconductor portions of the transistors NT1 to NT7 and PT1 to PT6, which are components of the unit gate circuit unit 18U, the semiconductor portions of the protection TFTs 45 and 46, which are components of the first unit protection circuit unit 200, and the like. The base coat film 47, the gate insulating film 48, and the interlayer insulating film 49 are all made of an inorganic material (inorganic resin material), such as silicon oxide ($SiO_2$) or silicon nitride ($SiN_x$). The base coat film 47 is located below the semiconductor film. The gate insulating film 48 is interposed between the semiconductor film and the first metal film. The interlayer insulating film 49 is interposed between the first metal film and the second metal film. Note that although not illustrated in FIG. 7, the array substrate 12 is also provided with a transparent electrode film and the like, which are components of the pixel electrode 24.

The configuration of the sixth N-channel transistor NT6, the seventh N-channel transistor NT7, and the sixth P-channel transistor PT6, which are components of the unit gate circuit unit 18U, and the protection TFTs 45 and 46, which are components of the first unit protection circuit unit 20U, will be described in detail. As illustrated in FIG. 7, the drain electrodes of the seventh N-channel transistor NT7 and the sixth P-channel transistor PT6 are used in common, and are connected to the semiconductor portions through contact holes formed in the gate insulating film 48 and the interlayer insulating film 49. Similarly, the source electrodes of the sixth P-channel transistor PT6 and the sixth N-channel transistor NT6 are used in common, and are connected to the semiconductor portions through contact holes formed in the gate insulating film 48 and the interlayer insulating film 49. The source electrode of the seventh N-channel transistor NT7 is connected to the semiconductor portion through a contact hole formed in the gate insulating film 48 and the interlayer insulating film 49. Similarly, the drain electrode of the sixth N-channel transistor NT6 is connected to the semiconductor portion through a contact hole formed in the gate insulating film 48 and the interlayer insulating film 49. The gate electrodes of the sixth N-channel transistor NT6, the seventh N-channel transistor NT7, and the sixth P-channel transistor PT6 are located so as to overlap the respective semiconductor portions with the gate insulating film 48 interposed therebetween. Note that the cross-sectional configurations of the first N-channel transistor NT1 to the fifth N-channel transistor NT5 and the first P-channel transistor PT1 to the fifth P-channel transistor PT5, which are components of the unit gate circuit unit 18U, are similar to the cross-sectional configurations of the sixth N-channel transistor NT6, the seventh N-channel transistor NT7, and the sixth P-channel transistor PT6 described above.

As illustrated in FIG. 7, the source electrodes of the first protection TFT 45 and the second protection TFT 46 are used in common, and are connected to the semiconductor portions through contact holes formed in the gate insulating film 48 and the interlayer insulating film 49. The drain electrode of the first protection TFT 45 is connected to the semiconductor portion through a contact hole formed in the gate insulating film 48 and the interlayer insulating film 49. The drain electrode of the second protection TFT 46 is connected to the semiconductor portion through a contact hole formed in the gate insulating film 48 and the interlayer insulating film 49. The gate electrodes of the protection TFTs 45 and 46 are located so as to overlap the respective semiconductor portions with the gate insulating film 48 interposed therebetween.

As illustrated in FIG. 6, the first internal node VC is connected to the gate electrode of the sixth N-channel transistor NT6. The first internal node VC is formed by connecting a portion formed of the first metal film and a portion formed of the second metal film through a contact hole formed in the interlayer insulating film 49. The portion of the first internal node VC formed of the first metal film is located to cross the wiring line group consisting of the clock wiring lines 29 to 32, the set wiring lines 33 to 37, and the low potential power source wiring line 27, all of which are formed of the second metal film. The portion of the first internal node VC formed of the first metal film is directly connected to the gate electrode of the third N-channel transistor NT3 and the gate electrode of the third P-channel transistor PT3. The portion of the first internal node VC formed of the second metal film is directly connected to the drain electrode of the fifth P-channel transistor PT5 and the source electrode of the fourth N-channel transistor NT4.

As illustrated in FIG. 6, the second internal node VCB is connected to the gate electrodes of the seventh N-channel transistor NT7 and the sixth P-channel transistor PT6. The second internal node VCB is formed by connecting a portion formed of the first metal film and a portion formed of the second metal film through a contact hole formed in the interlayer insulating film 49. The portion of the second internal node VCB formed of the first metal film is located to cross the wiring line group consisting of the clock wiring lines 29 to 32, the set wiring lines 33 to 37, and the low potential power source wiring line 27, all of which are formed of the second metal film. The portion of the second internal node VCB formed of the second metal film is directly connected to the source electrode of the first N-channel transistor NT1, the source electrode of the second N-channel transistor NT2, the source electrode of the third N-channel transistor NT3, and the drain electrode of the third P-channel transistor PT3. The portion of the second internal node VCB formed of the second metal film is connected to the gate electrode of the fifth N-channel transistor NT5 and the gate electrode of the fifth P-channel transistor PT5 through contact holes formed in the interlayer insulating film 49.

As illustrated in FIG. 6, the first input terminal GCKin is formed of the first metal film, and is connected to the source electrodes of the sixth N-channel transistor NT6 and the sixth P-channel transistor PT6 and to the predetermined clock wiring lines GCK1 to GCK4 through contact holes formed in the interlayer insulating film 49. The second input terminal GCKin2 is formed of the first metal film and is directly connected to the gate electrodes of the fourth N-channel transistor NT4 and the fourth P-channel transistor PT4, and is also connected to the predetermined clock wiring lines GCK1 to GCK4 through contact holes formed in the interlayer insulating film 49. The first set terminal S1 is formed of the first metal film and is directly connected to the gate electrodes of the second N-channel transistor NT2 and the second P-channel transistor PT2, and is also connected to the predetermined set wiring lines 33 to 37 through contact holes formed in the interlayer insulating film 49. The second set terminal S2 is formed of the first metal film and is directly connected to the gate electrodes of the first N-channel transistor NT1 and the first P-channel transistor PT1, and is also connected to the predetermined set wiring lines 33 to 37 through contact holes formed in the interlayer insulating film 49.

As illustrated in FIG. 6, the source trunk wiring line 44 is connected to the source electrode of the first protection TFT 45 and the gate electrode and the source electrode of the second protection TFT 46. The source trunk wiring line 44 consists of two portions formed of the first metal film and a portion formed of the second metal film. The portion of the source trunk wiring line 44 formed of the second metal film is used in common with the source electrodes of the first protection TFT 45 and the second protection TFT 46. One portion of the source trunk wiring line 44 formed of the first metal film is connected to the portion formed of the second metal film through a contact hole formed in the interlayer insulating film 49, and is directly connected to the gate electrode of the second protection TFT 46. One portion of the source trunk wiring line 44 formed of the first metal film is pulled out to the display region AA side across the low potential power source wiring line 27 located at the innermost position. Another portion of the source trunk wiring line 44 formed of the first metal film is connected to the portion formed of the second metal film through a contact hole formed in the interlayer insulating film 49, and is pulled out to the driver 16 side across the wiring line group consisting of the clock wiring lines 29 to 32, the set wiring lines 33 to 37, and the low potential power source wiring line 27, and the high potential power source wiring line 28 located at the outermost position.

As illustrated in FIG. 6, the power supply voltage terminal VDD is connected to the drain electrode of the second protection TFT 46. The power supply voltage terminal VDD is formed of the first metal film and is located to cross the wiring line group consisting of the clock wiring lines 29 to 32, the set wiring lines 33 to 37, and the low potential power source wiring line 27, all of which are formed of the second metal film. The power supply voltage terminal VDD is connected to the drain electrode of the second protection TFT 46 and the high potential power source wiring line 28 through contact holes formed in the interlayer insulating film 49. The power supply voltage terminal VSS is connected to the gate electrode and the drain electrode of the first protection TFT 45. The power supply voltage terminal VSS is formed of the second metal film, is directly connected to the drain electrode of the first protection TFT 45 and the low potential power source wiring line 27 located at the innermost position, and is also connected to the gate electrode of the first protection TFT 45 through a contact hole formed in the interlayer insulating film 49.

As described above, the unit gate circuit unit 18U according to the present embodiment has an elongated shape in a plan view, as illustrated in FIG. 6, and is located between the low potential power source wiring line (third wiring line) 27 located on one end side (the innermost position) in the longitudinal direction and the high potential power source wiring line (fourth wiring line) 28 located on another end side (the outermost position) in the longitudinal direction. On the other hand, the first unit protection circuit unit 200 is also located within a range sandwiched between the low potential power source wiring line 27 located at the innermost position and the high potential power source wiring line 28 located at the outermost position. In other words, the first unit protection circuit unit 20U is placed within a range in which the unit gate circuit unit 18U is placed in the longitudinal direction. Thus, the first unit protection circuit units 20U do not protrude relative to the unit gate circuit units 18U, so that the layout efficiency of the unit gate circuit units 18U and the first unit protection circuit units 200 is further improved.

As described above, the array substrate (display substrate) 12 of the present embodiment includes the unit gate circuit units (first circuit units) 18U each of which includes the gate wiring line (first wiring line) 21 located in the display region AA where an image is displayed, the low potential power source wiring line 27 and the high potential power source wiring line 28, which are the second wiring lines, located in the non-display region NAA where an image is not displayed, the gate output terminal (first output section) GL located in the non-display region NAA and connected to the gate wiring line 21, and the power supply voltage terminal VSS and the power supply voltage terminal VDD, which are the first input sections, connected to the low potential power source wiring line 27 and the high potential power source wiring line 28, which are the second wiring lines, and the first unit protection circuit units (second circuit units) 20U, each of which is located in the non-display region NAA and is connected to the low potential power source wiring line 27 and the high potential power source wiring line 28, which are the second wiring lines, but is not connected to the gate wiring line 21, and the first unit protection circuit unit 20U is located adjacent to the unit gate circuit unit 18U along the low potential power source wiring line 27 and the high potential power source wiring line 28, which are the second wiring lines, in the non-display region NAA.

The unit gate circuit unit 18U operates based on input signals and the like input from the low potential power source wiring line 27 and the high potential power source wiring line 28, which are the second wiring lines, to the power supply voltage terminal VSS and the power supply voltage terminal VDD, which are the first input sections, and outputs output signals from the gate output terminal GL to the gate wiring line 21 located in the display region AA. The first unit protection circuit unit 20U is connected to the low potential power source wiring line 27 and the high potential power source wiring line 28, which are the second wiring lines, but is not connected to the gate wiring line 21, and thus is a circuit unit different from the unit gate circuit unit 18U. In the non-display region NAA, the first unit protection circuit unit 20U is located adjacent to the unit gate circuit unit 18U along the low potential power source wiring line 27 and the high potential power source wiring line 28, which are the second wiring lines. Therefore, compared to a case where the first unit protection circuit unit 20U is located adjacent to the unit gate circuit unit 18U along a direction intersecting the low potential power source wiring line 27 and the high potential power source wiring line 28, which are the second wiring lines, an arrangement space in the direction intersecting the low potential power source wiring line 27 and the high potential power source wiring line 28, which are the second wiring lines, can be reduced. This improves layout efficiency of the unit gate circuit units 18U and the first unit protection circuit units 20U in the non-display region NAA, thereby enabling the frame of the array substrate 12 to be narrowed.

The low potential power source wiring line 27 and the high potential power source wiring line 28, which are the second wiring lines, include the linear portions 27L and 28L that are linear along the first direction and the curved portions 27R and 28R that are curved so as to intersect the first direction, at least two gate wiring lines 21 are arranged side by side with a space in the first direction, at least two unit gate circuit units 18U are arranged side by side with a space along the curved portions 27R and 28R, and the first unit protection circuit unit 20U is located adjacent to the unit gate circuit unit 18U along the curved portions 27R and 28R and is positioned between the two unit gate circuit units 18U. A distance between the two unit gate circuit units 18U in the direction along the curved portions 27R and 28R is wider than a distance between the two unit gate circuit units 18U in the first direction. Therefore, a sufficient space can be secured for the first unit protection circuit unit 20U located between the two unit gate circuit units 18U.

The unit gate circuit unit 18U is elongated in the direction intersecting the low potential power source wiring line 27 and the high potential power source wiring line 28, which are the second wiring lines, and in the non-display region NAA, the low potential power source wiring line 27, which is the third wiring line, extending parallel to the low potential power source wiring line 27 and the high potential power source wiring line 28, which are the second wiring lines, and located on one end side of the unit gate circuit unit 18U in the longitudinal direction, and the high potential power source wiring line 28, which is the fourth wiring line, extending parallel to the low potential power source wiring line 27 and the high potential power source wiring line 28, which are the second wiring lines, and located on the other end side of the unit gate circuit unit 18U in the longitudinal direction, are provided, and the first unit protection circuit unit 20U is located within a range sandwiched between the low potential power source wiring line 27, which is the third wiring line, and the high potential power source wiring line 28, which is the fourth wiring line. Thus, the first unit protection circuit units 20U do not protrude relative to the unit gate circuit units 18U, so that the layout efficiency of the unit gate circuit units 18U and the first unit protection circuit units 20U is further improved.

The unit gate circuit unit 18U is elongated in a direction intersecting the low potential power source wiring line 27 and the high potential power source wiring line 28, which are the second wiring lines, and the first unit protection circuit unit 20U is elongated in parallel to the unit gate circuit unit 18U in the longitudinal direction and is placed within a range in which the unit gate circuit unit 18U is placed in the longitudinal direction. Thus, the first unit protection circuit units 20U do not protrude relative to the unit gate circuit units 18U, so that the layout efficiency of the unit gate circuit units 18U and the first unit protection circuit units 20U is further improved.

In the display region AA, the source wiring lines (fifth wiring lines) 22 extending along the first direction intersecting the gate wiring lines 21, pixel TFTs (switching elements) 23 connected to the gate wiring lines 21 and the source wiring lines 22, and the pixel electrodes 24 connected to the pixel TFTs 23 are provided. In the non-display region NAA, the driver (signal supply unit) 16 is provided that is connected to the source wiring lines 22 and supplies image signals to the source wiring lines 22, the multiple gate wiring lines 21 and the multiple unit gate circuit units 18U are arranged side by side along the first direction, and the multiple unit gate circuit units 18U constitute the gate drive circuit (shift register circuit) 18 that sequentially supplies scanning signals to the multiple gate wiring lines 21. Scanning signals are sequentially supplied to the multiple gate wiring lines 21 from the multiple unit gate circuit units 18U. When the pixel TFT 23 connected to the gate wiring line 21 to which a scanning signal is supplied is driven, the pixel electrode 24 connected to the pixel TFT 23 is charged to a potential based on the image signal supplied from the driver 16 to the source wiring line 22. Since the first unit protection circuit units 20U can be located adjacent to the unit gate circuit units 18U that constitute the gate drive circuit (shift register circuit) 18, the first unit protection circuit units 20U can be provided together with the unit gate circuit units 18U without increasing the arrangement space for the gate drive circuit 18.

The second wiring line is used for the low potential power source wiring line 27 and the high potential power source wiring line 28, and the first unit protection circuit units 20U are connected to the source wiring lines 22 and constitute the first protection circuit 20 that protects the source wiring lines 22 and the pixel TFTs 23 from electrostatic discharge. Even when electrostatic discharge occurs, the first unit protection circuit unit 20U, which is a component of the first protection circuit 20, allows the surge to escape to the low potential power source wiring line 27 and the high potential power source wiring line 28, which are the second wiring lines. Thus, the source wiring line 22 connected to the first unit protection circuit unit 20U and the pixel TFT 23 connected to the source wiring line 22 can be protected from electrostatic discharge.

The liquid crystal panel (display device) 10 according to the present embodiment includes the array substrate 12 and the counter substrate 11 located to face the array substrate 12, which are described above. The frame of the liquid crystal panel 10 can be made narrower.

Second Embodiment

A second embodiment will be described with reference to FIG. 8 to FIG. 14. The second embodiment is different from the first embodiment in that the first protection circuit 20 is omitted, a charge removal circuit 50 is added, and the gate drive circuit is changed to a gate drive circuit 118 with a different circuit configuration. Further, repetitive descriptions of structures, actions, and effects similar to those of the first embodiment described above will be omitted.

Figure 8:
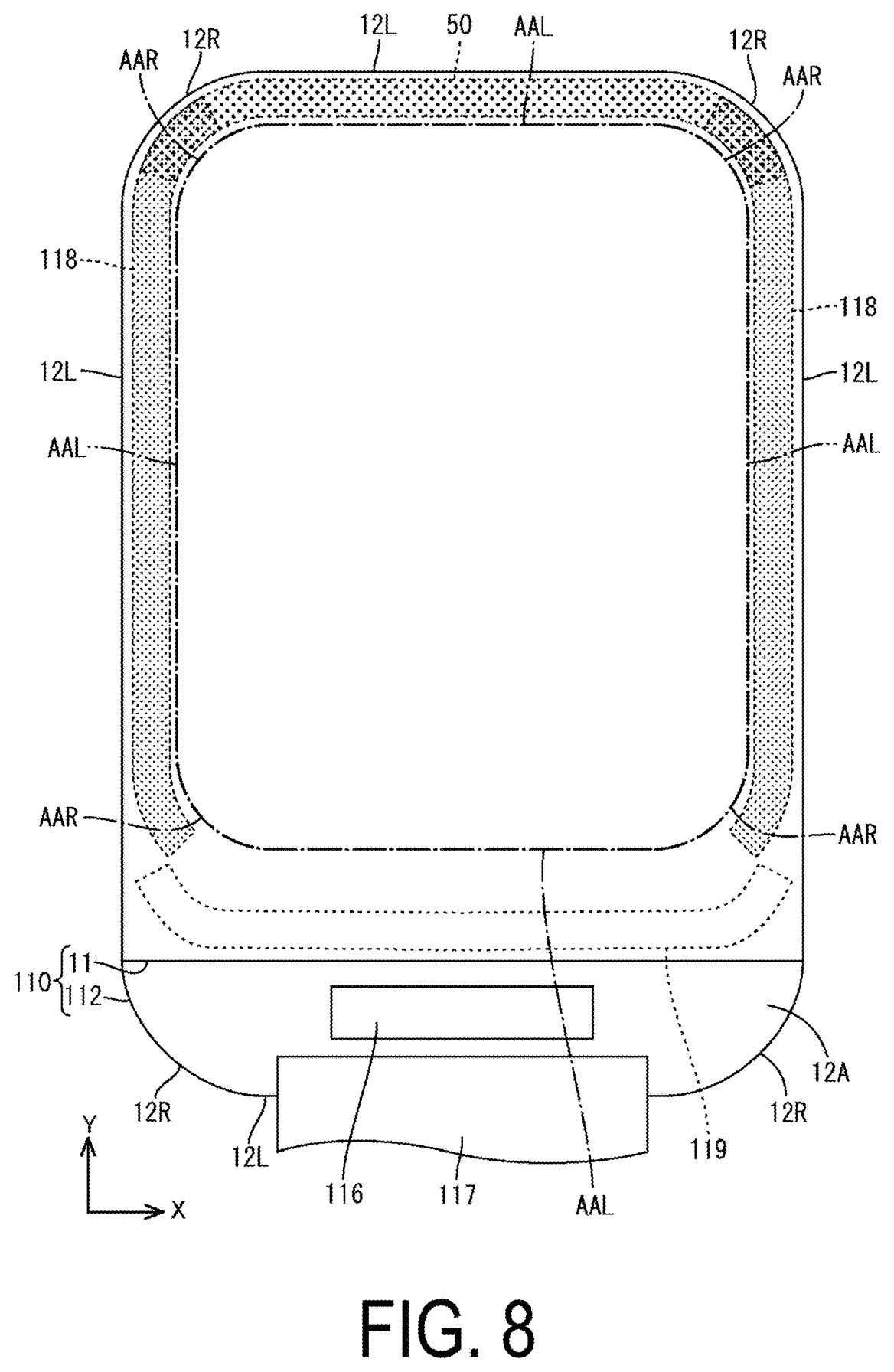

As illustrated in FIG. 8, an array substrate 112 according to the present embodiment is provided with the charge removal circuit 50 for removing charges from pixel electrodes 124. The charge removal circuit 50 is located in a non-display region NAA at a position opposite to a side of a driver 116 and a switch circuit 119 with respect to a display region AA in a Y-axis direction (upper side in FIG. 8). The charge removal circuit 50 is provided in a horizontally long belt-shaped range of the non-display region NAA extending along a short side portion (X-axis direction). Planar shapes of the charge removal circuit 50 at both end side portions in a length direction (X-axis direction) are curved along curved contours AAR of the display region AA. Both end side portions of the charge removal circuit 50 in a length direction overlap end side portions of both the gate drive circuits 118 in a length direction, in a plan view. A circuit configuration of the charge removal circuit 50 will be described below.

Figure 9:
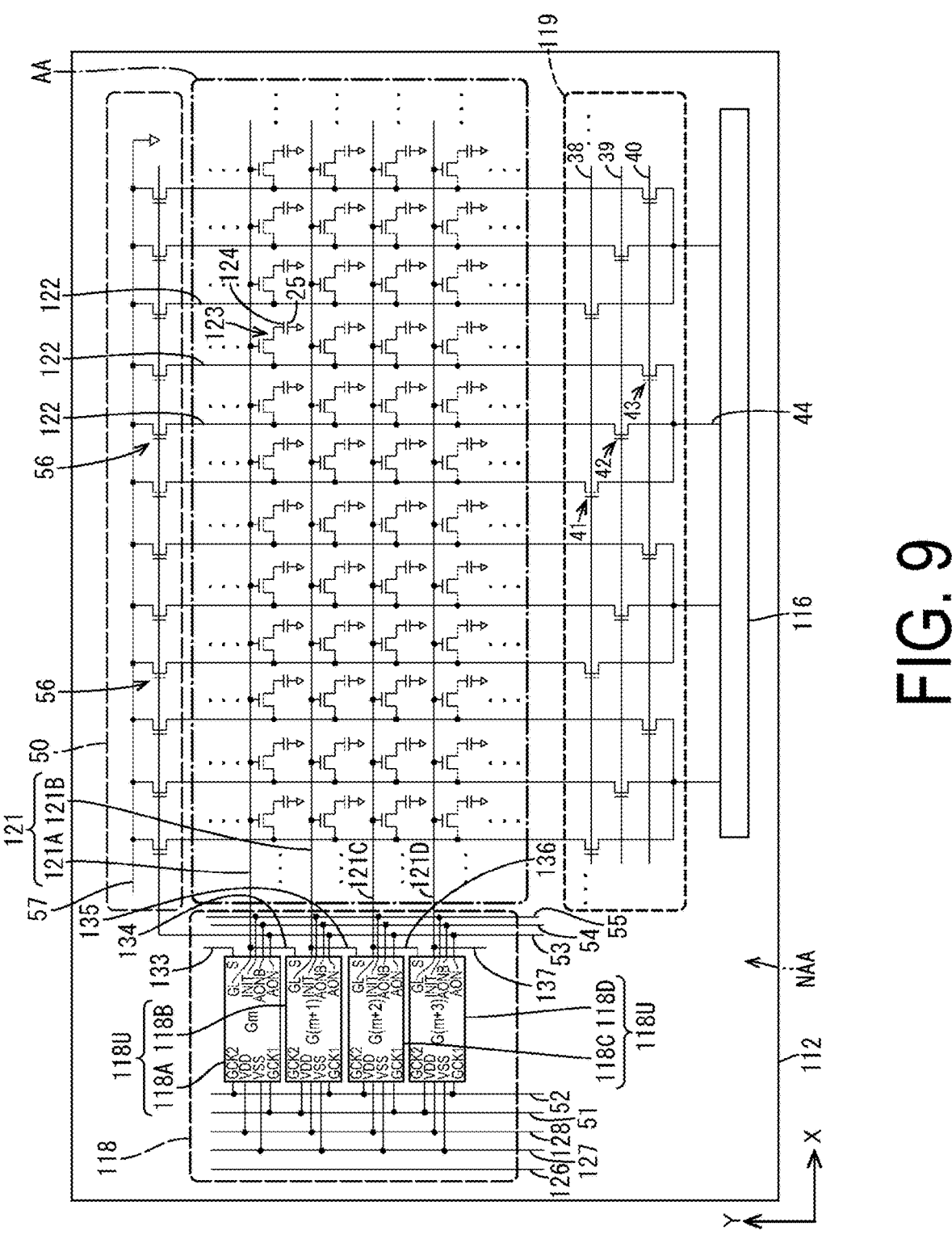
FIG. 9 is a circuit diagram illustrating an electrical configuration of the liquid crystal panel according to the second embodiment.

As illustrated in FIG. 9, in the non-display region NAA of the array substrate 112, in addition to a gate start pulse wiring line 126, a low potential power source wiring line 127, a high potential power source wiring line 128, and set wiring lines 133 to 137, two clock wiring lines 51 and 52, and three drive wiring lines 53 to 55 are provided. The two clock wiring lines 51 and 52 are a first clock wiring line 51 that transmits a clock signal GCKA and a second clock wiring line 52 that transmits a clock signal GCKB. The three drive wiring lines 53 to 55 are a first off-sequence drive wiring line (first drive wiring line, second wiring line) 53 that transmits a first off-sequence drive signal (first drive signal), a second off-sequence drive wiring line 54 that transmits a second off-sequence drive signal, and an on-sequence drive wiring line 55 that transmits an on-sequence drive signal.

As illustrated in FIG. 9, the first clock wiring line 51 is connected to a first input terminal GCK1 of a first unit gate circuit unit 118A, a second input terminal GCK2 of a second unit gate circuit unit 118B, a first input terminal GCK1 of a third unit gate circuit unit 118C, and a second input terminal GCK2 of a fourth unit gate circuit unit 118D. The second clock wiring line 52 is connected to a second input terminal GCK2 of the first unit gate circuit unit 118A, a first input terminal GCK1 of the second unit gate circuit unit 118B, a second input terminal GCK2 of the third unit gate circuit unit 118C, and a first input terminal GCK1 of the fourth unit gate circuit unit 118D. The first off-sequence drive wiring line 53 is connected to first off-sequence input terminals AON of the unit gate circuit units 118A to 118D. The second off-sequence drive wiring line 54 is connected to second off-sequence input terminals AONB of the unit gate circuit units 118A to 118D. The on-sequence drive wiring line 55 is connected to on-sequence input terminals INIT of the unit gate circuit units 118A to 118D.

The first set wiring line 133 is connected to the gate start pulse wiring line 126 and to a set terminal S of the first unit gate circuit unit 118A in the uppermost set among the multiple unit gate circuit units 118U illustrated in FIG. 9. The second set wiring line 134 is connected to an mth ("m" is an integer) gate wiring line 121 counting from the top row (e.g., a first gate wiring line 121A), and to a set terminal S of an (m+1)th unit gate circuit unit 118U from the top row (e.g., the second unit gate circuit unit 118B). The third set wiring line 135 is connected to an (m+1)th gate wiring line 121 counting from the top row (e.g., a second gate wiring line 121B), and to a set terminal S of an (m+2)th unit gate circuit unit 118U from the top row (e.g., the third unit gate circuit unit 118C). The fourth set wiring line 136 is connected to an (m+2)th gate wiring line 121 counting from the top row (e.g., a third gate wiring line 121C), and to a set terminal S of an (m+3)th unit gate circuit unit 118U from the top row (e.g., the fourth unit gate circuit unit 118D). The fifth set wiring line 137 is connected to an (m+3)th gate wiring line 121 counting from the top row (e.g., a fourth gate wiring line 121D), and to a set terminal S of a 2mth unit gate circuit unit 118U from the top row (e.g., the first unit gate circuit unit 118A of the next row). Note that as in the first embodiment described above, the low potential power source wiring line 127 is connected to power supply voltage terminals VSS of the unit gate circuit units 118U, and the high potential power source wiring line 128 is connected to power supply voltage terminals VDD of the unit gate circuit units 118U.

Figure 10:
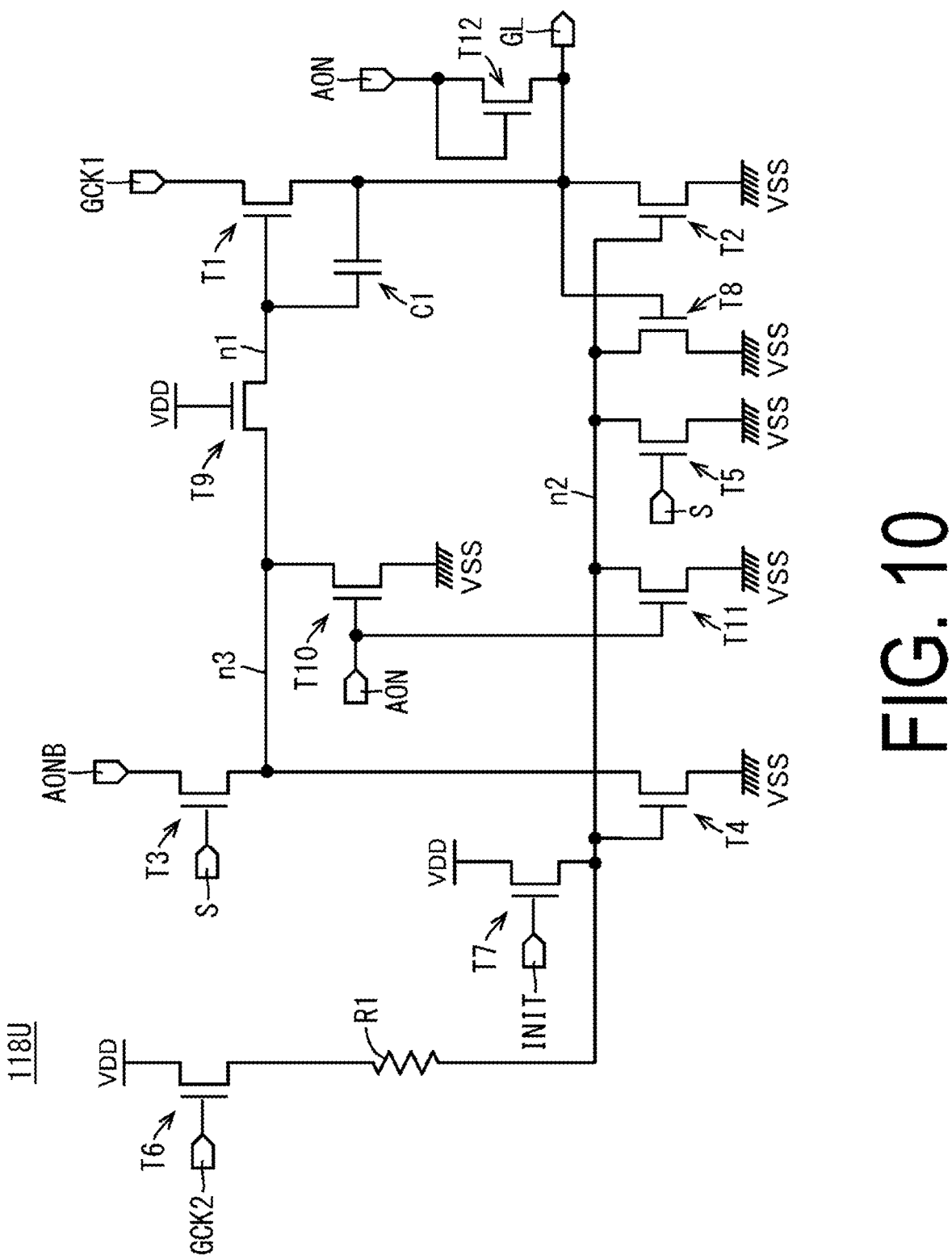
FIG. 10 is a circuit diagram illustrating a circuit configuration of a unit gate circuit unit, which is a component of a gate drive circuit provided in the liquid crystal panel according to the second embodiment.

As illustrated in FIG. 10, the unit gate circuit unit 118U includes transistors T1 to T12, a resistor R1, and a capacitor C1. The transistors T1 to T12 are all N-channel transistors, and threshold voltages of the transistors T1 to T12 are all set to a high potential (H). The unit gate circuit unit 118U includes a first internal node n1, a second internal node n2, and a third internal node n3 as connection wiring lines that connect predetermined transistors together.

As illustrated in FIG. 10, the first transistor T1 includes a gate electrode connected to the first internal node n1, a source electrode connected to the first input terminal GCK1, and a drain electrode connected to a gate output terminal GL. The second transistor T2 includes a gate electrode connected to the second internal node n2, a source electrode connected to the gate output terminal GL, and a drain electrode connected to the power supply voltage terminal VSS. The third transistor T3 includes a gate electrode connected to the set terminal S, a source electrode connected to the second off-sequence input terminal AONB, and a drain electrode connected to the third internal node n3. The fourth transistor T4 includes a gate electrode connected to the second internal node n2, a source electrode connected to the third internal node n3, and a drain electrode connected to the power supply voltage terminal VSS. The fifth transistor T5 includes a gate electrode connected to the set terminal S, a source electrode connected to the second internal node n2, and a drain electrode connected to the power supply voltage terminal VSS. The sixth transistor T6 includes a gate electrode connected to the second input terminal GCK2, a source electrode connected to the power supply voltage terminal VDD, and a drain electrode connected to the second internal node n2. The seventh transistor T7 includes a gate electrode connected to the on-sequence input terminal INIT, a source electrode connected to the power supply voltage terminal VDD, and a drain electrode connected to the second internal node n2. The eighth transistor T8 includes a gate electrode connected to the gate output terminal GL, a source electrode connected to the second internal node n2, and a drain electrode connected to the power supply voltage terminal VSS. The ninth transistor T9 includes a gate electrode connected to the power supply voltage terminal VDD, a source electrode connected to the third internal node n3, and a drain electrode connected to the first internal node n1.

The 10th transistor T10 includes a gate electrode connected to the first off-sequence input terminal AON, a source electrode connected to the third internal node n3, and a drain electrode connected to the power supply voltage terminal VSS. The 11th transistor T11 includes a gate electrode connected to the first off-sequence input terminal AON, a source electrode connected to the second internal node n2, and a drain electrode connected to the power supply voltage terminal VSS. The 12th transistor T12 includes a gate electrode and a source electrode both connected to the first off-sequence input terminal AON, and a drain electrode connected to the gate output terminal GL. The resistor R1 is provided at the second internal node n2, with one end connected to the drain electrode of the sixth transistor T6 and another end connected to the drain electrode of the seventh transistor T7. The capacitor C1 includes one electrode connected to the first internal node n1 and another electrode connected to the gate output terminal GL.

Figure 11:
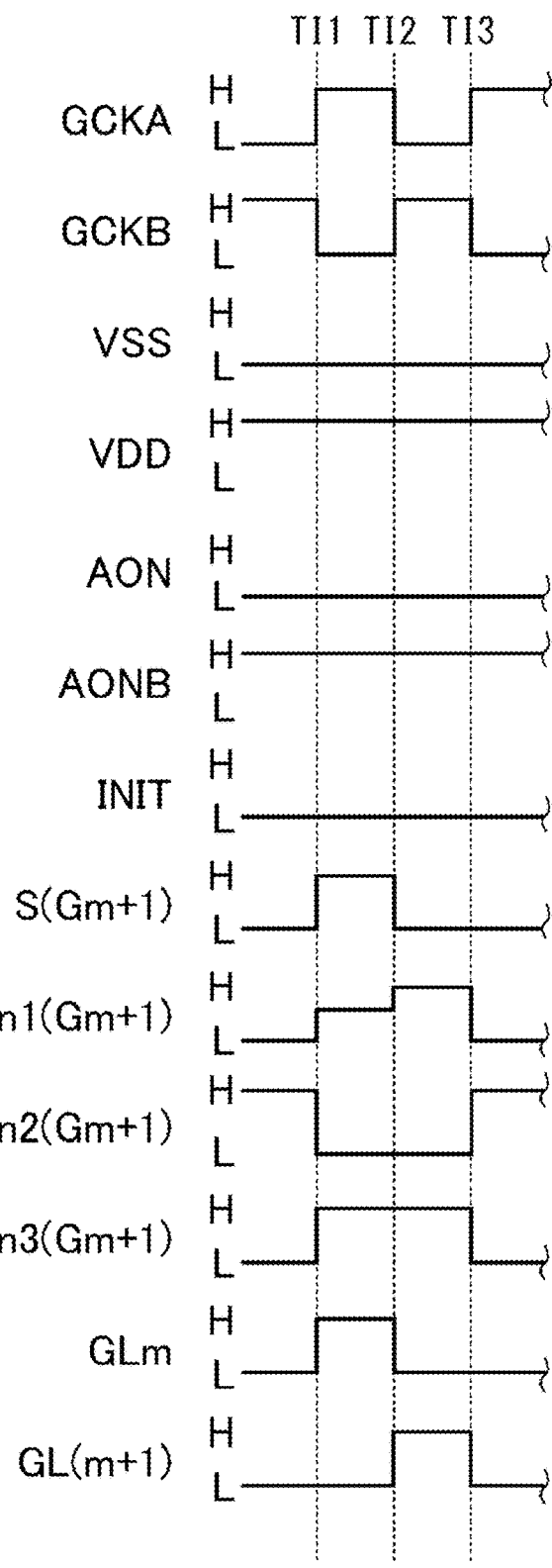
FIG. 11 is a timing chart for operation of the gate drive circuit according to the second embodiment.

Next, operation of the gate drive circuit 118 will be described with reference to FIG. 11. FIG. 11 is a timing chart for the operation relating to the gate drive circuit 118. Before describing the operation of the gate drive circuit 118, potentials of signals and terminals illustrated in FIG. 11 will be described. FIG. 11 illustrates, from top to bottom, potentials of the clock signals GCKA and GCKB, the power supply voltage terminal VSS, the power supply voltage terminal VDD, the first off-sequence input terminal AON, the second off-sequence input terminal AONB, the on-sequence input terminal INIT, the set terminal S (Gm+1), the first internal node n1 (Gm+1), the second internal node n2 (Gm+1), the third internal node n3 (Gm+1), and the gate output terminals GLm and GL (Gm+1). Note that the set terminal S (Gm+1), the first internal node n1 (Gm+1), the second internal node n2 (Gm+1), the third internal node n3 (Gm+1), and the gate output terminal GL (Gm+1) are the set terminal S, the first internal node n1, the second internal node n2, the third internal node n3, and the gate output terminal GL, provided in the (m+1)th unit gate circuit unit 118U counting from the top row. Further, the gate output terminal GLm is the gate output terminal GL provided in the mth unit gate circuit unit 118U counting from the top row.

As illustrated in FIG. 11, the clock signals GCKA and GCKB are both rectangular waves in which a low potential (represented "L" in FIG. 11) and a high potential (represented "H" in FIG. 11) are alternately repeated at constant periods. The clock signal GCKA and the clock signal GCKB always have opposite low and high potentials. The first off-sequence input terminal AON and the on-sequence input terminal INIT are always held at a low potential, which is a constant low level potential. The second off-sequence input terminal AONB is always held at a high potential, which is a constant high level potential. The potential of the set terminal S (Gm+1) is synchronized with the potential of the gate output terminal GLm. The potential of the gate output terminal GLm is synchronized with the clock signal GCKB. The potential of the gate output terminal GL (Gm+1) is synchronized with the clock signal GCKA. The potentials of the first internal node n1 (Gm+1), the second internal node n2 (Gm+1), and the third internal node n3 (Gm+1) will be described in detail later. Note that as in the first embodiment, the power supply voltage terminal VSS is always held at a low potential, which is a constant low level potential. The power supply voltage terminal VDD is always held at a high potential, which is a constant high level potential.

The operation of the gate drive circuit 118 will be specifically described, taking in particular the (m+1)th unit gate circuit unit 118U counting from the top row. At a time point TI1 illustrated in FIG. 11, the high potential of the clock signal GCKA is input to the first input terminal GCK1 of the mth unit gate circuit unit 118U. Then, a scanning signal is output from the gate output terminal GLm to the connected gate wiring line 121, so that the set terminal S (Gm+1) of the (m+1)th unit gate circuit unit 118U becomes a high potential. When the set terminal S (Gm+1) becomes the high potential, the third transistor T3 and the fifth transistor T5 of the (m+1)th unit gate circuit unit 118U are both turned on. Then, the first internal node n1 (Gm+1) and the third internal node n3 (Gm+1) of the (m+1)th unit gate circuit unit 118U become a high potential of the second off-sequence input terminal AONB. When the first internal node n1 (Gm+1) and the third internal node n3 (Gm+1) become the high potential, the capacitor C1 is charged. On the other hand, the high potential of the clock signal GCKA is also input to the second input terminal GCK2 of the (m+1)th unit gate circuit unit 118U counting from the top row, and the sixth transistor T6 is turned on; however, the resistor R1 is connected to the drain electrode of the sixth transistor T6. Thus, the potential of the second internal node n2 (m+1) becomes a low potential via the fifth transistor T5 (the fifth transistor T5 has a switch size such that the drive capability thereof is higher than that of the sixth transistor T6 connected via the resistor R1). Therefore, the fourth transistor T4 is turned off, and the second transistor T2 is turned off.

At a time point TI2 illustrated in FIG. 11, the high potential of the clock signal GCKB is input to the first input terminal GCK1 of the (m+1)th unit gate circuit unit 118U. Then, the potential of the gate output terminal GL (Gm+1) of the (m+1)th unit gate circuit unit 118U rises. At this time, since the capacitor C1 is provided between the first internal node n1 (Gm+1) and the gate output terminal GL (Gm+1), the potential of the first internal node n1 (Gm+1) also rises in response to the rise in the potential of the gate output terminal GL (Gm+1). That is, the first internal node n1 (Gm+1) is bootstrapped. Thus, the gate electrode of the first transistor T1 has a greater potential, so the potential of the gate output terminal GL (Gm+1) becomes a high potential. Thus, a scanning signal is output to the (m+1)th gate wiring line 121. Note that when the potential of the gate output terminal GL (Gm+1) becomes a high potential, the eighth transistor T8 is turned on, thereby holding the second internal node n2 (Gm+1) at the low potential of the power supply voltage terminal VSS.

At a time point TI3 illustrated in FIG. 11, the high potential of the clock signal GCKA is input to the second input terminal GCK2 of the (m+1)th unit gate circuit unit 118U. Then, as described above, the fourth transistor T4 is turned on, and the second transistor T2 is turned on. Accordingly, the gate output terminal GL (Gm+1) becomes the low potential of the power supply voltage terminal VSS.

Figure 12:
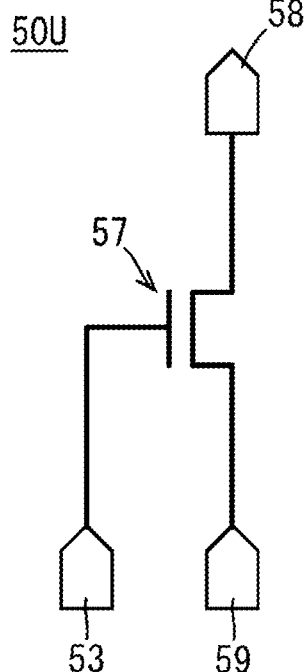
FIG. 12 is a circuit diagram illustrating a circuit configuration of a unit charge removal circuit unit, which is a component of a charge removal circuit according to the second embodiment.

As illustrated in FIGS. 9 and 12, the charge removal circuit 50 includes multiple unit charge removal circuit units (second circuit units) 50U arranged along a length direction thereof (substantially the X-axis direction). The number of the unit charge removal circuit units 50U is equal to number of the source wiring lines 122. The unit charge removal circuit unit 50U includes the first off-sequence drive wiring line 53 described above, a charge removal wiring line 56, and a charge removal TFT 57. The charge removal wiring line 56 is connected to the driver 116 or a flexible substrate 117 and is always held at a common potential. The charge removal TFT 57 is an N-channel transistor. The charge removal TFT 57 includes a gate electrode connected to the first off-sequence drive wiring line 53, a source electrode connected to a source input terminal (second input section) 58, and a drain electrode connected to a charge output terminal (second output section) 59. The source input terminal 58 is connected to the source wiring line 122. The charge output terminal 59 is connected to the charge removal wiring line 56. The charge removal TFT 57 is turned on when the first off-sequence drive signal is supplied from the driver 116 to the first off-sequence drive wiring line 53.

Figure 13:
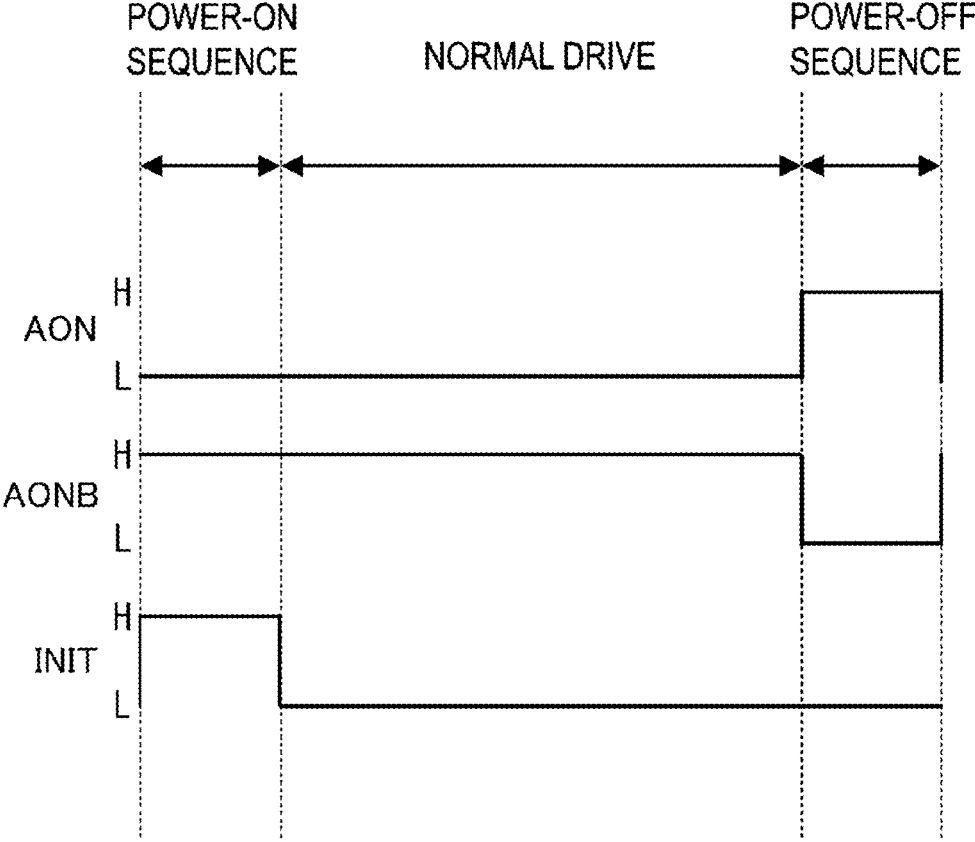
FIG. 13 is a timing chart for operation of the charge removal circuit according to the second embodiment.

The operation of the charge removal circuit 50 will now be described with reference to FIGS. 9, 10, and 13. FIG. 13 is a timing chart for the operation of the charge removal circuit 50. FIG. 13 illustrates, in addition to the potential of the first off-sequence input terminal AON, the potentials of the second off-sequence input terminal AONB and the on-sequence input terminal INIT. A timing at which the first off-sequence drive signal is supplied from the driver 116 to the first off-sequence drive wiring line 53 is synchronized with a timing at which a power-off sequence is started in response to power-off of a liquid crystal panel 110 (a timing at which the normal drive is switched to the power-off sequence), as illustrated in FIG. 13. When the first off-sequence drive signal is supplied to the first off-sequence drive wiring line 53 in response to the start of the power-off sequence, all the charge removal TFTs 57 provided in the charge removal circuit 50 are turned on, as illustrated in FIG. 9. At this time, as illustrated in FIG. 10, the first off-sequence input terminals AON provided in all the unit gate circuit units 118U become a high potential, so that all the gate output terminals GL become a high potential, and scanning signals are supplied to all the gate wiring lines 121. Accordingly, all pixel TFTs 123 are turned on, so that charges are transferred from the pixel electrodes 124 to the charge removal wiring lines 56 via the source wiring lines 122. Thus, the charges of all the pixel electrodes 124 can be removed. Note that during the power-off sequence, the second off-sequence input terminal AONB is always set to a low potential, as illustrated in FIG. 13.

Note that when a power-on sequence is started in response to the power-on of the liquid crystal panel 110, the on-sequence input terminals INIT of all the unit gate circuit units 118U become a high potential, as illustrated in FIG. 13. Accordingly, as illustrated in FIG. 10, the seventh transistors T7 included in all the unit gate circuit units 118U are turned on, and the second internal nodes n2 become a high potential. The potential of the second internal node n2 is not divided by the resistor R1, and thus is equal to or higher than the threshold voltages of the fourth transistor T4 and the second transistor T2. As a result, the fourth transistor T4 and the second transistor T2 are both turned on, so that the first internal node n1 and the third internal node n3 both become a low potential, and the gate output terminal GL becomes a low potential.

Figure 14:
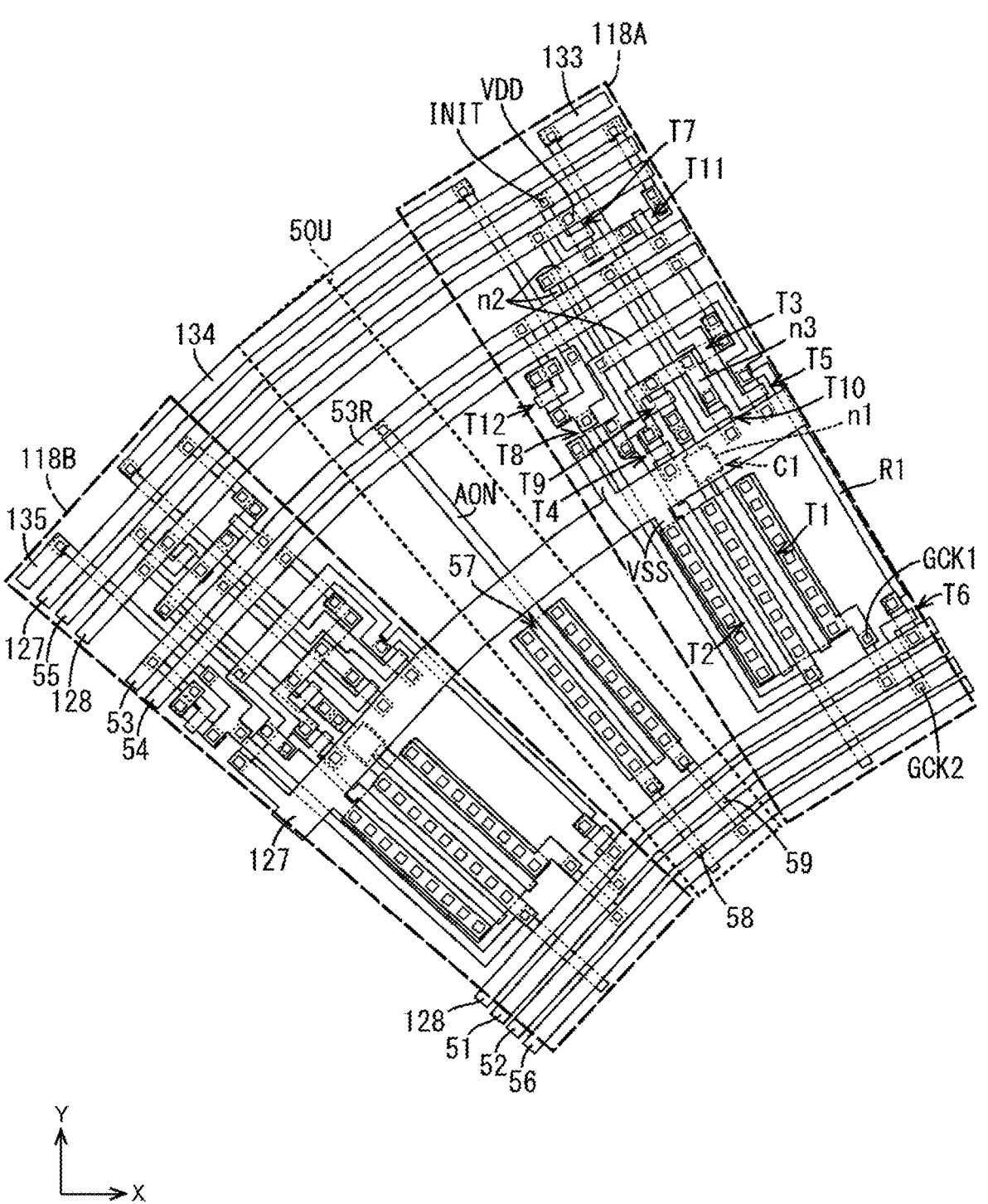
FIG. 14 is an enlarged plan view of unit gate circuit units of the gate drive circuit and the unit charge removal circuit unit of the charge removal circuit according to the second embodiment.

As described above, as illustrated in FIG. 8, both end portions of the charge removal circuit 50 in the length direction overlap end portions of both the gate drive circuits 118 in the length direction in a plan view. A configuration of an overlapping portion of the gate drive circuit 118 and the charge removal circuit 50 will be described with reference to FIG. 14. FIG. 14 illustrates the first unit gate circuit unit 118A and the second unit gate circuit unit 118B as the unit gate circuit units 118U, which are components of the gate drive circuit 118, and one unit charge removal circuit unit 50U, which is a component of the charge removal circuit 50.

First, as illustrated in FIG. 14, the wiring lines 51 to 56, 127, 128, and 133 to 137 connected to the gate drive circuit 118 and the charge removal circuit 50 are all curved along the curved contour AAR in the overlapping portion of the charge removal circuit 50 and the gate drive circuit 118. In particular, the first off-sequence drive wiring line 53 includes a curved portion 53R that is curved so as to intersect both the Y-axis direction and the X-axis direction. The unit gate circuit unit 118U and the unit charge removal circuit unit 50U are both elongated in a direction intersecting the curved portion 53R in a plan view. The unit gate circuit unit 118U and the unit charge removal circuit unit 50U are located side by side along the curved portion 53R described above. To be specific, the unit gate circuit units 118U and the unit charge removal circuit units 50U are located alternately and repeatedly one by one along the curved portion 53R in the overlapping portion of the charge removal circuit 50 and the gate drive circuit 118. Two unit gate circuit units 118U are arranged side by side with a space in the direction along the curved portion 53R, and one unit charge removal circuit unit 50U is interposed between the two unit gate circuit units 118U. Conversely, two unit charge removal circuit units 50U are arranged side by side with a space in the direction along the curved portion 53R, and one unit gate circuit unit 118U is interposed between the two unit charge removal circuit units 50U. Note that the unit gate circuit unit 118U is connected to the gate wiring line 121, the low potential power source wiring line 127, the high potential power source wiring line 128, the first off-sequence drive wiring line 53, and the like, and is a component of the gate drive circuit 118, while the unit charge removal circuit unit 50U is connected to the first off-sequence drive wiring line 53, the source wiring line 122, and the charge removal wiring line 56, but not connected to the gate wiring line 121, and is a component of the charge removal circuit 50. Therefore, the unit gate circuit unit 118U and the unit charge removal circuit unit 50U are functionally different circuit units.

Thus, in the non-display region NAA, the unit charge removal circuit unit 50U is located adjacent to the unit gate circuit unit 118U, which is a different circuit unit, along the first off-sequence drive wiring line 53, as illustrated in FIG. 14. Therefore, compared to a case where the unit charge removal circuit is located adjacent to the unit gate circuit unit 118U along a direction intersecting the first off-sequence drive wiring line 53, an arrangement space in the direction intersecting the first off-sequence drive wiring line 53 can be reduced. This improves layout efficiency of the unit gate circuit units 118U and the unit charge removal circuit units 50U in the non-display region NAA, thereby enabling the frame of the array substrate 112 to be narrowed. In particular, in the present embodiment, the unit charge removal circuit unit 50U is adjacent to the unit gate circuit unit 118U along the curved portion 53R, and is located between two unit gate circuit units 118U. A distance between the two unit gate circuit units 118U in the direction along the curved portion 53R is wider than a distance between the two unit gate circuit units 118U in the Y-axis direction (first direction). Therefore, a sufficient space can be secured for the unit charge removal circuit unit 50U located between the two unit gate circuit units 118U. As described above, the unit charge removal circuit units 50U can be located adjacent to the unit gate circuit units 118U that constitute the gate drive circuit 118. This allows the unit charge removal circuit units 50U to be provided together with the unit gate circuit units 118U without increasing an arrangement space for the gate drive circuit 118. The first off-sequence drive signal supplies potentials to the gate circuit 118 and the charge removal circuit 50 from the common wiring line. When the charge removal circuit 50 is located adjacent to the unit gate circuit unit 118U along the direction intersecting the first off-sequence drive wiring line 53, the first off-sequence drive wiring line 53 needs to be located separately in both the charge removal circuit 50 and the unit gate circuit unit 118U. However, in the present embodiment, this wiring line is used in common, which is advantageous for further narrowing the frame.

A specific configuration of the overlapping portion of the gate drive circuit 118 and the charge removal circuit 50 will be described. In the overlapping portion of the gate drive circuit 118 and the charge removal circuit 50, as illustrated in FIG. 14, one charge removal wiring line 56 is located at a position closest to the display region AA (the innermost position), and the set wiring lines 133 to 137 are located at a position farthest from the display region AA (the outermost position). On the outer side of the charge removal wiring line 56 located at the innermost position, the second clock wiring line 52, the first clock wiring line 51, and the high potential power source wiring line 128 are located in this order with spaces therebetween. The low potential power source wiring line 127 having a line width larger than other wiring lines is located at a position spaced a predetermined distance on the outer side from the high potential power source wiring line 128, which is located on the outer side among the wiring lines 51, 52, 56, and 128. Between the high potential power source wiring line 128 located on the outer side among the wiring lines 51, 52, 56, and 128, and the wide low potential power source wiring line 127, the first transistor T1, the second transistor T2, the sixth transistor T6, and the resistor R1, which are components of the unit gate circuit unit 118U, and the charge removal TFT 57, which is a component of the unit charge removal circuit unit 50U, are located.

On the other hand, on the inner side of the set wiring lines 133 to 137 located at the outermost position, as illustrated in FIG. 14, the low potential power source wiring line 127, the on-sequence drive wiring line 55, and the high potential power source wiring line 128 are located in this order with spaces therebetween. The first off-sequence drive wiring line 53 and the second off-sequence drive wiring line 54 are located in this order at a predetermined distance on the inner side from the high potential power source wiring line 128, which is located on the inner side among the wiring lines 55, 127, 128, and 133 to 137. Between the high potential power source wiring line 128 located on the inner side among the wiring lines 55, 127, 128, and 133 to 137, and the first off-sequence drive wiring line 53, the seventh transistor T7, the 11th transistor T11, and the like, which are components of the unit gate circuit unit 118U, are located. A predetermined space is provided between the second off-sequence drive wiring line 54 and the wide low potential power source wiring line 127 described above, and the third transistor T3, the fourth transistor T4, the fifth transistor T5, the eighth transistor T8, the ninth transistor T9, the 10th transistor T10, the 12th transistor T12, and the like, which are components of the unit gate circuit unit 118U, are located in this space. In the present embodiment, two low potential power source wiring lines 127 and two high potential power source wiring lines 128 are provided. Among the set wiring lines 133 to 137, the first set wiring line 133, the second set wiring line 134, and the third set wiring line 135 are illustrated in FIG. 14.

In the present embodiment, for example, by a selective resistance reduction process on the semiconductor film, part of the semiconductor film is made into a low resistance conductor. To be specific, a portion of the semiconductor film that does not overlap the components formed of the first metal film is selectively subjected to the resistance reduction process, and a portion of the semiconductor film that overlaps the components formed of the first metal film is not subjected to the resistance reduction process. That is, the resistance reduction process of the semiconductor film is performed using the components formed of the first metal film as a mask. The resistor R1 and a part of the capacitor C1 (to be specific, an electrode connected to the gate output terminal GL), which are components of the unit gate circuit unit 118U, are constituted of low resistance portions of the semiconductor film. The wiring lines 51 to 55, 127, 128, and 133 to 137 are all formed of the second metal film. In the transistors T1 to T12 and 57, the gate electrodes are all formed of the first metal film, the source electrodes and the drain electrodes are all formed of the second metal film, and the semiconductor portions are all formed by portions of the semiconductor film that are not made to have a low resistance. Note that in the insulating films 48 and 49 (see FIG. 7), contact holes are formed at the connection points between the component formed of the first metal film and the component formed of the second metal film, and at the connection points between the component formed of the second metal film and the component formed of the semiconductor film.

As illustrated in FIG. 14, the drain electrode of the first transistor T1 and the drain electrode of the second transistor T2, which are components of the unit gate circuit unit 118U, are used in common and connected to the gate output terminal GL. The gate output terminal GL includes two portions formed of the first metal film and a portion formed of the second metal film, and one of the portions formed of the first metal film is connected to the drain electrodes of the transistors T1 and T2. One end side of the one portion of the gate output terminal GL formed of the first metal film extends toward the inner side, crosses the wiring lines 51, 52, 56, and 128, and is connected to the gate wiring line 121 in the display region AA. Another end side of the one portion of the gate output terminal GL formed of the first metal film is pulled out to the side opposite to a side of the first transistor T1 with respect to the second transistor T2, extends toward the outer side, crosses the wide low potential power source wiring line 127, and is used in common with the gate electrode of the eighth transistor T8. The portion of the gate output terminal GL formed of the second metal film is connected to the other end portion of the one portion of the gate output terminal GL formed of the first metal film. The portion of the gate output terminal GL formed of the second metal film is connected to the drain electrode of the 12th transistor T12 and is also connected to the other portion of the gate output terminal GL formed of the first metal film. The other portion of the gate output terminal GL formed of the first metal film extends from the connection point with the portion formed of the second metal film toward the outer side, is located across the wiring lines 53, 54, 55, 127, and 128, and is connected to the set wiring lines 133 to 137.

As illustrated in FIG. 14, the source electrode of the first transistor T1 and one of the clock wiring lines 51 and 52 are connected to each other by the first input terminal GCK1 formed of the first metal film. The gate electrode of the first transistor T1 is directly connected to the electrode of the capacitor C1 formed of the first metal film. The electrode of the capacitor C1 formed of the first metal film is connected to the drain electrode of the ninth transistor T9. The capacitor C1 has a configuration in which the electrode formed of the first metal film and the electrode by the low-resistance portion formed of the semiconductor film are overlapped with the gate insulating film 48 (see FIG. 7) interposed therebetween. The capacitor C1 is located to overlap the wide low potential power source wiring line 127. The drain electrode of the second transistor T2 is directly connected to the low potential power source wiring line 127. The gate electrode of the second transistor T2 extends across the wide low potential power source wiring line 127 and is directly connected to the gate electrode of the fourth transistor T4 and is also connected to the second internal node n2.

As illustrated in FIG. 14, the second internal node n2 includes a portion formed of the first metal film and two portions formed of the second metal film, and the gate electrode of the fourth transistor T4 is connected to one of the portions of the second internal node n2 formed of the second metal film. One of the portions of the second internal node n2 formed of the second metal film is routed to surround the eighth transistor T8, the ninth transistor T9, the third transistor T3, and the fifth transistor T5, and the portion formed of the first metal film is connected to a portion of one of the portions. The portion of the second internal node n2 formed of the first metal film extends toward the outer side across the wiring lines 53 and 54, and is connected to another portion of the second internal node n2 formed of the second metal film. The other portion of the second internal node n2 formed of the second metal film extends along the first off-sequence drive wiring line 53.

As illustrated in FIG. 14, the gate electrode of the sixth transistor T6 is directly connected to the second input terminal GCK2 formed of the first metal film. The second input terminal GCK2 is connected to one of the clock wiring lines 51 and 52. The source electrode of the sixth transistor T6 is used in common with the power supply voltage terminal VDD and is connected to the high potential power source wiring line 128. The drain electrode of the sixth transistor T6 is connected to one end portion of the resistor R1. The resistor R1 extends from a side of the high potential power source wiring line 128 located on the inner side toward the wide low potential power source wiring line 127 side, and is connected to the source electrode of the fifth transistor T5 at a position across the wide low potential power source wiring line 127. The drain electrode of the fifth transistor T5 is connected to the wide low potential power source wiring line 127. The gate electrode of the fifth transistor T5 is directly connected to the gate electrode of the third transistor T3. The gate electrode of the third transistor T3 extends toward the outer side across the wiring lines 53, 54, 127, and 128 and, is connected to one of the set wiring lines 133 to 137. The source electrode of the third transistor T3 is connected to the second off-sequence input terminal AONB formed of the first metal film. The second off-sequence input terminal AONB is connected to the second off-sequence drive wiring line 54. The drain electrode of the third transistor T3 is connected to the third internal node n3 formed of the second metal film.

As illustrated in FIG. 14, the source electrode of the ninth transistor T9, the source electrode of the 10th transistor T10, and the source electrode of the fourth transistor T4 are connected to the third internal node n3. The gate electrode of the ninth transistor T9 is directly connected to the power supply voltage terminal VDD formed of the first metal film. The power supply voltage terminal VDD extends from the gate electrode of the ninth transistor T9 toward the outer side and is connected to the high potential power source wiring line 128. The drain electrode of the ninth transistor T9 is connected to the electrode of the capacitor C1 formed of the first metal film. The gate electrode of the 10th transistor T10 is directly connected to the first off-sequence input terminal AON formed of the first metal film. The first off-sequence input terminal AON extends from the gate electrode of the 10th transistor T10 toward the outer side and is connected to the first off-sequence drive wiring line 53. The drain electrode of the 10th transistor T10 is used in common with the power supply voltage terminal VSS and is connected to the low potential power source wiring line 127. The gate electrode of the fourth transistor T4 is connected to one portion of the second internal node n2 formed of the second metal film. The drain electrode of the fourth transistor T4 is used in common with the power supply voltage terminal VSS and is connected to the low potential power source wiring line 127.

As illustrated in FIG. 14, the source electrode of the eighth transistor T8 is connected to the one portion of the second internal node n2 formed of the second metal film. The drain electrode of the eighth transistor T8 is used in common with the power supply voltage terminal VSS and connected to the low potential power source wiring line 127. The gate electrode of the seventh transistor T7 is connected to the on-sequence input terminal INIT formed of the first metal film. The on-sequence input terminal INIT is connected to the on-sequence drive wiring line 55. The source electrode of the seventh transistor T7 is used in common with the power supply voltage terminal VDD and is connected to the high potential power source wiring line 128. The drain electrode of the seventh transistor T7 is connected to the other portion of the second internal node n2 formed of the second metal film. The gate electrode of the 11th transistor T11 is directly connected to the first off-sequence input terminal AON formed of the first metal film. The first off-sequence input terminal AON is connected to the first off-sequence drive wiring line 53. The source electrode of the 11th transistor T11 is connected to the other portion of the second internal node n2 formed of the second metal film. The drain electrode of the 11th transistor T11 is connected to the power supply voltage terminal VSS formed of the first metal film. The power supply voltage terminal VSS is connected to the low potential power source wiring line 127. The gate electrode of the 12th transistor T12 is directly connected to the first off-sequence input terminal AON formed of the first metal film. The first off-sequence input terminal AON extends from the gate electrode of the 12th transistor T12 toward the outer side and is connected to the first off-sequence drive wiring line 53. The source electrode of the 12th transistor T12 is connected to the gate electrode thereof.

As illustrated in FIG. 14, the gate electrode of the charge removal TFT 57, which is a component of the unit charge removal circuit unit 50U, is directly connected to the first off-sequence input terminal AON formed of the first metal film. The first off-sequence input terminal AON extends from the gate electrode of the charge removal TFT 57 toward the outer side, is located across the wide low potential power source wiring line 127, and is connected at the end portion thereof to the first off-sequence drive wiring line 53. The source electrode of the charge removal TFT 57 is connected to the source input terminal 58 formed of the first metal film. The source input terminal 58 extends from the connection point with the source electrode of the charge removal TFT 57 toward the inner side and is connected to the source wiring line 122 in the display region AA across the wiring lines 51, 52, 56, and 128. The drain electrode of the charge removal TFT 57 is connected to the charge output terminal 59 formed of the first metal film. The charge output terminal 59 extends from the connection point with the drain electrode of the charge removal TFT 57 toward the inner side and is connected to the charge removal wiring line 56 across the wiring lines 51, 52, and 128.

As described above, the unit gate circuit unit 118U according to the present embodiment has an elongated shape in a plan view, as illustrated in FIG. 14, and is located between the charge removal wiring line (third wiring line) 56 located on one end side (the innermost position) in the longitudinal direction, and the set wiring lines (fourth wiring lines) 133 to 137 located on the other end side (the outermost position) in the longitudinal direction. On the other hand, the unit charge removal circuit unit 50U is also located within a range sandwiched between the charge removal wiring line 56 located at the innermost position and the set wiring lines 133 to 137 located at the outermost position. In other words, the unit charge removal circuit unit 50U is placed within a range in which the unit gate circuit unit 118U is placed in the longitudinal direction. Thus, the unit charge removal circuit units 50U do not protrude relative to the unit gate circuit units 118U, so that the layout efficiency of the unit gate circuit units 118U and the unit charge removal circuit units 50U is further improved.

As described above, according to the present embodiment, the non-display region NAA is provided with the charge removal wiring line 56 that extends along the second wiring line and is set to the common potential or the ground potential, the second wiring line is the first off-sequence drive wiring line (first drive wiring line) 53 that is connected to the driver 116 and receives the first drive signal from the driver 116 in response to execution of the power-off sequence, and the second circuit unit includes the source input terminal (second input section) 58 connected to the source wiring line 122 and the charge output terminal (second output section) 59 connected to the charge removal wiring line 56, and is a component of the charge removal circuit 50 that moves the charge of the pixel electrode 124 to the charge removal wiring line 56 via the source wiring line 122 in response to supply of the first drive signal from the first off-sequence drive wiring line 53. When the power-off sequence is executed, the first drive signal is supplied from the driver 116 to the second wiring line, which is the first off-sequence drive wiring line 53. Then, in the unit charge removal circuit unit 50U being the second circuit unit, which is a component of the charge removal circuit 50, the charge of the pixel electrode 124 is input to the source input terminal 58 via the source wiring line 122, and the input charge is output from the charge output terminal 59 to the charge removal wiring line 56. This allows the charge in the pixel electrode 124 to be moved to the charge removal wiring line 56.

Third Embodiment

A third embodiment will be described with reference to FIGS. 15 to 20. The third embodiment is different from the first embodiment in that a touch panel function is added to a liquid crystal panel 210, the first protection circuit 20 is omitted, a common potential supply circuit 60 is added, and the gate drive circuit is changed to a gate drive circuit 218 with a different circuit configuration. Further, repetitive descriptions of structures, actions, and effects similar to those of the first embodiment described above will be omitted.

Figure 15:
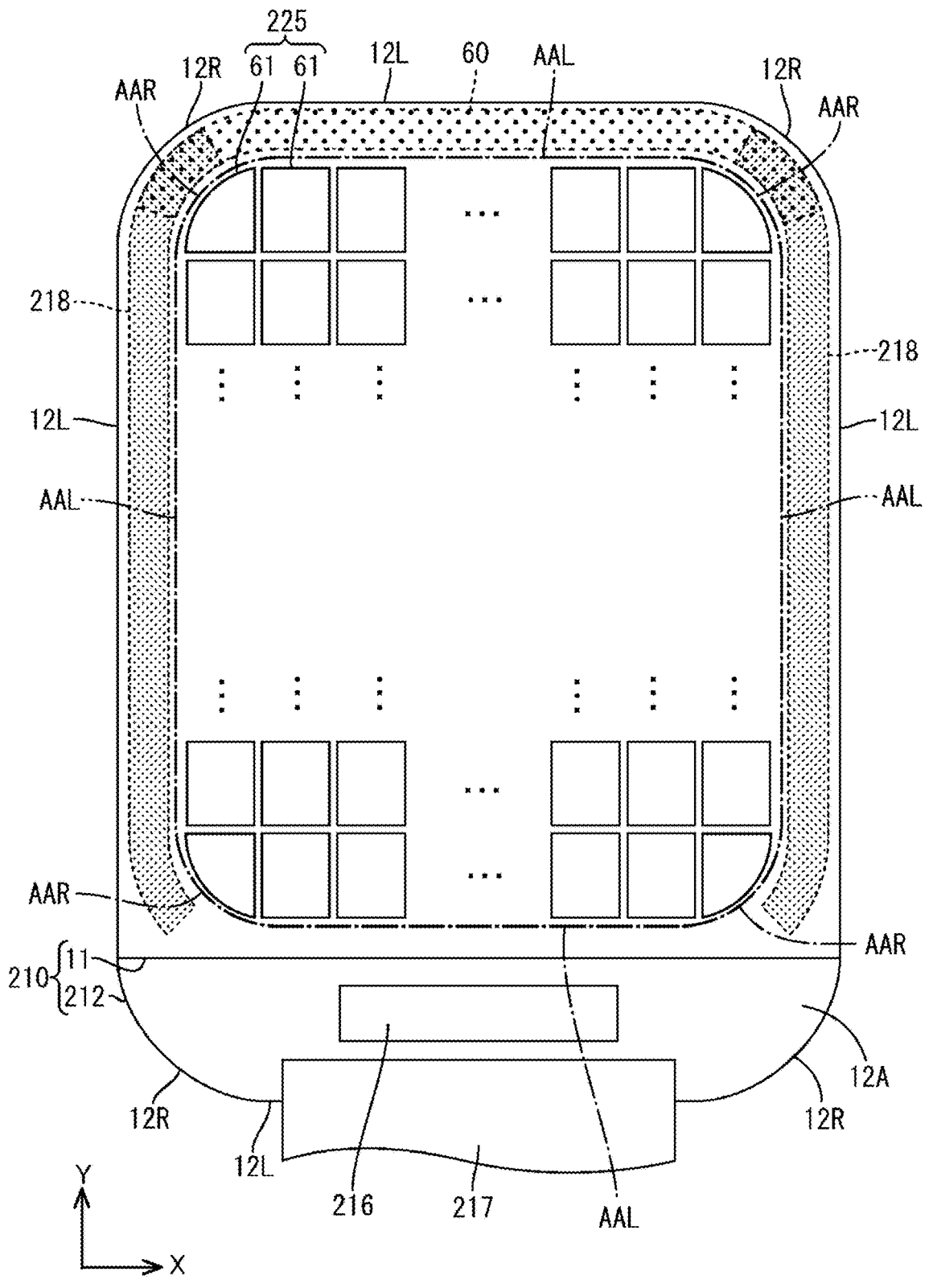
FIG. 15 is a plan view of a liquid crystal panel, a driver, and a flexible substrate according to a third embodiment.

As illustrated in FIG. 15, the liquid crystal panel 210 according to the present embodiment has, in addition to a display function for displaying an image, the touch panel function (position input function) for detecting a position of input by a user. In the liquid crystal panel 210, a touch panel pattern for exhibiting the touch panel function is integrated (in an in-cell form). The touch panel pattern is a so-called projected electrostatic capacitive type, and the detection type thereof is a self-capacitance type. The touch panel pattern is constituted of multiple touch electrodes (position detection electrodes) 61 arranged in a matrix on a main surface of the liquid crystal panel 210. The touch electrodes 61 are arranged in a display region AA of the liquid crystal panel 210. Thus, the display region AA of the liquid crystal panel 210 substantially matches a touch region (position input region) in which an input position can be detected, and a non-display region NAA substantially matches a non-touch region (non-position input region) in which an input position cannot be detected. When a user brings his or her finger (position input object), which is a conductor, close to a surface (display surface) of the liquid crystal panel 210 to input a position based on an image in the display region AA of the liquid crystal panel 210 that is viewed by the user, electrostatic capacitance is formed between the finger and the touch electrode 61. Thus, the electrostatic capacitance detected by the touch electrode 61 near the finger changes in response to approach of the finger, and becomes different from that of the touch electrode 61 farther away from the finger, making it possible to detect the input position based on this. Note that a specific number of touch electrodes 61 can be changed appropriately, in addition to the number of the touch electrodes 61 illustrated in FIG. 15. The touch electrode 61 has a substantially rectangular shape in a plan view, with each side measuring approximately several mm. Thus, the touch electrode 61 in a plan view is much larger than a pixel, which will be described later, in terms of size, and is placed in a range overlapping multiple pixels in both an X-axis direction and a Y-axis direction.

Figure 16:
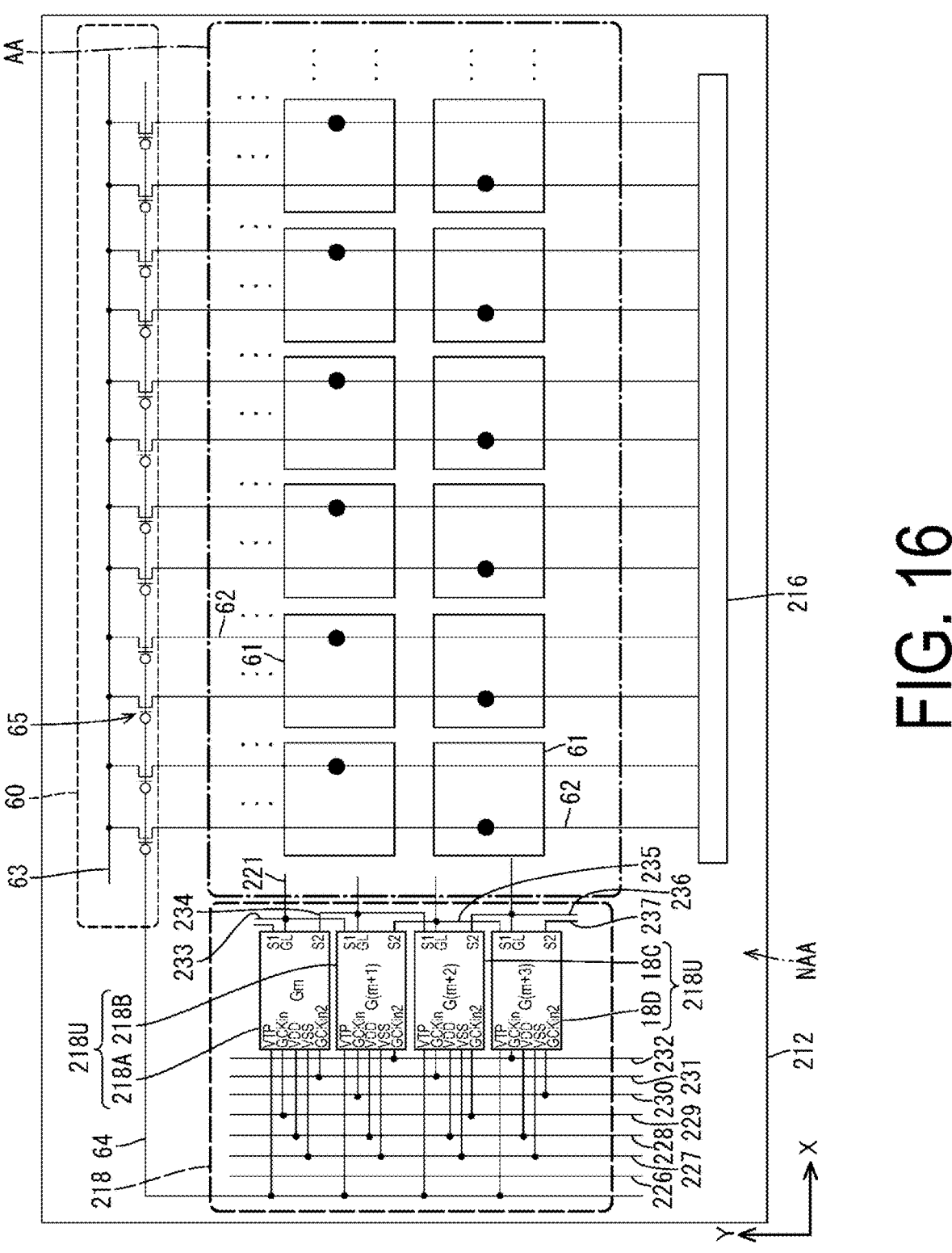
FIG. 16 is a circuit diagram illustrating an electrical configuration of the liquid crystal panel according to the third embodiment.

As illustrated in FIG. 16, multiple touch wiring lines (position detection wiring lines) 62 provided in the liquid crystal panel 210 are selectively connected to the multiple touch electrodes 61, respectively. The touch wiring line 62 extends substantially along the Y-axis direction with one end side connected to a driver 216 in the non-display region NAA and another end side connected to a specific touch electrode 61 among the multiple touch electrodes 61 aligned in the Y-axis direction in the display region AA. Furthermore, the touch wiring line 62 is connected to a detection circuit. The detection circuit may be provided in the driver 216, or may be provided outside of the liquid crystal panel 210 via a flexible substrate 217.

As illustrated in FIG. 16, the touch electrodes 61 and the touch wiring lines 62 are provided on an array substrate 212. Of these, the touch electrodes 61 are formed by dividing a common electrode 225 provided on the array substrate 212. To be specific, by providing lattice-shaped partition openings in the substantially solid common electrode 225 placed on the main surface of the array substrate 212, the multiple touch electrodes 61 arranged in a checkerboard pattern in the X-axis direction and the Y-axis direction are formed. A common potential signal related to the image display function and a touch signal (position detection signal) related to the touch panel function are supplied from the driver 216 to the touch wiring line 62 connected to the touch electrode 61 in a time-division manner. A timing when the common potential signal is supplied from the driver 216 to the touch wiring lines 62 is a display period, and a timing when the touch signal is supplied from the driver 216 to the touch wiring lines 62 is a sensing period (position detection period). This common potential signal is transmitted to all the touch wiring lines 62 at the same timing (display period). As a result, all the touch electrodes 61 become a reference potential based on the common potential signal and thus function as the common electrode 225. The touch electrode 61 has the touch panel function and also functions as the above-described common electrode 225. During the display period, as described in paragraph 0029, the pixel electrode 24 is charged with a potential based on an image signal (see FIG. 3), and during this display period, the touch electrodes 61 function as the common electrode 225.

As illustrated in FIG. 16, the array substrate 212 according to the present embodiment includes the common potential supply circuit 60 for supplying a common potential signal to the touch wiring lines 62. The common potential supply circuit 60 is located in the non-display region NAA at a position on a side opposite to a side of the driver 216 with respect to the display region AA in the Y-axis direction (upper side in FIG. 16). The common potential supply circuit 60 is provided in a horizontally long belt-shaped range of the non-display region NAA extending along a short side portion (X-axis direction). Planar shapes of the common potential supply circuit 60 at both end side portions in the length direction (X-axis direction) are curved along curved contours AAR of the display region AA. Both end side portions of the common potential supply circuit 60 in the length direction overlap end side portions of both gate drive circuits 218 in a length direction, in a plan view. A circuit configuration of the common potential supply circuit 60 will be described later.

As illustrated in FIG. 16, in the non-display region NAA of the array substrate 212, in addition to a gate start pulse wiring line 226, a low potential power source wiring line 227, a high potential power source wiring line 228, clock wiring lines 229 to 232, and set wiring lines 233 to 237, a common wiring line 63 and a common potential circuit drive wiring line (second drive wiring line) 64 are provided. Among these, the common wiring line 63 is routed so that one end side thereof is connected to the driver 216 or the flexible substrate 217 and another end side thereof is connected to the common potential supply circuit 60. The common potential circuit drive wiring line 64 is routed so that one end side thereof is connected to the driver 216 and another end side thereof is connected to the common potential supply circuit 60. The common potential circuit drive wiring line 64 has an intermediate portion located halfway between the one end side and the other end side thereof located across the gate drive circuit 218, and is connected to common input terminals VTP of multiple unit gate circuit units 218U.

Figure 17:
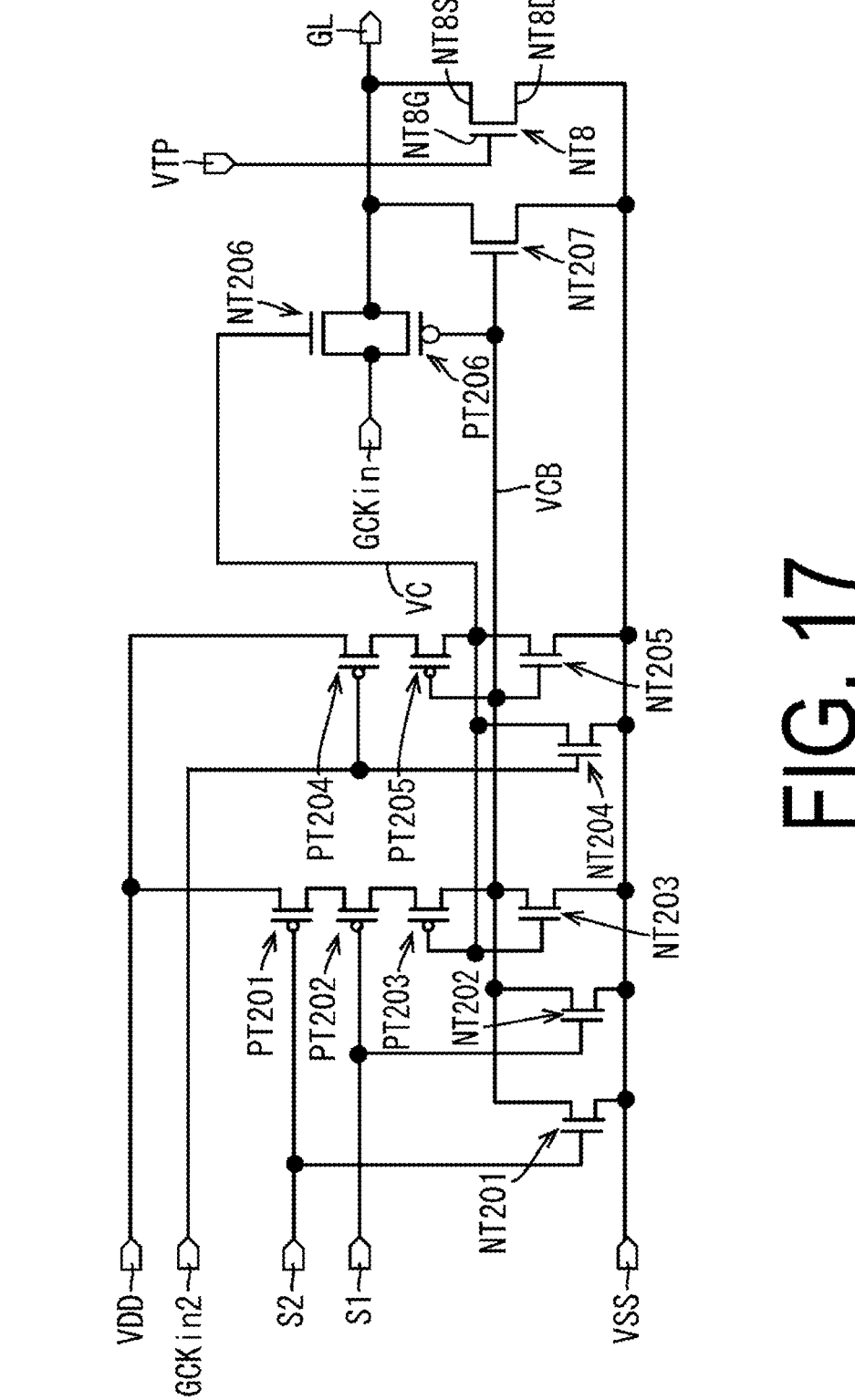
FIG. 17 is a circuit diagram illustrating a circuit configuration of a unit gate circuit unit, which is a component of a gate drive circuit provided in the liquid crystal panel according to the third embodiment.

As illustrated in FIG. 17, the unit gate circuit unit 218U includes, in addition to a first N-channel transistor NT201 to a seventh N-channel transistor NT207 and a first P-channel transistor PT201 to a sixth P-channel transistor PT206, an eighth negative transistor NT8. The eighth negative transistor NT8 includes a first gate electrode NT8G connected to the common input terminal VTP, a first source electrode NT8S connected to a gate output terminal GL, and a first drain electrode NT8D connected to a power supply voltage terminal VSS.

Figure 18:
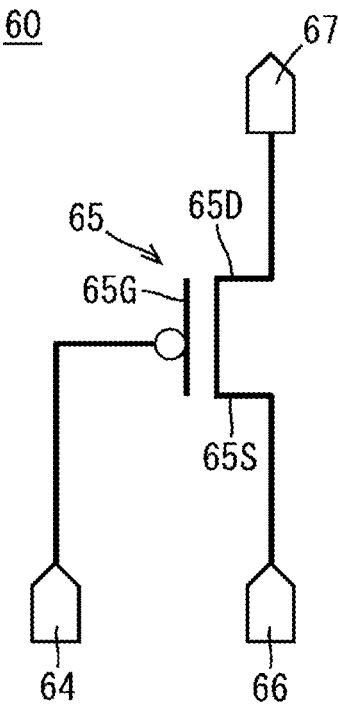
FIG. 18 is a circuit diagram illustrating a circuit configuration of a unit common potential supply circuit unit, which is a component of a common potential supply circuit according to the third embodiment.

As illustrated in FIGS. 16 and 18, the common potential supply circuit 60 includes multiple unit common potential supply circuit units (second circuit units) 60U arranged along a length direction thereof (substantially the X-axis direction). The number of the unit common potential supply circuit units 60U is equal to the number of the touch wiring lines 62. The unit common potential supply circuit unit 60U includes the above-described common potential circuit drive wiring line 64, the common wiring line 63, and a common TFT 65. The common wiring line 63 is connected to the driver 216 or the flexible substrate 217 and is always held at a common potential. The common TFT 65 is a P-channel transistor. The common TFT 65 includes a second gate electrode 65G connected to the common input terminal VTP, a second source electrode 65S connected to a common potential input terminal (third input section) 66, and a second drain electrode 65D connected to a common potential output terminal (third output section) 67. The common potential input terminal 66 is connected to the common wiring line 63. The common potential output terminal 67 is connected to the touch wiring line 62. The common TFT 65 is turned on in response to supply of a common drive signal (second drive signal) from the driver 216 to the common potential circuit drive wiring line 64. The common TFT 65 is a P-channel transistor, so the common drive signal is at a low potential.

Figure 19:
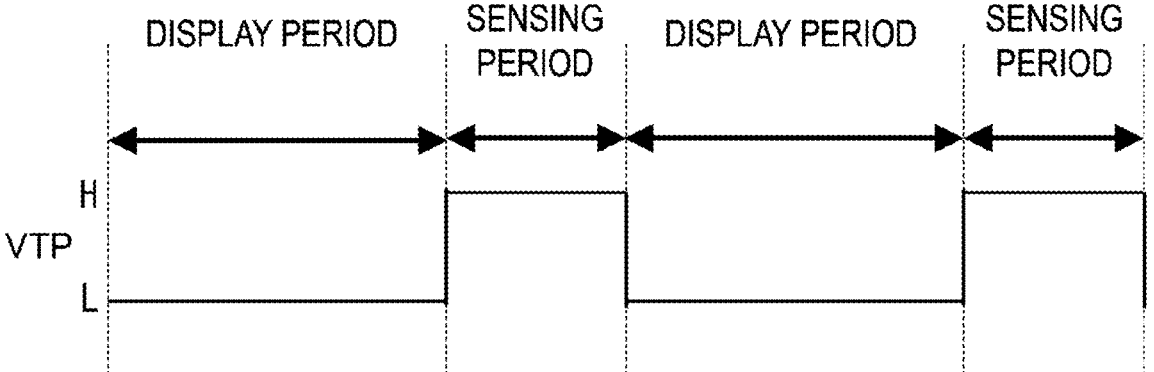
FIG. 19 is a timing chart for operation of the common potential supply circuit according to the third embodiment.

The operation of the common potential supply circuit 60 will now be described with reference to FIGS. 16 to 19. FIG. 19 is a timing chart for the operation of the common potential supply circuit 60. FIG. 19 illustrates the potential of the common input terminal VTP. A timing at which a common drive signal is supplied from the driver 216 to the common potential circuit drive wiring line 64 is synchronized with a timing at which a display period starts (a timing at which a sensing period switches to a display period), as illustrated in FIG. 19. That is, during the display period, the potential of the common input terminal VTP is set to a low potential. On the other hand, during the sensing period, the potential of the common input terminal VTP is set to a high potential. To be specific, during the display period, as illustrated in FIGS. 16 and 19, a common drive signal is supplied from the driver 216 to the common potential circuit drive wiring line 64, and the potential of the common input terminals VTP is set to a low potential, so that all the common TFTs 65 provided in the common potential supply circuit 60 are turned on. Then, the common potential of the common wiring line 63 is input from the common potential output terminals 67 connected to the second drain electrodes 65D of the common TFTs 65 to the common potential input terminals 66 connected to the second source electrodes 65S of the common TFTs 65, and the input common potential is output from the common potential output terminals 67 to the touch wiring lines 62. This allows all the touch electrodes 61 connected to the touch wiring lines 62 to be a common potential, reduces the potential difference between the touch electrodes 61, and suppresses lattice-like unevenness between the touch electrodes 61, thereby improving the display quality. During the display period, as illustrated in FIG. 17, the common input terminals VTP of all the unit gate circuit units 218U are at a low potential, so that the eighth negative transistors NT8 are turned off.

On the other hand, during the sensing period, as illustrated in FIGS. 16 and 19, the potential of the common input terminals VTP becomes a high potential, so that all the common TFTs 65 provided in the common potential supply circuit 60 are turned off. Therefore, during the sensing period, when a touch signal is supplied from the driver 216 to all the touch wiring lines 62, all the touch electrodes 61 become a potential based on the touch signal. By detecting the potentials of the touch electrodes 61, touch detection can be performed. During the sensing period, as illustrated in FIG. 17, the common input terminals VTP provided in all the unit gate circuit units 218U become a high potential, causing the eighth negative transistors NT8 to be turned on. Thus, all the gate output terminals GL become a low potential of the power supply voltage terminal VSS, so that all pixel TFTs 223 are turned off.

Figure 20:
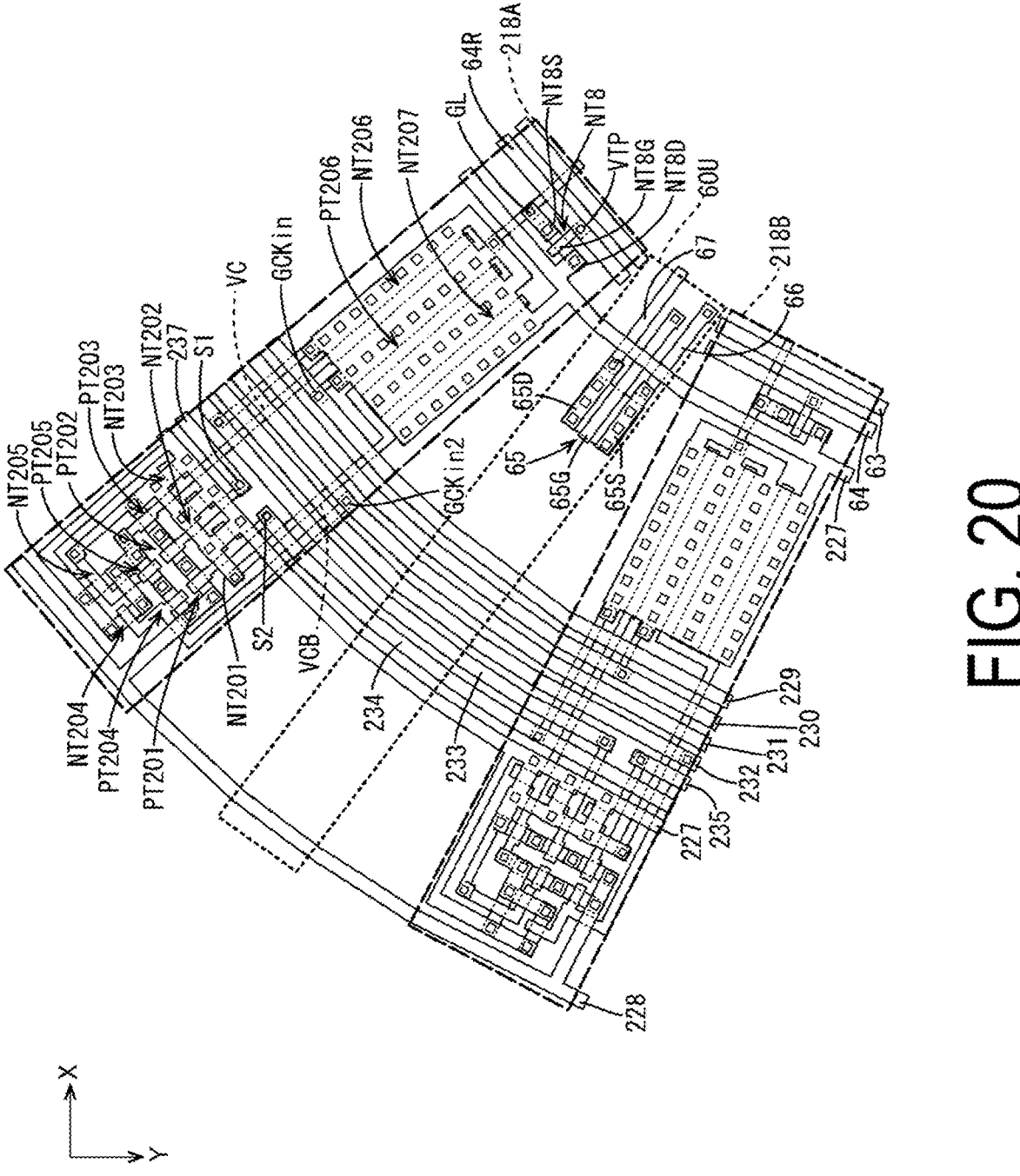
FIG. 20 is an enlarged plan view of the unit gate circuit units of the gate drive circuit and the unit common potential supply circuit unit of the common potential supply circuit according to the third embodiment.

As described above, as illustrated in FIG. 15, both end portions of the common potential supply circuit 60 in the length direction overlap end portions of both the gate drive circuits 218 in the length direction in a plan view. A configuration of an overlapping portion of the gate drive circuit 218 and the common potential supply circuit 60 will be described with reference to FIG. 20. FIG. 20 illustrates a first unit gate circuit unit 218A and a second unit gate circuit unit 218B as the unit gate circuit units 218U, which are components of the gate drive circuit 218, and one unit common potential supply circuit unit 60U, which is a component of the common potential supply circuit 60.

First, as illustrated in FIG. 20, the wiring lines 227 to 237, 63, and 64 connected to the gate drive circuit 218 and the common potential supply circuit 60 are all curved along the curved contour AAR in the overlapping portion of the common potential supply circuit 60 and the gate drive circuit 218. In particular, the common potential circuit drive wiring line 64 includes a curved portion 64R that is curved so as to intersect both the Y-axis direction and the X-axis direction. The unit gate circuit unit 218U and the unit common potential supply circuit unit 60U are both elongated in a direction intersecting the curved portion 64R in a plan view. The unit gate circuit unit 218U and the unit common potential supply circuit unit 60U are located side by side along the curved portion 64R described above. To be specific, the unit gate circuit units 218U and the unit common potential supply circuit units 60U are located alternately and repeatedly one by one along the curved portion 64R in the overlapping portion of the common potential supply circuit 60 and the gate drive circuit 218. Two unit gate circuit units 218U are arranged side by side with a space in the direction along the curved portion 64R, and one unit common potential supply circuit unit 60U is interposed between the two unit gate circuit units 218U. Conversely, two unit common potential supply circuit units 60U are arranged side by side with a space in the direction along the curved portion 64R, and one unit gate circuit unit 218U is interposed between the two unit common potential supply circuit units 60U. Note that the unit gate circuit unit 218U is connected to the gate wiring line 221, the low potential power source wiring line 227, the high potential power source wiring line 228, and the like, and is a component of the gate drive circuit 218, while the unit common potential supply circuit unit 60U is connected to the touch wiring line 62, the common wiring line 63, and the common potential circuit drive wiring line 64, but not connected to the gate wiring line 221, and is a component of the common potential supply circuit 60. Therefore, the unit gate circuit unit 218U and the unit common potential supply circuit unit 60U are functionally different circuit units.

Thus, in the non-display region NAA, the unit common potential supply circuit unit 60U is located adjacent to the unit gate circuit unit 218U, which is a different circuit unit, along the common potential circuit drive wiring line 64, as illustrated in FIG. 20. Therefore, compared to a case where the unit charge removal circuit is located adjacent to the unit gate circuit unit 218U along a direction intersecting the common potential circuit drive wiring line 64, an arrangement space in the direction intersecting the common potential circuit drive wiring line 64 can be reduced. This improves layout efficiency of the unit gate circuit units 218U and the unit common potential supply circuit units 60U in the non-display region NAA, thereby enabling the frame of the array substrate 212 to be narrowed. In particular, in the present embodiment, the unit common potential supply circuit unit 60U is adjacent to the unit gate circuit unit 218U along the curved portion 64R, and is located between two unit gate circuit units 218U. A distance between the two unit gate circuit units 218U in the direction along the curved portion 64R is wider than a distance between the two unit gate circuit units 218U in the Y-axis direction (first direction). Therefore, a sufficient space can be secured for the unit common potential supply circuit unit 60U located between the two unit gate circuit units 218U. As described above, the unit common potential supply circuit units 60U can be located adjacent to the unit gate circuit units 218U that constitute the gate drive circuit 218. This allows the unit common potential supply circuit units 60U to be provided together with the unit gate circuit units 218U without increasing an arrangement space for the gate drive circuit 218.

A specific configuration of the overlapping portion of the gate drive circuit 218 and the common potential supply circuit 60 will be described. In the overlapping portion of the gate drive circuit 218 and the common potential supply circuit 60, as illustrated in FIG. 20, one common wiring line 63 is located at a position closest to the display region AA (the innermost position), and the common potential circuit drive wiring line 64 is located at a position spaced apart on the outer side of the common wiring line 63. The low potential power source wiring line 227 is located at a position spaced a predetermined distance from the common potential circuit drive wiring line 64. The eighth N-channel transistor NT8 is placed to be interposed between the common potential circuit drive wiring line 64 and the low potential power source wiring line 227. The common TFT 65, which is a component of the unit common potential supply circuit unit 60U, is located to be interposed between the low potential power source wiring line 227 adjacent to the common potential circuit drive wiring line 64 and a wiring line group consisting of the clock wiring lines 229 to 232, the set wiring lines 233 to 237, and the low potential power source wiring line 227. That is, the sixth N-channel transistor NT206, the seventh N-channel transistor NT207, and the sixth P-channel transistor PT206, which are components of the unit gate circuit unit 218U, and the common TFT 65, which is a component of the unit common potential supply circuit unit 60U, are located adjacent to each other along the curved portion 64R and are positioned at substantially the same distance from the display region AA. Note that in the insulating films 48 and 49 (see FIG. 7), contact holes are formed at the connection points between the component formed of the first metal film and the component formed of the second metal film, and at the connection points between the component formed of the second metal film and the component formed of the semiconductor film.

As illustrated in FIG. 20, the first gate electrode NT8G of the eighth negative transistor NT8, which is a component of the unit gate circuit unit 218U, is directly connected to the common input terminal VTP formed of the first metal film. The common input terminal VTP extends from the first gate electrode NT8G of the eighth negative transistor NT8 toward the outer side and is connected to the common potential circuit drive wiring line 64. The first source electrode NT8S of the eighth negative transistor NT8 is directly connected to a portion of the gate output terminal GL formed of the second metal film. The portion of the gate output terminal GL formed of the second metal film extends toward the opposite side of a first semiconductor portion of the eighth negative transistor NT8 and is connected to a portion of the gate output terminal GL formed of the first metal film. The first drain electrode NT8D of the eighth negative transistor NT8 is directly connected to the power supply voltage terminal VSS formed of the second metal film. The power supply voltage terminal VSS is connected to the adjacent low potential power source wiring line 227.

As illustrated in FIG. 20, the second gate electrode 65G of the common TFT 65, which is a component of the unit common potential supply circuit unit 60U, is directly connected to the common input terminal VTP formed of the first metal film. The common input terminal VTP extends from the second gate electrode 65G of the common TFT 65 toward the inner side, is located across the low potential power source wiring line 227, and is connected at an end portion thereof to the common potential circuit drive wiring line 64. The second source electrode 65S of the common TFT 65 is connected to the common potential input terminal 66 formed of the first metal film. The common potential input terminal 66 extends from the connection point with the second source electrode 65S of the common TFT 65 toward the inner side, and is connected to the common wiring line 63 across the wiring lines 64 and 227. The second drain electrode 65D of the common TFT 65 is connected to the common potential output terminal 67 formed of the first metal film. The common potential output terminal 67 extends toward the inner side from the connection point with the second drain electrode 65D of the common TFT 65 and is connected to the touch wiring line 62 in the display region AA across the wiring lines 63, 64, and 227.

As described above, according to the present embodiment, the display region AA is provided with the touch electrodes (position detection electrodes) 61 and the touch wiring lines (position detection wiring lines) 62 connected to the touch electrodes 61 and the driver 216 and supplied with position detection signals from the driver 216 during the position detection period in which position detection is performed by the touch electrodes 61, and the non-display region NAA is provided with the common wiring line 63 that extends along the second wiring line and is at a common potential, the second wiring line is the common potential circuit drive wiring line (second drive wiring line) 64 that is connected to the driver 216 and to which a common drive signal (second drive signal) is supplied from the driver 216 during a display period in which an image is displayed, and the second circuit unit includes the common potential output terminal (third output section) 67 connected to the touch wiring line 62 and the common potential input terminal (third input section) 66 connected to the common wiring line 63 and constitutes the common potential supply circuit 60 that supplies a common potential to the touch electrode 61 via the touch wiring line 62 in response to supply of a common drive signal from the common potential circuit drive wiring line 64. During the position detection period, a position detection signal is supplied from the driver 216 to the touch wiring line 62, so that position detection can be performed based on the potential of the touch electrode 61. On the other hand, during the display period, a common drive signal is supplied from the driver 216 to the common potential circuit drive wiring line 64, which is the second wiring line. Then, in the unit common potential supply circuit units 60U being the second circuit unit, which is a component of the common potential supply circuit 60, a common potential is input from the common wiring line 63 to the common potential input terminals 66, and the input common potential is output from the common potential output terminals 67 to the touch wiring lines 62. This allows the touch electrodes 61 connected to the touch wiring lines 62 to be at a common potential.

In the non-display region NAA, the low potential power source wiring line (low potential wiring line) 227 is provided, which is connected to the driver 216 and receives a low potential signal from the driver 216, the unit gate circuit unit 218U includes the eighth negative transistor (N-channel transistor) NT8, the common potential supply circuit 60 includes the common TFTs 65, which are P-channel transistors, the eighth negative transistor NT8 includes the first gate electrode NT8G connected to the common potential circuit drive wiring line 64, which is the second wiring line, the first source electrode NT8S connected to the low potential power source wiring line 227, and the first drain electrode NT8D connected to the gate wiring line 221, and the common TFT 65, which is a P-channel transistor, includes the second gate electrode 65G connected to the common potential circuit drive wiring line 64, which is the second wiring line, the second source electrode 65S connected to the common wiring line 63, and the second drain electrode 65D connected to the touch wiring line 62. During the display period, a low potential signal is supplied as a common drive signal from the driver 216 to the common potential circuit drive wiring line 64, which is the second wiring line. Then, the eighth negative transistor NT8 of the unit gate circuit unit 218U is turned off, preventing the low potential of the low potential power source wiring line 227 from being supplied to the gate wiring line 221. In contrast, the common TFTs 65, which are P-channel transistors, of the common potential supply circuit 60 are turned on, so that the common potential of the common wiring line 63 is supplied to the touch electrodes 61 via the touch wiring lines 62. On the other hand, during the position detection period, a high potential signal is supplied from the driver 216 to the common potential circuit drive wiring line 64, which is the second wiring line. Then, the eighth negative transistor NT8 of the unit gate circuit unit 218U is turned on, and the low potential of the low potential power source wiring line 227 is supplied to the gate wiring line 221. This makes it difficult for the pixel TFTs 223 in the display region AA to be turned on during the position detection period. In contrast, the common TFTs 65, which are P-channel transistors, of the common potential supply circuit 60 are turned off, preventing the common potential of the common wiring line 63 from being supplied to the touch wiring lines 62.

Fourth Embodiment

A fourth embodiment will be described with reference to FIG. 21 to FIG. 23. The fourth embodiment is a combination of the configuration described in the second embodiment and the configuration described in the third embodiment. Note that redundant descriptions of structures, actions, and effects similar to those of the second and third embodiments described above will be omitted.

Figure 21:
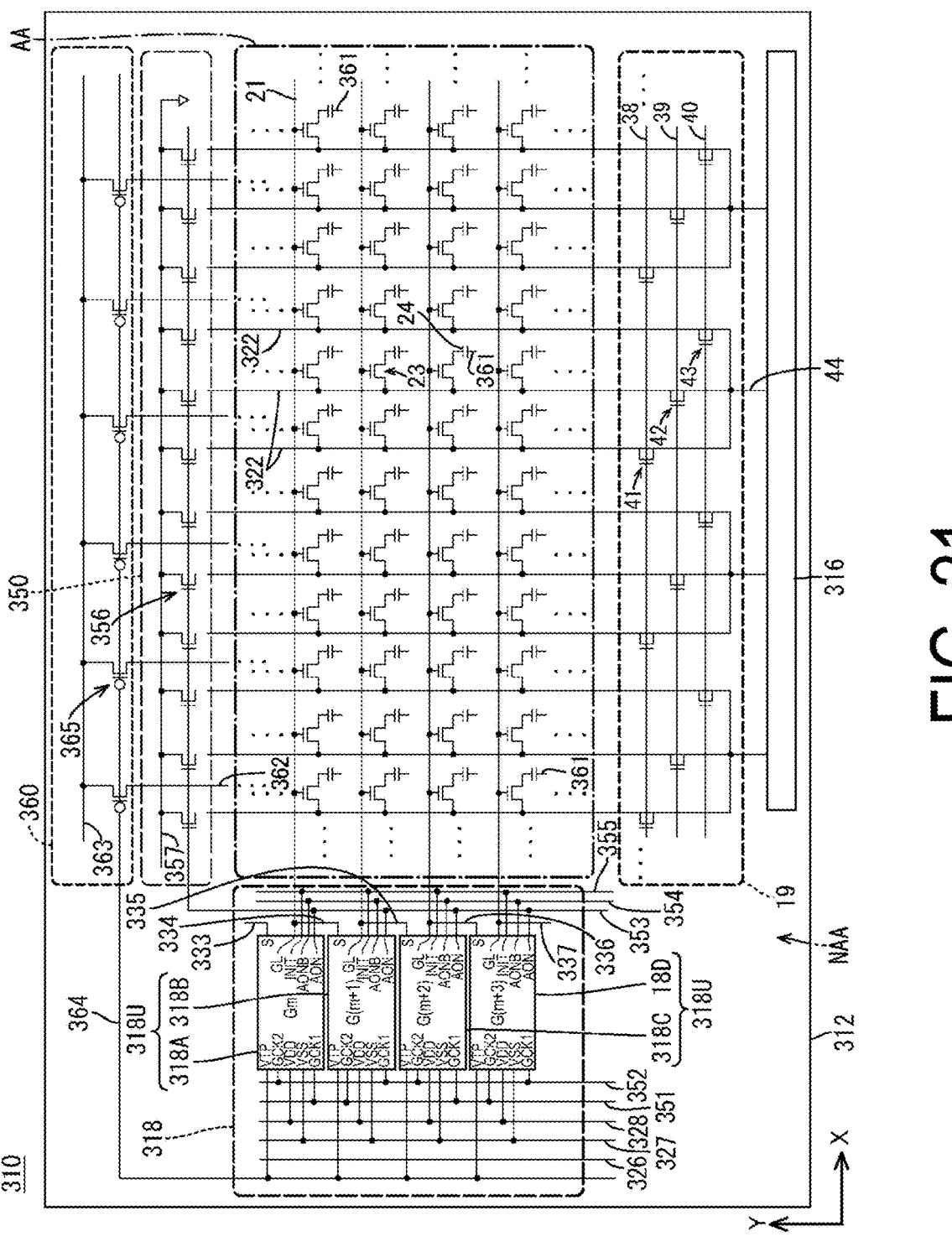
FIG. 21 is a circuit diagram illustrating an electrical configuration of a liquid crystal panel according to a fourth embodiment.

As illustrated in FIG. 21, a liquid crystal panel 310 according to the present embodiment has a touch panel function, and includes touch electrodes 361 and touch wiring lines 362 for exhibiting the touch panel function. Configurations of the touch electrodes 361 and the touch wiring lines 362 are as described in the third embodiment. An array substrate 312, which is a component of the liquid crystal panel 310, is provided with a charge removal circuit 350 and a common potential supply circuit 360. The charge removal circuit 350 and the common potential supply circuit 360 are located in a non-display region NAA at a position on a side opposite to a side of a driver 316 with respect to a display region AA in a Y-axis direction (upper side in FIG. 21). The charge removal circuit 350 and the common potential supply circuit 360 are provided in a horizontally long belt-shaped range of the non-display region NAA extending along a short side portion (X-axis direction). Planar shapes of the charge removal circuit 350 and the common potential supply circuit 360 at both end side portions in a length direction (X-axis direction) are curved along curved contours AAR of the display region AA. The charge removal circuit 350 and the common potential supply circuit 360 are positioned such that formation ranges of the charge removal circuit 350 and the common potential supply circuit 360 overlap each other over substantially the entire region in a plan view. Both end side portions of the charge removal circuit 350 and the common potential supply circuit 360 in the length direction overlap end side portions of both gate drive circuits 318 in a length direction in a plan view.

As illustrated in FIG. 21, in the non-display region NAA of the array substrate 312, in addition to a gate start pulse wiring line 326, a low potential power source wiring line 327, a high potential power source wiring line 328, set wiring lines 333 to 337, clock wiring lines 351 and 352, off-sequence drive wiring lines 353 and 354, an on-sequence drive wiring line 355, and a charge removal wiring line 356, a common wiring line 363 and a common potential circuit drive wiring line 364 are provided.

Figure 22:
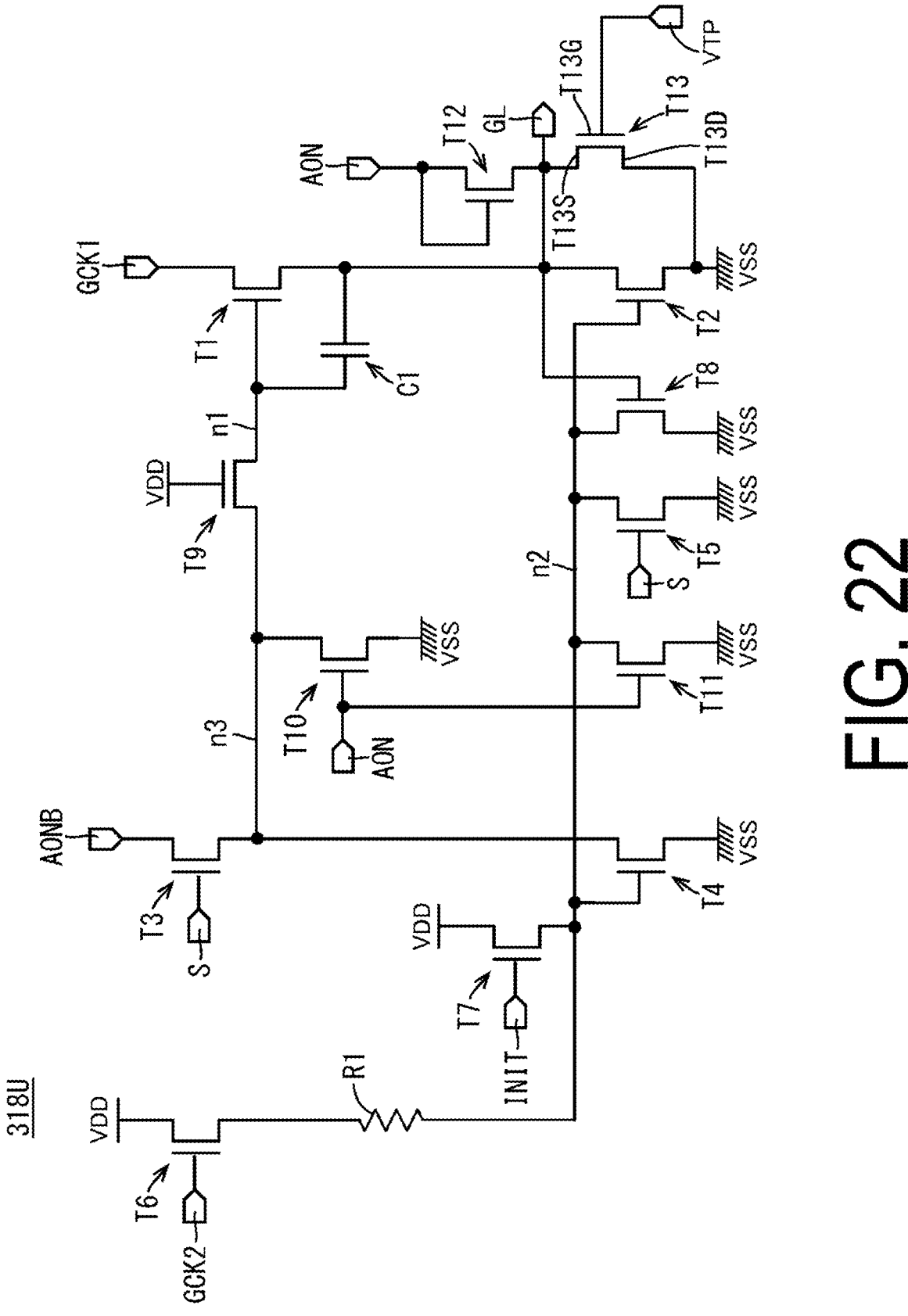
FIG. 22 is a circuit diagram illustrating a circuit configuration of a unit gate circuit unit, which is a component of a gate drive circuit of the liquid crystal panel according to the fourth embodiment.

As illustrated in FIG. 22, a unit gate circuit unit 318U includes, in addition to a first transistor T1 to a 12th transistor T12, a 13th transistor T13. The 13th transistor T13 is a negative transistor, and has a similar configuration to the eighth negative transistor NT8 described in the third embodiment (see FIG. 17). The 13th transistor T13 includes a first gate electrode T13G connected to a common input terminal VTP, a first source electrode T13S connected to a gate output terminal GL, and a first drain electrode T13D connected to a power supply voltage terminal VSS. Note that operation of the 13th transistor T13 is similar to the operation of the eighth negative transistor NT8 described in the third embodiment.

As described above, both the end side portions of the charge removal circuit 350 and the common potential supply circuit 360 in the length direction overlap the end side portions of both the gate drive circuits 318 in the length direction in a plan view. A configuration of the overlapping portion of the gate drive circuit 318 and both the charge removal circuit 350 and the common potential supply circuit 360 will be described. FIG. 23 illustrates a first unit gate circuit unit 318A, a second unit gate circuit unit 318B, and a third unit gate circuit unit 318C as the unit gate circuit units 318U, which are components of the gate drive circuit 318, two unit charge removal circuit units 350U, which are components of the charge removal circuit 350, and one unit common potential supply circuit unit 360U, which is a component of the common potential supply circuit 360.

Figure 23:
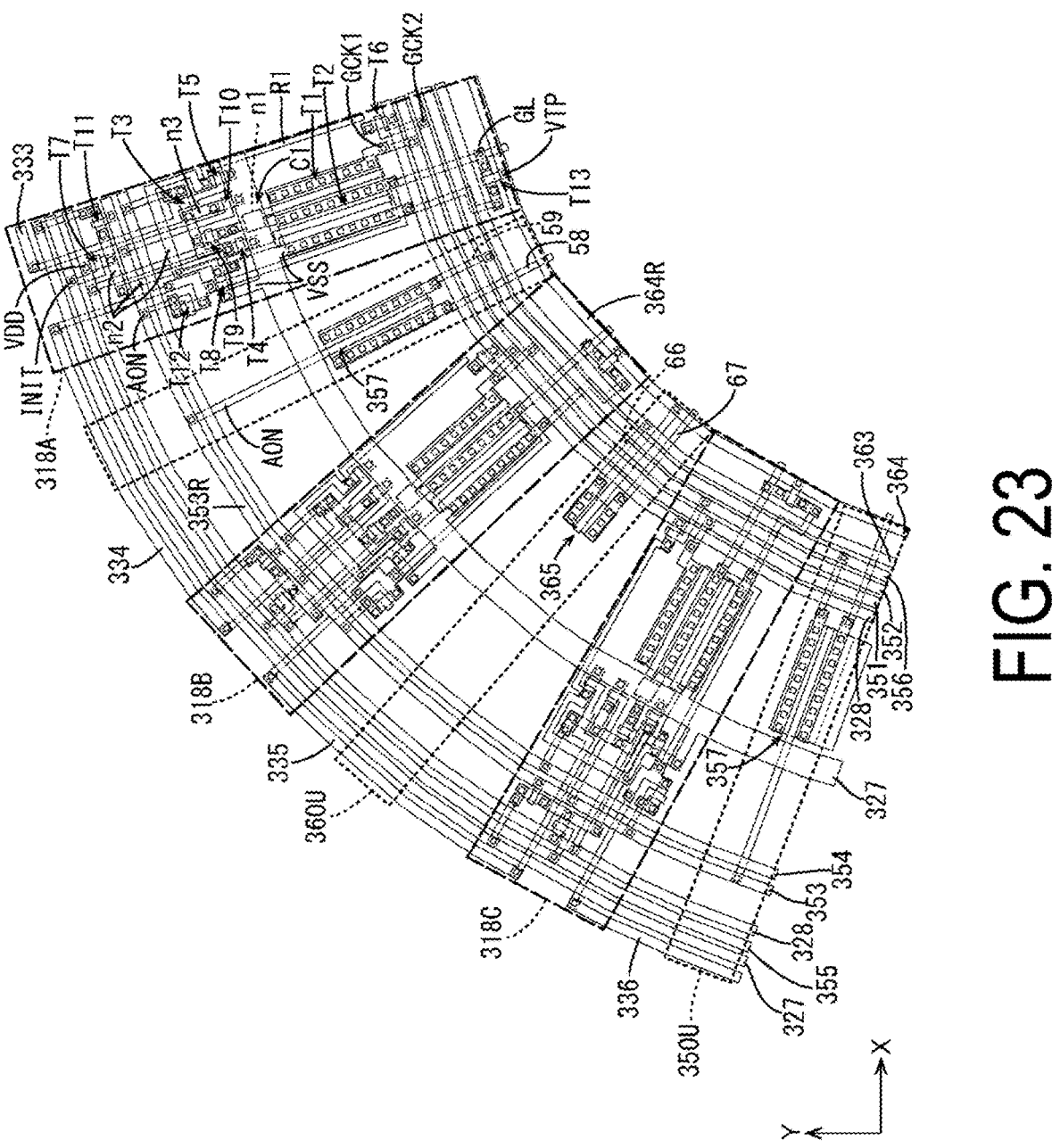
FIG. 23 is an enlarged plan view of the unit gate circuit units of the gate drive circuit, unit charge removal circuit units of a charge removal circuit, and a unit common potential supply circuit unit of a common potential supply circuit according to the fourth embodiment.

First, as illustrated in FIG. 23, the wiring lines 327, 328, 333 to 337, 351, 352, 353, 354, 355, 356, 363, and 364 connected to the gate drive circuit 318, the charge removal circuit 350, and the common potential supply circuit 360 are all curved along the curved contour AAR in the overlapping portion of both the charge removal circuit 350 and the common potential supply circuit 360 and the gate drive circuit 318. In particular, the first off-sequence drive wiring line 353 and the common potential circuit drive wiring line 364 include curved portions 353R and 364R that are curved so as to intersect both the Y-axis direction and the X-axis direction. The unit gate circuit unit 318U, the unit charge removal circuit unit 350U, and the unit common potential supply circuit unit 360U are all elongated in a direction intersecting the curved portions 353R and 364R in a plan view. The unit gate circuit unit 318U and the unit charge removal circuit unit 350U and the unit common potential supply circuit unit 360U are located side by side along the curved portions 353R and 364R described above. To be specific, the unit gate circuit unit 318U, the unit charge removal circuit unit 350U, and the unit common potential supply circuit unit 360U are located alternately and repeatedly one by one along the curved portions 353R and 364R in the overlapping portion of the charge removal circuit 350 and the common potential supply circuit 360 and the gate drive circuit 318. Three unit gate circuit units 318U are arranged side by side with spaces in the direction along the curved portions 353R and 364R, with one unit charge removal circuit unit 350U interposed between the first and second unit gate circuit units 318U, and one unit common potential supply circuit unit 360U interposed between the second and third unit gate circuit units 318U.

Thus, in the non-display region NAA, the unit charge removal circuit unit 350U and the unit common potential supply circuit unit 360U are located adjacent to the unit gate circuit units 318U, which are different circuit units, along the first off-sequence drive wiring line 353 and the common potential circuit drive wiring line 364, as illustrated in FIG. 23. Therefore. compared to a case where the unit charge removal circuit unit and the unit common potential supply circuit unit are located adjacent to the unit gate circuit units 318U along a direction intersecting the first off-sequence drive wiring line 353 and the common potential circuit drive wiring line 364, an arrangement space in the direction intersecting the first off-sequence drive wiring line 353 and the common potential circuit drive wiring line 364 can be reduced. This improves layout efficiency of the unit gate circuit units 318U, the unit charge removal circuit units 350U, and the unit common potential supply circuit units 360U in the non-display region NAA, thereby enabling the frame of the array substrate 312 to be narrowed. In particular, in the present embodiment, the unit charge removal circuit unit 350U and the unit common potential supply circuit unit 360U are adjacent to the unit gate circuit units 318U along the curved portions 353R and 364R, and are respectively positioned between two different unit gate circuit units 318U. A distance between the two unit gate circuit units 318U in the direction along the curved portions 353R and 364R is wider than a distance between the two unit gate circuit units 318U in the Y-axis direction (first direction). Therefore, sufficient spaces can be secured for the unit charge removal circuit unit 350U and the unit common potential supply circuit unit 360U respectively located between the two different unit gate circuit units 318U. As described above, the unit charge removal circuit units 350U and the unit common potential supply circuit units 360U can be located adjacent to the unit gate circuit units 318U that constitute the gate drive circuit 318. This allows the unit charge removal circuit units 350U and the unit common potential supply circuit units 360U to be provided together with the unit gate circuit units 318U without increasing an arrangement space for the gate drive circuit 318. The first off-sequence drive signal and the common potential circuit drive signal supply potentials to the gate circuit 318, the charge removal circuit 350, and the common potential supply circuit 360 from the common wiring lines. When the charge removal circuit 350 or the common potential supply circuit 360 is located adjacent to the unit gate circuit unit 318U along the direction intersecting the first off-sequence drive wiring line 353 and the common potential circuit drive wiring line 364, the first off-sequence drive wiring line 353 needs to be located separately in both the charge removal circuit 350 and the unit gate circuit unit 318U, and the common potential circuit drive wiring line 364 needs to be located separately in both the common potential supply circuit 360 and the unit gate circuit unit 318U. However, in the present embodiment, these wiring lines are used in common, which is advantageous for further narrowing the frame.

A specific configuration of the overlapping portion of the gate drive circuit 318 and the charge removal circuit 350 and the common potential supply circuit 360 will be described. In the overlapping portion of the gate drive circuit 318 and both the charge removal circuit 350 and the common potential supply circuit 360, as illustrated in FIG. 23, one common potential circuit drive wiring line 364 is located at a position closest to the display region AA (the innermost position), and the common wiring line 363 is located at a position spaced apart on the outer side of the common potential circuit drive wiring line 364. The charge removal wiring line 356 is located at a position spaced a predetermined distance from the common wiring line 363. The 13th transistor T13 is placed to be interposed between the common potential circuit drive wiring line 364 and the common wiring line 363. Between the high potential power source wiring line 328 located on the outer side among the wiring lines 328, 351, 352, 356, and 363, and the wide low potential power source wiring line 327, a charge removal TFT 357, which is a component of the unit charge removal circuit unit 350U, and a common TFT 365, which is a component of the unit common potential supply circuit unit 360U, are located to be interposed. That is, the first transistor T1 and the second transistor T2, which are components of the unit gate circuit unit 318U, the charge removal TFT 357, which is a component of the unit charge removal circuit unit 350U, and the common TFT 365, which is a component of the unit common potential supply circuit unit 360U, are located adjacent each other along the curved portions 353R and 364R and are positioned at substantially the same distance from the display region AA.

Fifth Embodiment

A fifth embodiment will be described with reference to FIGS. 24 to 28. The fifth embodiment is different from the first embodiment in that the liquid crystal panel is changed to a liquid crystal panel 410 with a different outer shape, the first protection circuit 20 is omitted, and an inspection circuit 70 and a second protection circuit 80 are added. Further, repetitive descriptions of structures, actions, and effects similar to those of the first embodiment described above will be omitted.

Figure 24:
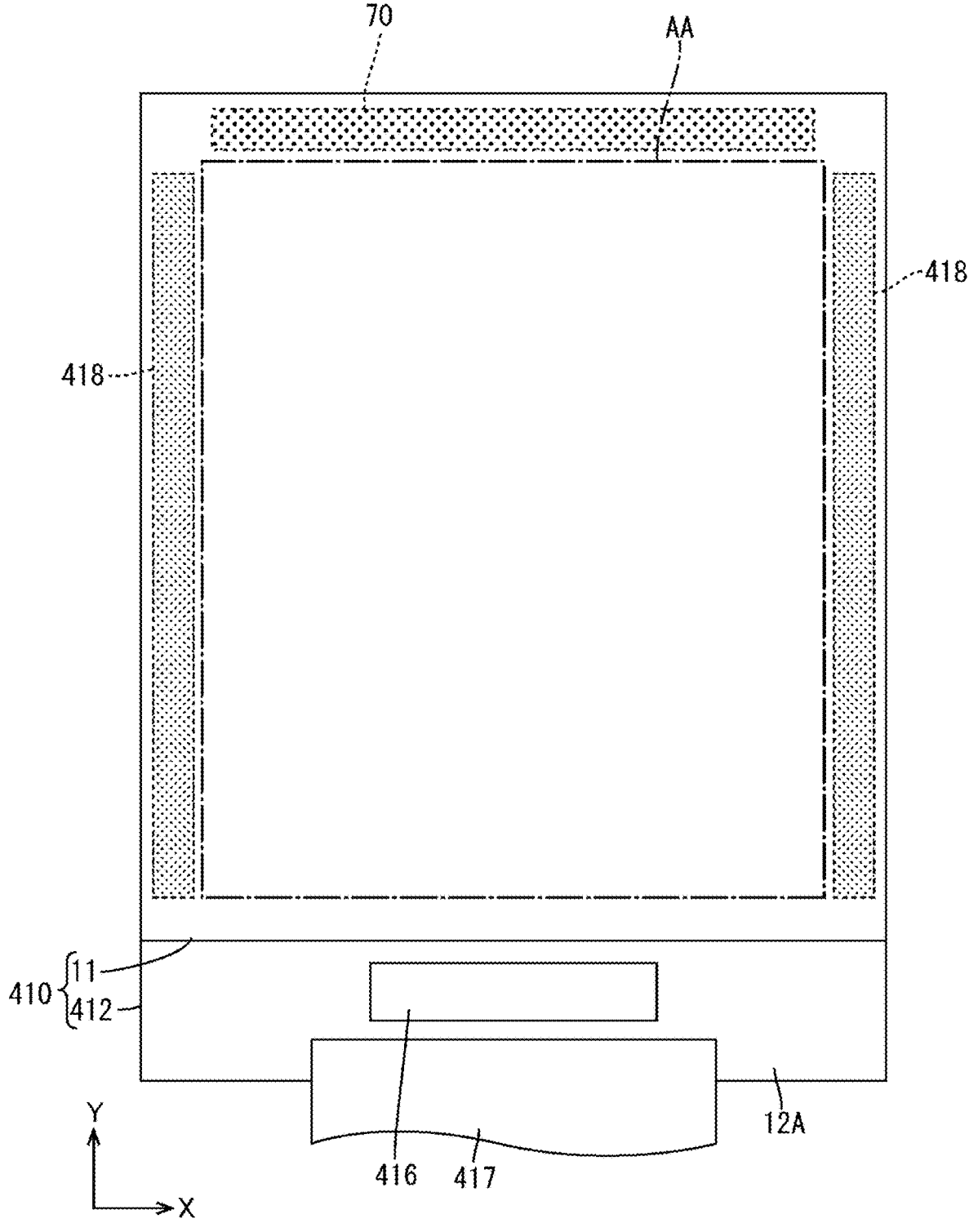
FIG. 24 is a plan view of a liquid crystal panel, a driver, and a flexible substrate according to a fifth embodiment.
Figure 25:
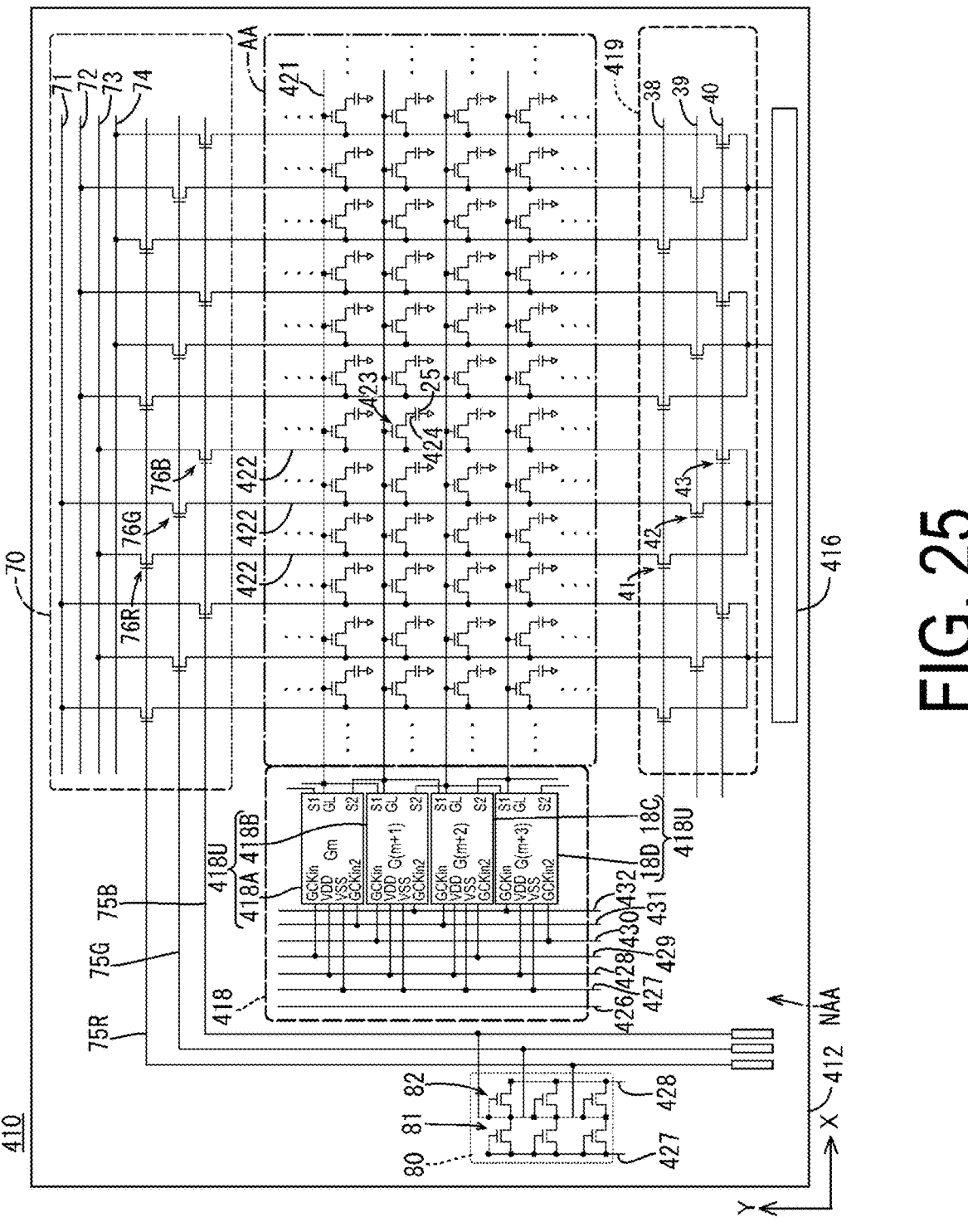
FIG. 25 is a circuit diagram illustrating an electrical configuration of the liquid crystal panel according to the fifth embodiment.

As illustrated in FIG. 24, the liquid crystal panel 410 according to the present embodiment has a vertically long rectangular shape, and four corners thereof are not rounded. Accordingly, a display region AA has a vertically long rectangular shape with no rounded corners. Gate drive circuits 418 are provided in vertically long belt-shaped ranges extending along long side portions (Y-axis direction) of a non-display region NAA, and do not have curved portions as in the first embodiment. As illustrated in FIG. 25, the liquid crystal panel 410 is provided with the inspection circuit 70 for inspecting source wiring lines 422 and pixel TFTs 423, and the second protection circuit 80 for protecting the inspection circuit 70 from electrostatic discharge. The inspection circuit 70 is located in the non-display region NAA at a position on the opposite side to a side of a driver

416 and a switch circuit 419 with respect to the display region AA in the Y-axis direction (upper side in FIGS. 24 and 25). The inspection circuit 70 is provided in a horizontally long belt-shaped range of the non-display region NAA extending along a short side portion (X-axis direction), and is located so as not to overlap the gate drive circuits 418. On the other hand, the second protection circuit 80 is positioned in a long side portion of the non-display region NAA and is located to overlap a range where the gate drive circuit 418 exists.

As illustrated in FIG. 25, in the non-display region NAA of an array substrate 412, in addition to a gate start pulse wiring line 426, a low potential power source wiring line 427, a high potential power source wiring line 428, and set wiring lines 433 to 437, four inspection image wiring lines 71 to 74 and three inspection drive wiring lines (inspection wiring lines) 75R, 75G, and 75B are provided. The four inspection image wiring lines 71 to 74 are a first inspection image wiring line 71, a second inspection image wiring line 72, a third inspection image wiring line 73, and a fourth inspection image wiring line 74, each of which transmits an image signal for inspection. The three inspection drive wiring lines 75R, 75G, and 75B are a red inspection drive wiring line 75R, a green inspection drive wiring line 75G, and a blue inspection drive wiring line 75B, each of which transmits a scanning signal for inspection. The inspection image wiring lines 71 to 74 and the inspection drive wiring lines 75R, 75G, and 75B are routed so as to horizontally cross the entire length of the inspection circuit 70 and to longitudinally cross a region outside the gate drive circuit 418 (a side opposite to a side of the display region AA). End portions of the inspection image wiring lines 71 to 74 and the inspection drive wiring lines 75R, 75G, and 75B are connected to inspection terminal portions provided at an end portion of the array substrate 412 on a side connected to a flexible substrate 417. An inspection device is connected to the inspection terminal portions, and scanning signals for inspection or image signals for inspection can be input from the inspection device.

Next, the inspection circuit 70 will be described. As illustrated in FIG. 25, the inspection circuit 70 includes the inspection image wiring lines 71 to 74, the inspection drive wiring lines 75R, 75G, and 75B, and inspection TFTs 76R, 76G, and 76B. The inspection TFTs 76R, 76G, and 76B are three types of a red inspection TFT 76R connected to a source wiring line 422 for a red pixel, a green inspection TFT 76G connected to a source wiring line 422 for a green pixel, and a blue inspection TFT 76B connected to a source wiring line 422 for a blue pixel. The three types of inspection TFTs 76R, 76G, and 76B are all N-channel transistors. The source electrodes of the inspection TFTs 76R, 76G, and 76B are all connected to any one of the inspection image wiring lines 71 to 74. The red inspection TFT 76R includes a gate electrode connected to the red inspection drive wiring line 75R, and a drain electrode connected to the source wiring line 422 that supplies an image signal to a pixel electrode 424, which is a component of a red pixel. The green inspection TFT 76G includes a gate electrode connected to the green inspection drive wiring line 75G, and a drain electrode connected to the source wiring line 422 that supplies an image signal to a pixel electrode 424, which is a component of a green pixel. The blue inspection TFT 76B includes a gate electrode connected to the blue inspection drive wiring line 75B, and a drain electrode connected to the source wiring line 422 that supplies an image signal to a pixel electrode 424, which is a component of a blue pixel.

A connection manner of the inspection image wiring lines 71 to 74 to the inspection TFTs 76R, 76G, and 76B will be described. The first inspection image wiring line 71 is connected to the source electrode of the (4m−3)th red inspection TFT 76R, the source electrode of the (4m−3)th blue inspection TFT 76B, and the source electrode of the (4m−2)th green inspection TFT 76G, counting from the left end, where "m" is an integer. The second inspection image wiring line 72 is connected to the source electrode of the (4m−3)th green inspection TFT 76G, the source electrode of the (4m−2)th red inspection TFT 76R, and the source electrode of the (4m−2)th blue inspection TFT 76B, counting from the left end, where "m" is an integer. The third inspection image wiring line 73 is connected to the source electrode of the (4m−1)th red inspection TFT 76R, the source electrode of the (4m−1)th blue inspection TFT 76B, and the source electrode of the 4mth green inspection TFT 76G, counting from the left end, where "m" is an integer. The fourth inspection image wiring line 74 is connected to the source electrode of the (4m−1)th green inspection TFT 76G, the source electrode of the 4mth red inspection TFT 76R, and the source electrode of the 4mth blue inspection TFT 76B, counting from the left end, where "m" is an integer.

During inspection, when a scanning signal for inspection is input from the inspection device to the inspection drive wiring lines 75R, 75G, and 75B, the inspection TFTs 76R, 76G, 76B connected to the inspection drive wiring lines 75R, 75G, and 75B to which the scanning signal is input are turned on. When an image signal for inspection is input from the inspection device to the inspection image wiring lines 71 to 74 for inspection in synchronization with the input of the scanning signal for inspection, the image signal for inspection is supplied to the source wiring lines 422 connected to the inspection TFTs 76R, 76G, and 76B in the on state. On the other hand, the gate drive circuit 418 drives a scanning signal to the gate wiring lines 421 in synchronization with input of scanning signals for inspection to the inspection drive wiring lines 75R, 75G, and 75B, thereby turning on the pixel TFTs 423. Thus, predetermined pixel electrodes 424 are charged to a potential based on the image signals for inspection, so that the image for inspection can be displayed. By visually inspecting the image for inspection, the presence or absence of disconnection of the source wiring lines 422, the presence or absence of malfunction of the pixel TFTs 423, and the like can be inspected.

The second protection circuit 80 will be described. As illustrated in FIG. 25, the second protection circuit 80 includes multiple second unit protection circuit units (second circuit units) 80U. The number of the second unit protection circuit units 80U is an integer multiple of the number of the inspection drive wiring lines 75R, 75G, and 75B. The second unit protection circuit unit 80U includes the low potential power source wiring line (second wiring line) 427 and the high potential power source wiring line (second wiring line) 428, a first protection TFT 81 connected to the low potential power source wiring line 427 and one of the inspection drive wiring lines 75R, 75G, and 75B, and a second protection TFT 82 connected to the high potential power source wiring line 428 and one of the inspection drive wiring lines 75R, 75G, and 75B. These protection TFTs 81 and 82 are both N-channel transistors. The first protection TFT 81 includes a gate electrode and a drain electrode connected to the low potential power source wiring line 427, and a source electrode connected to one of the inspection drive wiring lines 75R, 75G, and 75B. The second protection TFT 82 includes a gate electrode and a source electrode connected to one of the inspection drive wiring lines 75R, 75G, and 75B, and a drain electrode connected to the high potential power source wiring line 428. A threshold voltage of the second protection TFT 82 is higher than the potential of the inspection scanning signals supplied to the inspection drive wiring lines 75R, 75G, and 75B. Therefore, even when scanning signals for inspection are supplied from the inspection device to the inspection drive wiring lines 75R, 75G, and 75B, the first protection TFT 81 and the second protection TFT 82 are not turned on. The potentials of the scanning signals for inspection supplied to the inspection drive wiring lines 75R, 75G, and 75B are equal to or higher than the low potential of the low potential power source wiring line 427 and equal to or lower than the high potential of the high potential power source wiring line 428. Here, when electrostatic discharge occurs and a surge outside the range from the low potential of the low potential power source wiring line 427 to the high potential of the high potential power source wiring line 428 is input to the inspection drive wiring lines 75R, 75G, and 75B, either the first protection TFT 81 or the second protection TFT 82 is turned on. This allows the surge to escape to the low potential power source wiring line 427 or the high potential power source wiring line 428. As a result, the inspection TFTs 76R, 76G, 76B, and the like connected to the inspection drive wiring lines 75R, 75G, and 75B can be protected from surges.

Figure 26:
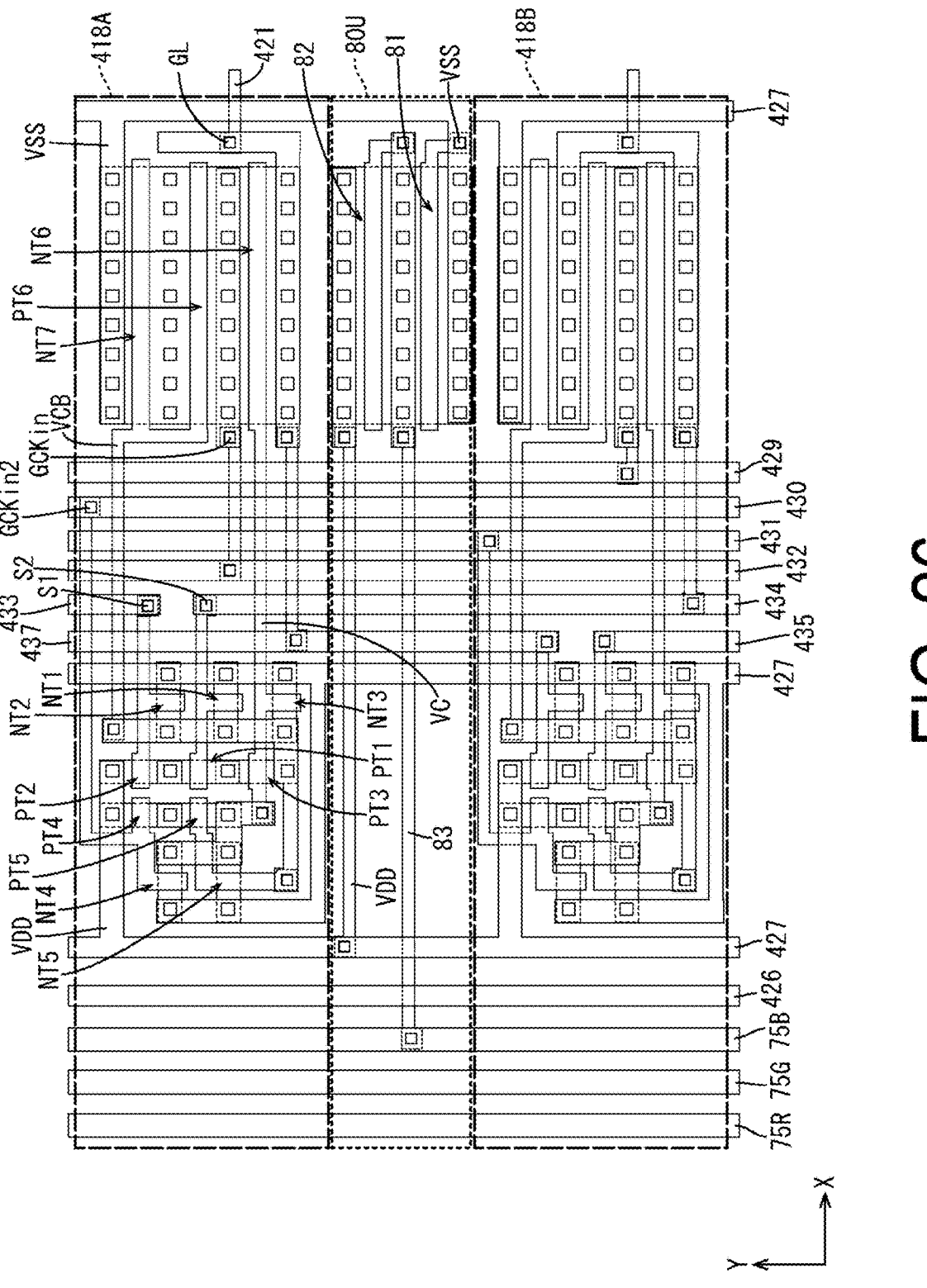
FIG. 26 is an enlarged plan view of unit gate circuit units of a gate drive circuit and a second unit protection circuit unit of a second protection circuit according to the fifth embodiment.

Next, a relationship between the gate drive circuit 418 and the second protection circuit 80 will be described with reference to FIG. 26. FIG. 26 illustrates a first unit gate circuit unit 418A and a second unit gate circuit unit 418B as the unit gate circuit units 418U, which are components of the gate drive circuit 418, and one second unit protection circuit unit 80U, which is a component of the second protection circuit 80. FIG. 26 also illustrates the wiring lines 75R, 75G, 75B, and 427 to 437 connected to the gate drive circuit 418 and the second protection circuit 80.

As illustrated in FIG. 26, the wiring lines 75R, 75G, 75B, and 427 to 437 connected to the gate drive circuit 418 and the second protection circuit 80 are all linear and extend along the Y-axis direction (first direction). The arrangement of the wiring lines 427 to 437 is as described in the first embodiment. The blue inspection drive wiring line 75B is located at a position spaced apart on the outside from the potential power source wiring line 428 located on the outer side among the wiring lines 427 to 437. The green inspection drive wiring line 75G is located at a position spaced apart on the outside from the blue inspection drive wiring line 75B. The red inspection drive wiring line 75R is located at a position spaced apart on the outside from the green inspection drive wiring line 75G. The unit gate circuit unit 418U and the second unit protection circuit unit 80U are elongated in a plan view in the X-axis direction (second direction) that intersects the wiring lines 75R, 75G, 75B, and 427 to 437. The unit gate circuit unit 418U and the second unit protection circuit unit 80U are located side by side along the wiring lines 75R, 75G, 75B, and 427 to 437 described above. To be specific, the second unit protection circuit unit 80U is located so as to be interposed between two unit gate circuit units 418U that are located with a space in the Y-axis direction. Note that the unit gate circuit unit 418U is connected to the gate wiring line 421, the low potential power source wiring line 427, the high potential power source wiring line 428, and the like, and is a component of the gate drive circuit 418, while the second unit protection circuit unit 80U is connected to the low potential power source wiring line 427, the high potential power source wiring line 428, and the like but is not connected to the gate wiring line 421, and is a component of the second protection circuit 80. Therefore, the unit gate circuit unit 418U and the second unit protection circuit unit 80U are functionally different circuit units.

Thus, in the non-display region NAA, the second unit protection circuit unit 80U is located adjacent to the unit gate circuit unit 418U, which is a different circuit unit, along the low potential power source wiring line 427 and the high potential power source wiring line 428, as illustrated in FIG. 26. Therefore, compared to a case where the second unit protection circuit unit is located adjacent to the unit gate circuit unit 418U along a direction intersecting the low potential power source wiring line 427 and the high potential power source wiring line 428, an arrangement space in the direction intersecting the low potential power source wiring line 427 and the high potential power source wiring line 428 can be reduced. This improves layout efficiency of the unit gate circuit units 418U and the second unit protection circuit units 80U in the non-display region NAA, thereby enabling the frame of the array substrate 412 to be narrowed. As described above, the second unit protection circuit units 80U can be located adjacent to the unit gate circuit units 418U that constitute the gate drive circuit 418. This allows the second unit protection circuit units 80U to be provided together with the unit gate circuit units 418U without increasing an arrangement space for the gate drive circuit 418. The low potential and high potential power source wiring lines connected to both the gate circuit 418 and the second protection circuit unit 80 are each used in common. When the second protection circuit unit 80 is located adjacent to the unit gate circuit unit 418U along the direction intersecting the low potential power source wiring line 427 and the high potential power source wiring line 428, the low potential power source wiring line 427 and the high potential power source wiring line 428 need to be located separately in both the second protection circuit unit 80 and the unit gate circuit unit 418U. However, in the present embodiment, these wiring lines are used in common, which is advantageous for further narrowing the frame.

As illustrated in FIG. 26, the protection TFTs 81 and 82, which are components of the second unit protection circuit unit 80U, are located to be interposed between the low potential power source wiring line 427 at the innermost position and a wiring line group consisting of the clock wiring lines 429 to 432, the set wiring lines 433 to 437, and the low potential power source wiring line 427. That is, a sixth N-channel transistor NT406, a seventh N-channel transistor NT407, and a sixth P-channel transistor PT406, which are components of the unit gate circuit unit 418U, and the protection TFTs 81 and 82, which are components of the second unit protection circuit unit 80U, are located adjacent to each other along the low potential power source wiring line 427 and the high potential power source wiring line 428, and are positioned at substantially the same distance from the display region AA.

As illustrated in FIG. 26, the source electrode of the first protection TFT 81 and the source electrode of the second protection TFT 82 are used in common and are connected to a connection terminal 83 formed of the first metal film. The connection terminal 83 extends from the source electrodes of the protection TFTs 81 and 82 toward the outer side, crosses the wiring line group consisting of the clock wiring lines 429 to 432, the set wiring lines 433 to 437, and the low potential power source wiring line 427, and is connected to one of the inspection drive wiring lines 75R, 75G, and 75B. The gate electrode and the drain electrode of the first protection TFT 81 are connected to each other and also connected to a power supply voltage terminal VSS formed of the second metal film. The gate electrode and the source electrode of the second protection TFT 82 are connected to each other and also connected to a power supply voltage terminal VDD formed of the first metal film. The power supply voltage terminal VDD extends from the gate electrode and the source electrode of the second protection TFT 82 toward the outer side, crosses the wiring line group consisting of the clock wiring lines 429 to 432, the set wiring lines 433 to 437, and the low potential power source wiring line 427, and is connected to the high potential power source wiring line 428.

As described above, the unit gate circuit unit 418U according to the present embodiment has an elongated shape in a plan view, as illustrated in FIG. 26, and is located between the low potential power source wiring line (third wiring line) 427 located on one end side (the innermost position) in the longitudinal direction and the red inspection drive wiring line (fourth wiring line) 75R located on another end side (the outermost position) in the longitudinal direction. On the other hand, the second unit protection circuit unit 80U is also located within a range sandwiched between the low potential power source wiring line 427 located at the innermost position and the red inspection drive wiring line 75R located at the outermost position. In other words, the second unit protection circuit unit 80U is placed within a range in which the unit gate circuit unit 418U is placed in the longitudinal direction. Thus, the second unit protection circuit units 80U do not protrude relative to the unit gate circuit units 418U, so that the layout efficiency of the unit gate circuit units 418U and the second unit protection circuit units 80U is further improved.

As described above, according to the present embodiment, the non-display region NAA is provided with the inspection circuit 70 that is located on the side opposite to the side of the driver 416 with respect to the source wiring lines 422 and is connected to the source wiring lines 422, and the inspection drive wiring lines (inspection wiring lines) 75R, 75G, and 75B that extend along the second wiring lines and are connected to the inspection circuit 70, the second wiring lines are the low potential power source wiring line 427 and the high potential power source wiring line 428, and the second circuit unit is connected to the inspection drive wiring lines 75R, 75G, and 75B and is the second protection circuit 80 that protects the inspection drive wiring lines 75R, 75G, and 75B and the inspection circuit 70 from electrostatic discharge. Even when electrostatic discharge occurs, the second unit protection circuit unit 80U being the second circuit unit, which is a component of the second protection circuit 80, allows the surge to escape to the low potential power source wiring line 427 and the high potential power source wiring line 428, which are the second wiring lines. Thus, the inspection drive wiring lines 75R, 75G, and 75B connected to the second unit protection circuit unit 80U, which is the second circuit unit, and the inspection circuit 70 connected to the inspection drive wiring lines 75R, 75G, and 75B can be protected from electrostatic discharge.

Sixth Embodiment

A sixth embodiment will be described with reference to FIGS. 27 to 29. The sixth embodiment is different from the fifth embodiment in that the inspection circuit 70 and the second protection circuit 80 are omitted, a third protection circuit 90 is added, and the number of drivers 516 is changed. Further, repetitive descriptions of structures, actions, and effects similar to those of the first embodiment described above will be omitted.

Figure 27:
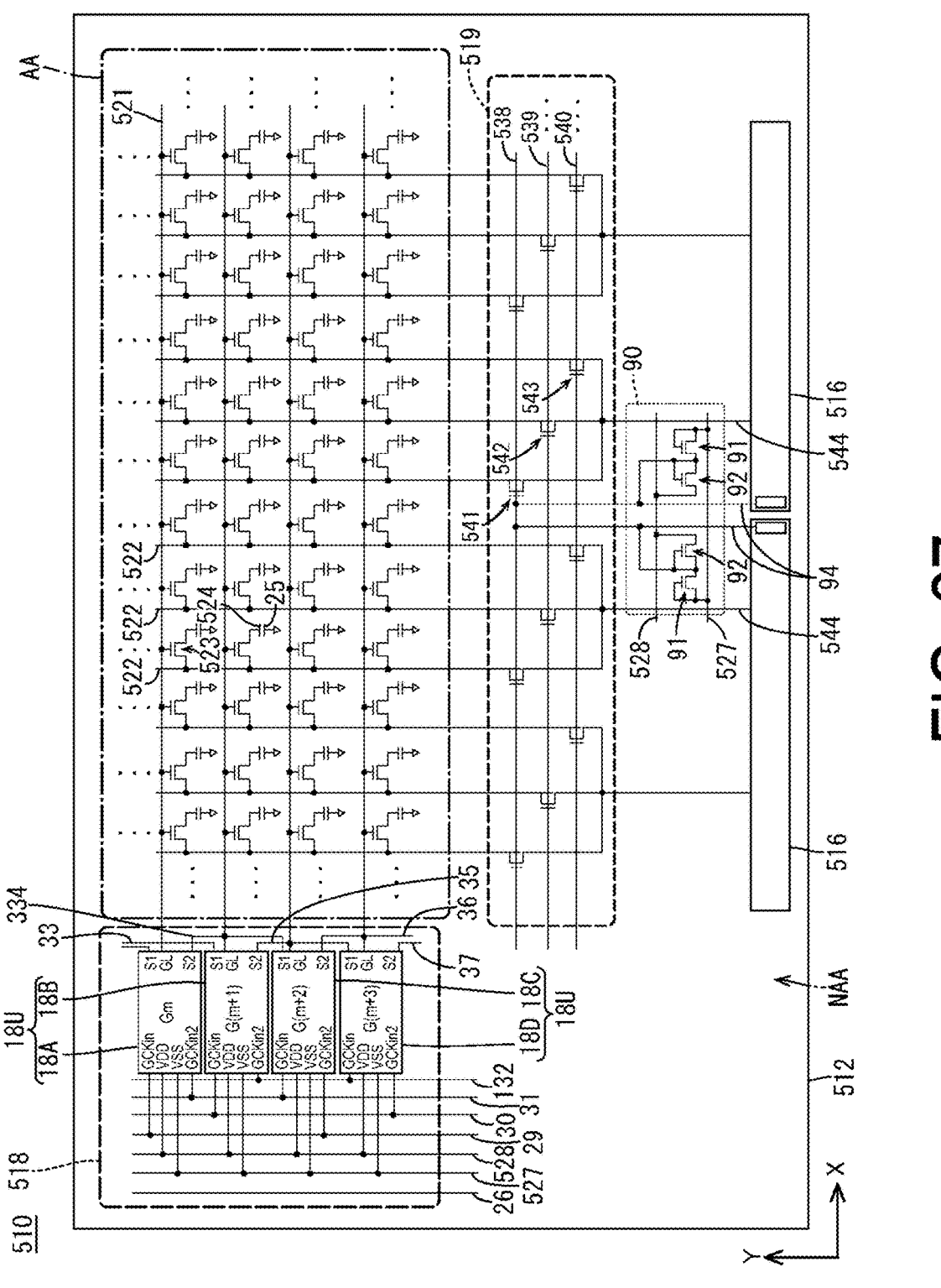
FIG. 27 is a circuit diagram illustrating an electrical configuration of a liquid crystal panel according to a sixth embodiment.
Figure 28:
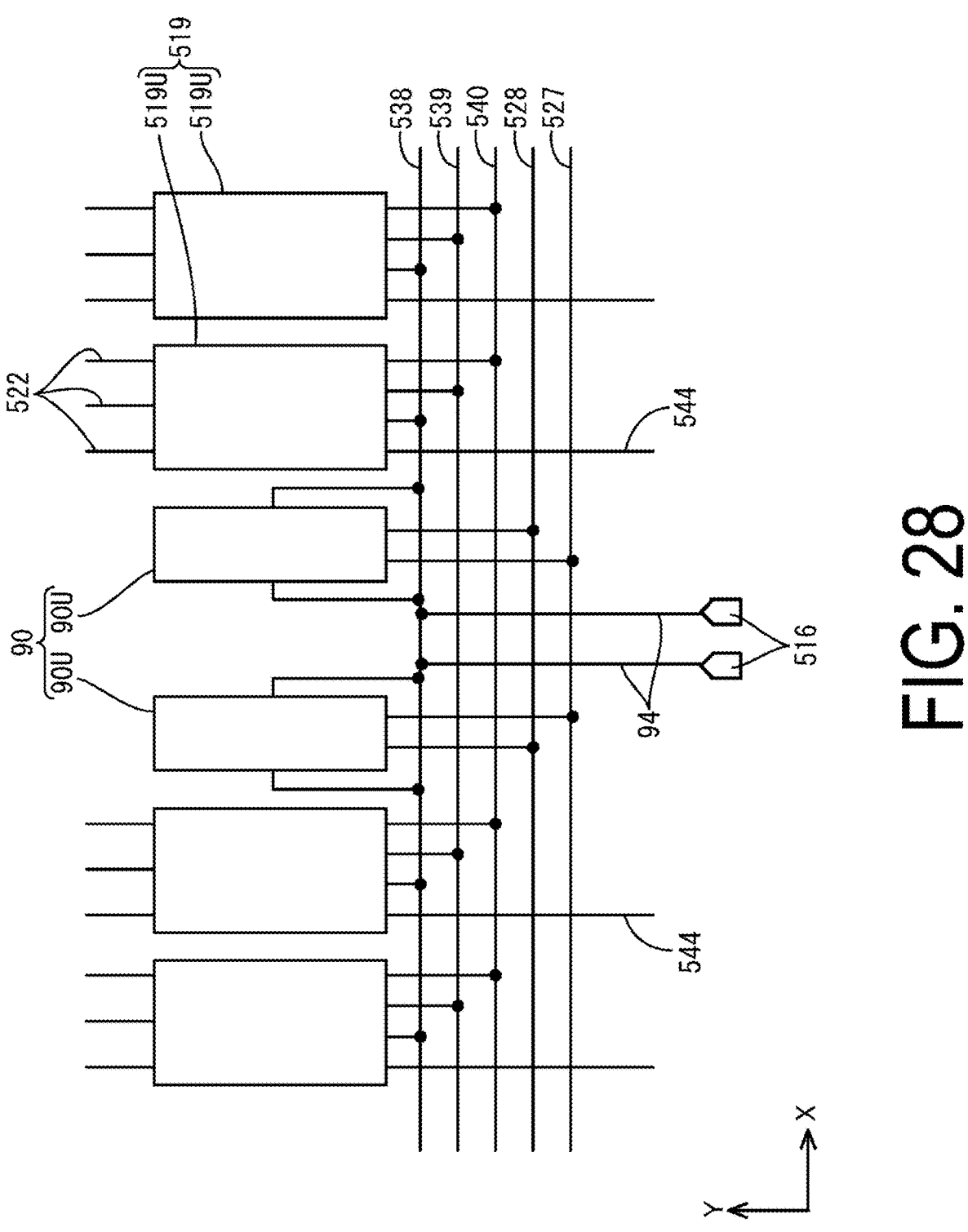
FIG. 28 is a circuit diagram illustrating a circuit configuration of unit switch circuit units, which are components of a switch circuit, and third unit protection circuit units of a third protection circuit provided in the liquid crystal panel according to the sixth embodiment.

As illustrated in FIG. 27, a liquid crystal panel 510 according to the present embodiment includes two drivers 516. The two drivers 516 are located at positions spaced apart in an X-axis direction between a flexible substrate 17 and a display region AA. The liquid crystal panel 510 includes the third protection circuit 90 for protecting a switch circuit 519. The third protection circuit 90 is positioned in a short side portion of a non-display region NAA on a side of the drivers 516 with respect to the display region AA in a Y-axis direction and is located to overlap a range in which the switch circuit 519 exists. The liquid crystal panel 510 is provided with connection wiring lines 94 connected to switch wiring lines (second wiring lines) 538 to 540, which are components of the switch circuit 519, and the drivers 516. Switch signals output from the drivers 516 are supplied to the switch wiring lines 538 to 540 via the connection wiring lines 94. The number of the connection wiring lines 94 is equal to the number of the switch wiring lines 538 to 540 multiplied by the number of the drivers 516. That is, each driver 516 is connected to the switch wiring lines 538 to 540 by corresponding connection wiring lines 94.

Next, a configuration of the third protection circuit 90 will be described. As illustrated in FIG. 28, the third protection circuit 90 includes multiple third unit protection circuit units (second circuit units) 90U arranged along a length direction thereof (substantially an X-axis direction). The number of the third unit protection circuit units 90U is equal to the number of the connection wiring lines 94. The third unit protection circuit unit 90U includes a low potential power source wiring line 527 and a high potential power source wiring line 528, a first protection TFT 91 connected to the low potential power source wiring line 527 and the connection wiring line 94, and a second protection TFT 92 connected to the high potential power source wiring line 528 and the connection wiring line 94. These protection TFTs 91 and 92 are both N-channel transistors. The first protection TFT 91 includes a gate electrode and a drain electrode connected to the low potential power source wiring line 527, and a source electrode connected to the connection wiring line 94. The second protection TFT 92 includes a gate electrode and a source electrode connected to the connection wiring line 94, and a drain electrode connected to the high potential power source wiring line 528. A threshold voltage of the second protection TFT 92 is lower than a potential of a switch signal supplied to the connection wiring line 94. Therefore, even when a switch signal is supplied from the driver 516 to the connection wiring line 94, the first protection TFT 91 and the second protection TFT 92 are not turned on. The potential of a switch signal supplied to the connection wiring line 94 is equal to or higher than the low potential of the low potential power source wiring line 527 and equal to or lower than the high potential of the high potential power source wiring line 528. Here, when electrostatic discharge occurs and a surge outside the range from the low potential of the low potential power source wiring line 527 to the high potential of the high potential power source wiring line 528 is input to the connection wiring line 94, either the first protection TFT 91 or the second protection TFT 92 is turned on. This allows the surge to escape to the low potential power source wiring line 527 or the high potential power source wiring line 528. As a result, the driver 516 and the like connected to the connection wiring line 94 can be protected from surges.

Next, a relationship between the switch circuit 519 and the third protection circuit 90 will be described with reference to FIG. 29. FIG. 29 illustrates four unit switch circuit units 519U, which are components of the switch circuit 519, and two third unit protection circuit units 90U, which are components of the third protection circuit 90. FIG. 29 also illustrates the wiring lines 94, 527, 528, and 538 to 540 connected to the switch circuit 519 and the third protection circuit 90.

Figure 29:
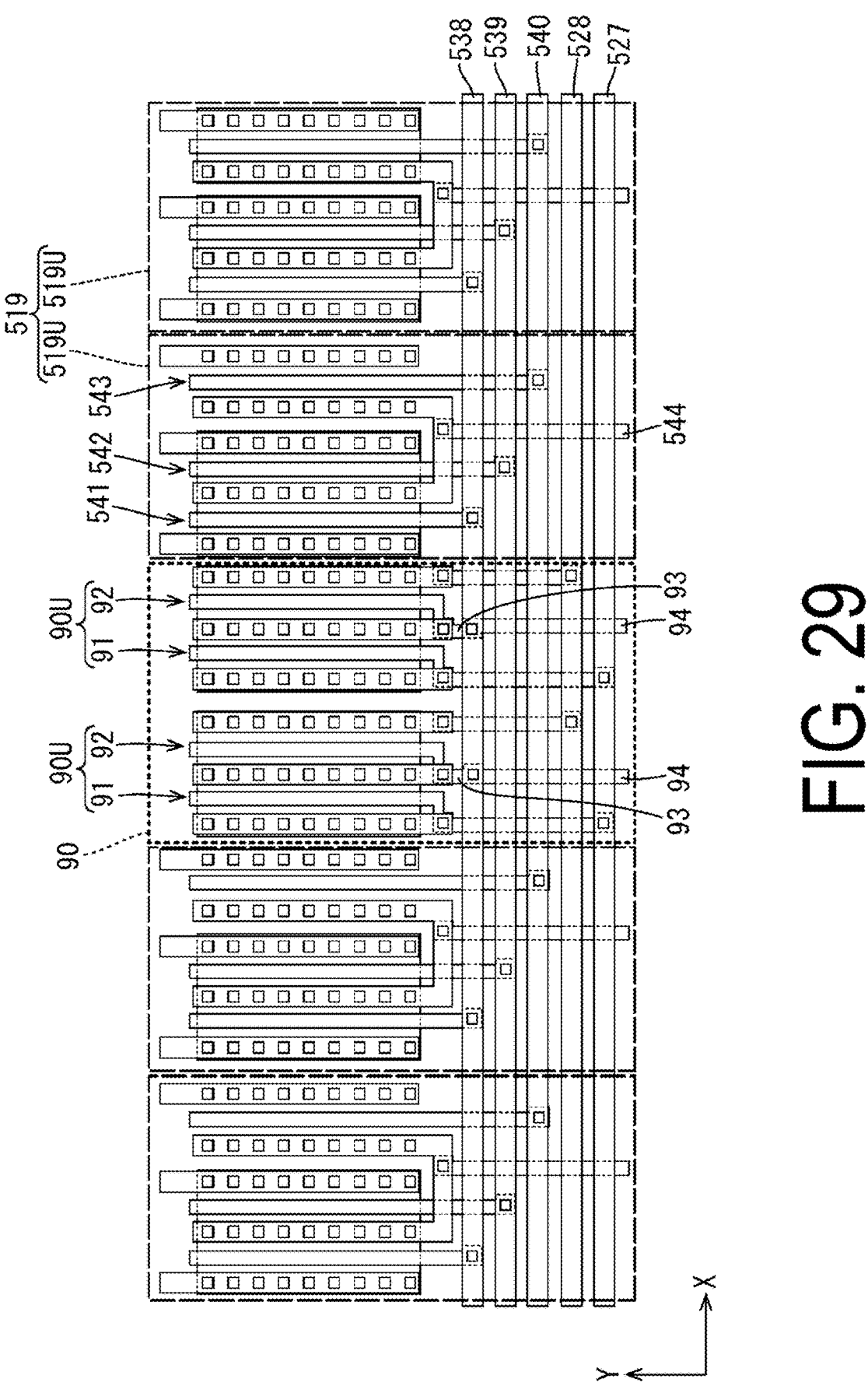
FIG. 29 is an enlarged plan view of the unit switch circuit units of the switch circuit and the third unit protection circuit units of the third protection circuit according to the sixth embodiment.

As illustrated in FIG. 29, the wiring lines 527, 528, and 538 to 540 connected to the switch circuit 519 and the third protection circuit 90 are all linear and extend along the X-axis direction (first direction). The wiring lines 527, 528, and 538 to 540 are spaced apart in the Y-axis direction and are arranged in the following order from the side closest to the driver 516: the low potential power source wiring line 527, the high potential power source wiring line 528, the blue switch wiring line 540, the green switch wiring line 539, and the red switch wiring line 538. These wiring lines 527, 528, and 538 to 540 are all formed of the second metal film. On the other hand, the connection wiring line 94 is formed of the first metal film, has a linear shape extending along the Y-axis direction (second direction), and is located to cross the above-described wiring lines 527, 528, and 538 to 540. The unit switch circuit unit 519U and the third unit protection circuit unit 90U are elongated in a plan view in the Y-axis direction that intersects the wiring lines 527, 528, and 538 to 540. The unit switch circuit unit 519U and the third unit protection circuit unit 90U are located side by side along the wiring lines 527, 528, and 538 to 540 described above. To be specific, the third unit protection circuit units 90U are located so as to be interposed between two unit switch circuit units 519U that are located with a space in the X-axis direction. In the present embodiment, two third unit protection circuit units 90U arranged with a space in the X-axis direction are interposed between two unit switch circuit units 519U. Note that the unit switch circuit unit 519U is connected to a source wiring line 522, a source trunk wiring line 544, the low potential power source wiring line 527, the high potential power source wiring line 528, and the like, and is a component of the switch circuit 519, while the third unit protection circuit unit 90U is connected to the low potential power source wiring line 527, the high potential power source wiring line 528, and the like but is not connected to the source wiring line 522 or the source trunk wiring line 544, and is a component of the third protection circuit 90. Therefore, the unit switch circuit unit 519U and the third unit protection circuit unit 90U are functionally different circuit units.

Thus, in the non-display region NAA, the third unit protection circuit unit 90U is located adjacent to the unit switch circuit unit 519U, which is a different circuit unit, along the low potential power source wiring line 527 and the high potential power source wiring line 528, as illustrated in FIG. 29. Therefore, compared to a case where the third unit protection circuit unit is located adjacent to the unit switch circuit unit 519U along a direction intersecting the low potential power source wiring line 527 and the high potential power source wiring line 528, an arrangement space in the direction intersecting the low potential power source wiring line 527 and the high potential power source wiring line 528 can be reduced. This improves layout efficiency of the unit switch circuit units 519U and the third unit protection circuit units 90U in the non-display region NAA, thereby enabling the frame of an array substrate 512 to be narrowed. As described above, the third unit protection circuit units 90U can be located adjacent to the unit switch circuit units 519U that constitute the switch circuit 519. This allows the third unit protection circuit units 90U to be provided together with the unit switch circuit units 519U without increasing an arrangement space for the switch circuit 519. The switch circuit 519 and the third protection circuit 90 share the red switch wiring line 538. When the third protection circuit 90 is located adjacent to the switch circuit 519 along a direction intersecting the red switch wiring line 538, the red switch wiring line 538 needs to be located separately in both the third protection circuit 90 and the switch circuit 519. However, in the present embodiment, this wiring line is used in common, which is advantageous for further narrowing the frame.

The switch TFTs 541 to 543, which are components of the unit switch circuit unit 519U, are placed to be interposed between the red switch wiring line 538, which is placed farthest from the driver 516 among the wiring lines 527, 528, and 538 to 540, and the display region AA, as illustrated in FIG. 29. The protection TFTs 91 and 92, which are components of the third unit protection circuit unit 90U, are placed to be interposed between the red switch wiring line 538, which is placed farthest from the driver 516 among the wiring lines 527, 528, and 538 to 540, and the display region AA. Accordingly, the switch TFTs 541 to 543, which are components of the unit switch circuit unit 519U, and the protection TFTs 91 and 92, which are components of the third unit protection circuit unit 90U, are located adjacent to each other along the low potential power source wiring line 527 and the high potential power source wiring line 528, and are positioned at substantially the same distance from the display region AA.

As illustrated in FIG. 29, the source electrode of the first protection TFT 91 and the source electrode of the second protection TFT 92 are used in common and are connected to the connection terminal 93 formed of the first metal film. The connection terminal 93 extends from the source electrodes of the protection TFTs 91 and 92 toward the outer side and is connected to one of the switch wiring lines 538 to 540. The connection terminal 93 is directly connected to the connection wiring line 94 formed of the same first metal film. The gate electrode and the drain electrode of the first protection TFT 91 are connected to each other and also connected to a power supply voltage terminal VSS formed of the first metal film. The power supply voltage terminal VSS formed of the first metal film extends from the gate electrode and the drain electrode of the first protection TFT 91 toward the driver 516 side, crosses the wiring lines 528, and 538 to 540, and is connected to the low potential power source wiring line 527. The gate electrode and the source electrode of the second protection TFT 92 are connected to each other and also connected to a power supply voltage terminal VDD formed of the first metal film. The power supply voltage terminal VDD extends from the gate electrode and the source electrode of the second protection TFT 92 toward the outer side, crosses the switch wiring lines 538 to 540, and is connected to the high potential power source wiring line 528.

As described above, according to the present embodiment, the display region AA is provided with gate wiring lines (sixth wiring lines) 521 intersecting the source wiring lines (first wiring lines) 522, pixel TFTs 523 connected to the source wiring lines 522 and the gate wiring lines 521, and pixel electrodes 524 connected to the pixel TFTs 523, the non-display region NAA is provided with the drivers (first signal supply units) 516 connected to the source wiring lines 522 and supplying image signals to the source wiring lines 522, and a gate drive circuit (second signal supply unit) 518 connected to the gate wiring lines 521 and supplying scanning signals to the gate wiring lines 521, the multiple source wiring lines 522 are aligned, the second wiring lines are arranged to intersect the multiple source wiring lines 522, and first circuit units are connected to the multiple source wiring lines 522 and are interposed between the drivers 516 and the multiple source wiring lines 522 and constitute the switch circuit 519 that distributes the image signal supplied from the drivers 516 to the multiple source wiring lines 522. When the pixel TFTs 523 are driven in response to supply of scanning signals from the gate drive circuit 518 to the gate wiring lines 521, the pixel electrodes 524 connected to the pixel TFTs 523 are charged to potentials based on the image signals supplied from the driver 516 to the source wiring lines 522 via the switch circuit 519. The third unit protection circuit units 90U being the second circuit units can be located adjacent to the unit switch circuit units 519U being the first circuit units, which constitute the switch circuit 519. This allows the third unit protection circuit units 90U being the second circuit units to be provided together with the unit switch circuit units 519U without increasing an arrangement space for the switch circuit 519.

The non-display region NAA is provided with the potential power source wiring lines (power source wiring lines) 527 and 528 extending along the second wiring lines, the second wiring lines are the switch wiring lines 538 to 540, which are connected to the unit switch circuit 519U being the first circuit unit, and supply switch signals for switching the source wiring lines 522 that supply the image signals, and the second circuit units are connected to the switch wiring lines 538 to 540 and the potential power source wiring lines 527 and 528 and constitute the third protection circuit 90 that protects the switch circuit 519 from electrostatic discharge. Even when electrostatic discharge occurs, the third unit protection circuit units 90U being the second circuit units, which constitute the third protection circuit 90, allow the surge to escape to the power source wiring lines. Thus, the switch wiring lines 538 to 540, which are the second wiring lines, connected to the third unit protection circuit unit 90U being the second circuit unit, and the unit switch circuit 519U being the first circuit unit connected to the switch wiring lines 538 to 540, can be protected from electrostatic discharge.

Seventh Embodiment

A seventh embodiment will be described with reference to FIG. 30. The seventh embodiment is different from the first embodiment described above in that a planar shape and the like in a display region AA are changed. Further, repetitive descriptions of structures, actions, and effects similar to those of the first embodiment described above will be omitted.

Figure 30:
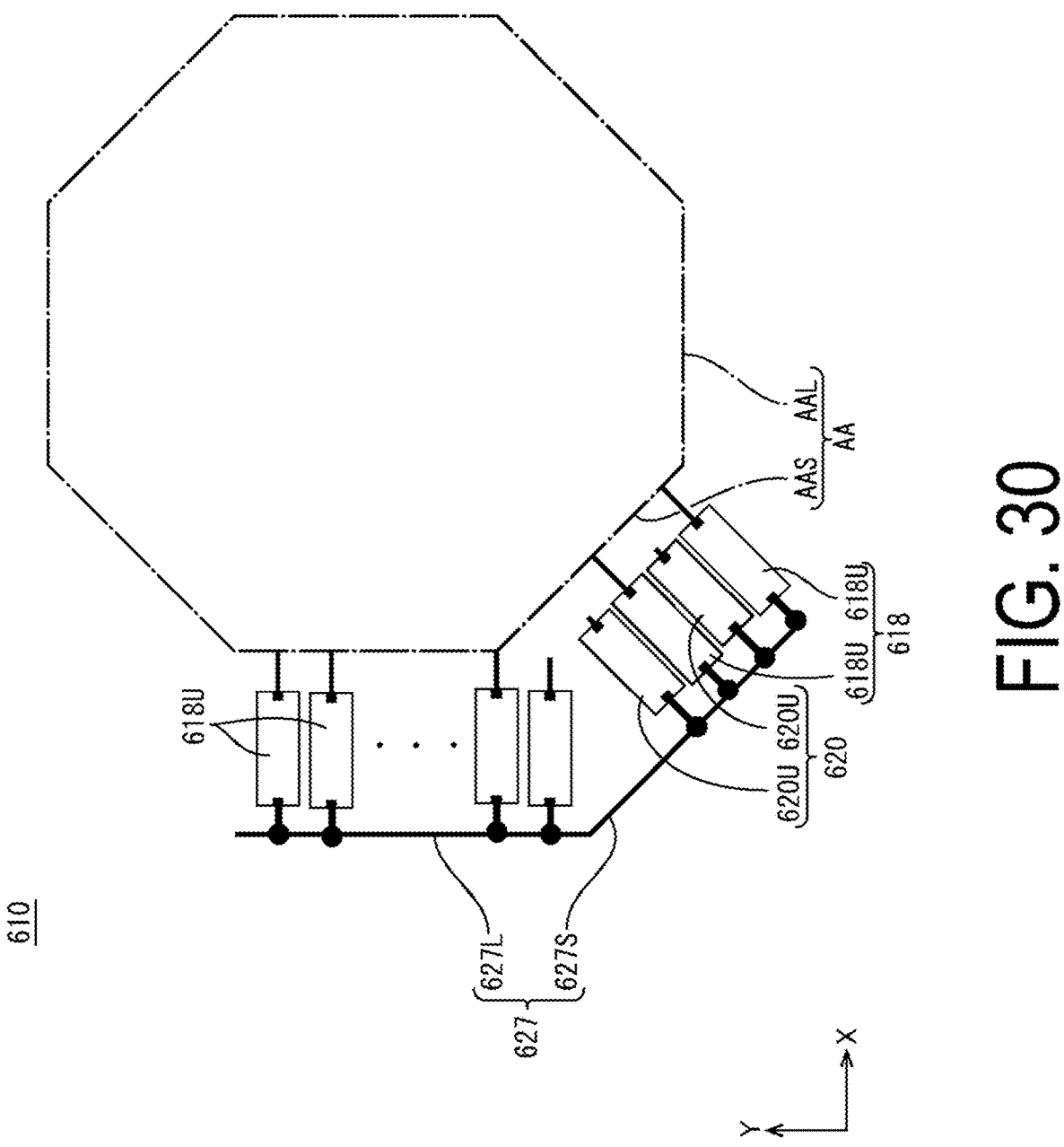
FIG. 30 is a plan view illustrating unit gate circuit units of a gate drive circuit and first unit protection circuit units of a first protection circuit provided in a liquid crystal panel according to a seventh embodiment.

The display region AA of a liquid crystal panel 610 according to the present embodiment has a substantially regular octagonal planar shape, as illustrated in FIG. 30. The display region AA has linear contours AAL that are linear along an X-axis direction or a Y-axis direction, and inclined contours AAS that are inclined with respect to both the X-axis direction and the Y-axis direction in a plan view. A planar outer shape of the display region AA follows an outer shape of the liquid crystal panel 610 in a plan view. Note that in FIG. 30, unit gate circuit units 618U that constitute a gate drive circuit 618 and first unit protection circuit units 620U that constitute a first protection circuit 620 are illustrated in a simplified manner, and a low potential power source wiring line 627 is illustrated as a representative of second wiring lines. Specific configurations of the unit gate circuit unit 618U and the first unit protection circuit unit 620U are as described in the first embodiment (see FIG. 6).

The low potential power source wiring line 627, which is the second wiring line, includes a linear portion 627L that is linear along the Y-axis direction (first direction), and an inclined linear portion 627S that is inclined in a plan view with respect to both the Y-axis direction and the X-axis direction, as illustrated in FIG. 30. The inclined linear portion 627S is substantially parallel to the inclined contour AAS. The unit gate circuit unit 618U and the first unit protection circuit unit 620U are located side by side along the inclined linear portion 627S described above. To be specific, the unit gate circuit units 618U and the first unit protection circuit units 620U are located alternately and repeatedly one by one along the inclined linear portion 627S in an overlapping portion of the first protection circuit 620 and the gate drive circuit 618. Two unit gate circuit units 618U are arranged side by side with a space in the direction along the inclined linear portion 627S, and one first unit protection circuit unit 620U is interposed between the two unit gate circuit units 618U. Conversely, two first unit protection circuit units 620U are arranged side by side with a space in the direction along the inclined linear portion 627S, and one unit gate circuit unit 618U is interposed between the two first unit protection circuit units 620U.

As described above, in the present embodiment, the first unit protection circuit unit 620U is adjacent to the unit gate circuit unit 618U along the inclined linear portion 627S, and is located between the two unit gate circuit units 618U, as illustrated in FIG. 30. A distance between the two unit gate circuit units 618U in the direction along the inclined linear portion 627S is wider than a distance between the two unit gate circuit units 618U in the Y-axis direction (first direction). Therefore, a sufficient space can be secured for the first unit protection circuit unit 620U located between the two unit gate circuit units 618U. As described above, the first unit protection circuit units 620U can be located adjacent to the unit gate circuit units 618U that constitute the gate drive circuit 618. This allows the first unit protection circuit units 620U to be provided together with the unit gate circuit units 618U without increasing an arrangement space for the gate drive circuit 618. The gate drive circuit 618 and the first unit protection circuit unit 620U share the low potential wiring line 627. When the first unit protection circuit unit 620U is located adjacent to the unit gate circuit unit 618U along a direction intersecting the low potential wiring line 627, the low potential wiring line 627 needs to be located separately in both the unit gate circuit unit 618U and the first unit protection circuit unit 620U. However, in the present embodiment, this wiring line is used in common, which is advantageous for further narrowing the frame.

As described above, according to the present embodiment, the low potential power source wiring line 627, which is the second wiring line, includes the linear portion 627L that is linear along the first direction and the inclined linear portion 627S that is inclined with respect to the first direction, at least two gate wiring lines 21 are arranged side by side with a space in the first direction, at least two unit gate circuit units 618U are arranged side by side with a space along the inclined linear portion 627S, and the first unit protection circuit unit 620U is located adjacent to the unit gate circuit unit 618U along the inclined linear portion 627S and is positioned between the two unit gate circuit units 618U. A distance between the two unit gate circuit units 618U in the direction along the inclined linear portion 627S is wider than a distance between the two unit gate circuit units 618U in the first direction. Therefore, a sufficient space can be secured for the first unit protection circuit unit 620U located between the two unit gate circuit units 618U.

OTHER EMBODIMENTS

The techniques disclosed herein are not limited to the embodiments described above and illustrated in the drawings, and the following embodiments, for example, are also included within the technical scope.

(1) In the configuration described in the first embodiment, multiple unit gate circuit units 18U and multiple first unit protection circuit units 20U may be alternately located, multiple unit gate circuit units 18U and one first unit protection circuit unit 20U may be alternately located, or one unit gate circuit unit 18U and multiple first unit protection circuit units 20U may be alternately located.

(2) In the configuration described in the second embodiment, multiple unit gate circuit units 118U and multiple unit charge removal circuit units 50U may be alternately located, multiple unit gate circuit units 118U and one unit charge removal circuit unit 50U may be alternately located, or one unit gate circuit unit 118U and multiple unit charge removal circuit units 50U may be alternately located.

(3) In the configuration described in the third embodiment, multiple unit gate circuit units 218U and multiple unit common potential supply circuit units 60U may be alternately located, multiple unit gate circuit units 218U and one unit common potential supply circuit unit 60U may be alternately located, or one unit gate circuit unit 218U and multiple unit common potential supply circuit units 60U may be alternately located.

(4) In the configuration described in the fourth embodiment, multiple unit gate circuit units 318U, multiple unit charge removal circuit units 350U, and multiple unit common potential supply circuit units 360U may be alternately located, or multiple unit gate circuit units 318U, one unit charge removal circuit unit 350U, and one unit common potential supply circuit unit 360U may be alternately located. Alternatively, multiple unit gate circuit units 318U, multiple unit charge removal circuit units 350U, and one unit common potential supply circuit unit 360U may be alternately located, or multiple unit gate circuit units 318U, one unit charge removal circuit unit 350U, and multiple unit common potential supply circuit units 360U may be alternately located. Alternatively, one unit gate circuit unit 318U, multiple unit charge removal circuit units 350U, and one unit common potential supply circuit unit 360U may be alternately located, or one unit gate circuit unit 318U, one unit charge removal circuit unit 350U, and multiple unit common potential supply circuit units 360U may be alternately located.

(5) In the configuration described in the fifth embodiment, multiple unit gate circuit units 418U and multiple second unit protection circuit units 80U may be alternately located, multiple unit gate circuit units 418U and one second unit protection circuit unit 80U may be alternately located, or one unit gate circuit unit 418U and multiple second unit protection circuit units 80U may be alternately located.

(6) In the configuration described in the sixth embodiment, multiple unit switch circuit units 519U and one third unit protection circuit unit 90U may be alternately located, one unit switch circuit unit 519U and one third unit protection circuit unit 90U may be alternately located, or one unit switch circuit unit 519U and multiple third unit protection circuit units 90U may be alternately located.

(7) The number and arrangement of the wiring lines in the non-display region NAA of the array substrates 12, 112, 212, 312, 412, and 512 can be appropriately changed to any of those not illustrated in the drawings.

(8) The material of the semiconductor film forming the semiconductor portion of the TFTs 23, 41 to 43, 45, 46, 57, 65, 76B, 76G, 76R, 81, 82, 91, 92, 123, 223, 423, 523, and 541 to 543, and the transistors NT1 to NT7, NT201 to NT207, NT406, NT407, PT1 to PT6, PT201 to PT206, and PT406 may be an oxide semiconductor material, amorphous silicon, or the like.

(9) The configuration of the TFTs 23, 41 to 43, 45, 46, 57, 65, 76B, 76G, 76R, 81, 82, 91, 92, 123, 223, 423, 523, and 541 to 543, and the transistors NT1 to NT7, NT201 to NT207, NT406, NT407, PT1 to PT6, PT201 to PT206, and PT406 may be a bottom gate type, a double gate type, or the like other than a top gate type.

(10) Specific circuit configurations of the unit gate circuit units 18U, 118U, 218U, 318U, 418U, 518U, and 618U that constitute the gate drive circuit 18, 118, 218, 318, 418, 518, and 618 can be appropriately changed to configurations not illustrated in the drawings.

(11) The drivers 16, 116, 216, 316, and 416 may be mounted by chip on film (COF) on the flexible substrates 17, 117, 217, and 417, which are mounted by film on glass (FOG) on the array substrates 12, 112, 212, 312, 412, and 512, respectively.

(12) The gate drive circuits 18, 118, 218, 318, 418, 518, and 618 may be located on only one side with respect to the display region AA in the X-axis direction.

(13) The planar shapes of the liquid crystal panels 10, 110, 210, 310, 410, 510, and 610 may be a horizontally long rectangle, a square, a circle, a semicircle, an oval, an ellipse, a trapezoid, or the like.

(14) The number and arrangement of the unit switch circuit units 19U and 519U can be appropriately changed to those not illustrated in the drawings.

(15) The configurations of the unit switch circuit units 19U and 519U, the first unit protection circuit unit 20U, the second unit protection circuit unit 80U, the third unit protection circuit unit 90U, the unit charge removal circuit unit 350U, the unit common potential supply circuit unit 360U, and the inspection circuit 70 can be appropriately changed to an n-channel metal-oxide-semiconductor (NMOS), a p-channel metal-oxide-semiconductor (PMOS), a complementary metal oxide semiconductor (CMOS), or the like.

(16) In the configuration described in the seventh embodiment, the planar shape of the display region AA may be a regular triangle, a non-regular triangle, a regular pentagon, a non-regular pentagon, a regular hexagon, a non-regular hexagon, a regular heptagon, a non-regular heptagon, a non-regular octagon, or the like.

(17) The configuration described in the seventh embodiment may be combined with any of the configurations of the second embodiment to the sixth embodiment.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

The invention claimed is:

1. A display substrate comprising:

a first wiring line located in a display region where an image is displayed;

a second wiring line located in a non-display region where the image is not displayed;

a first circuit unit located in the non-display region and including a first output section connected to the first wiring line and a first input section connected to the second wiring line; and a second circuit unit located in the non-display region and connected to the second wiring line but not connected to the first wiring line, wherein at least two circuit units, each being identical to the first circuit unit, are arranged side by side, with a space therebetween, along the second wiring line, and the second circuit unit is located adjacent to the first circuit unit along the second wiring line and is located between the at least two circuit units in the non-display region.

2. The display substrate according to claim 1, wherein the second wiring line includes a linear portion, that is linear along a first direction, and a curved portion, that is curved and that intersects the first direction, at least wiring lines, each being identical to the first wiring line, are arranged side by side, with a space therebetween, in the first direction, the at least two circuit units are further arranged side by side, with the space therebetween, along the curved portion, and the second circuit unit is located adjacent to the first circuit unit along the curved portion.

3. The display substrate according to claim 1, wherein the second wiring line includes a linear portion, that is linear along a first direction, and an inclined linear portion, that is inclined with respect to the first direction, at least two wiring lines, each being identical to the first wiring line, are arranged side by side, with a space therebetween, in the first direction, the at least two first circuit units are further arranged side by side, with the space therebetween, along the inclined linear portion, and the second circuit unit is located adjacent to the first circuit unit along the inclined linear portion.

4. The display substrate according to claim 1, wherein the first circuit unit is elongated in a direction intersecting the second wiring line, and the second circuit unit is elongated in parallel with a longitudinal direction of the first circuit unit and is located within a range of the first circuit unit in the longitudinal direction.

5. The display substrate according to claim 1, further comprising:

a third wiring line extending along a first direction intersecting the first wiring line in the display region;

a switching element connected to the first wiring line and the third wiring line in the display region;

a pixel electrode connected to the switching element in the display region; and a signal supply unit connected to the third wiring line and configured to supply an image signal to the third wiring line in the non-display region, wherein a plurality of wiring lines, each being identical to the first wiring line, and the at least two circuit units are located side by side along the first direction, and the at least two circuit units form a shift register circuit configured to sequentially supply a scanning signal to the plurality of wiring lines.

6. The display substrate according to claim 5, wherein the second wiring line is a power source wiring line, and the second circuit unit is connected to the third wiring line and forms a first protection circuit configured to protect the third wiring line and the switching element from an electrostatic discharge.

7. The display substrate according to claim 5, further comprising:

an inspection circuit located on a side, opposite a side of the signal supply unit, with respect to the third wiring line, and connected to the third wiring line in the non-display region; and an inspection wiring line extending along the second wiring line and connected to the inspection circuit in the non-display region, wherein the second wiring line is a power source wiring line, and the second circuit unit is connected to the inspection wiring line and forms a second protection circuit configured to protect the inspection wiring line and the inspection circuit from an electrostatic discharge.

8. The display substrate according to claim 5, further comprising:

a charge removal wiring line extending along the second wiring line and set to a common potential, or a ground potential, in the non-display region, wherein the second wiring line is a first drive wiring line that is connected to the signal supply unit and that receives a first drive signal from the signal supply unit in response to an execution of a power-off sequence, and the second circuit unit includes a second input section that is connected to the third wiring line, and a second output section that is connected to the charge removal wiring line, and wherein the second circuit unit forms a charge removal circuit configured to move a charge of the pixel electrode to the charge removal wiring line, via the third wiring line, in response to supply of the first drive signal from the first drive wiring line.

9. The display substrate according to claim 5, further comprising:

a position detection electrode in the display region;

a position detection wiring line connected to the position detection electrode and the signal supply unit and configured to receive a position detection signal from the signal supply unit during a position detection period, in which a position detection is performed by the position detection electrode in the display region; and a common wiring line extending along the second wiring line and having a common potential in the non-display region, wherein the second wiring line is a second drive wiring line connected to the signal supply unit and configured to receive a second drive signal from the signal supply unit during a display period, in which the image is displayed, and the second circuit unit includes a third output section, that is connected to the position detection wiring line, and a third input section, that is connected to the common wiring line, wherein the second circuit unit forms a common potential supply circuit configured to supply a common potential to the position detection electrode, via the position detection wiring line, in response to a the second drive signal supplied by the second drive wiring line.

10. The display substrate according to claim 9, further comprising:

a low potential wiring line connected to the signal supply unit and configured to receive a low potential signal from the signal supply unit in the non-display region, wherein the first circuit unit includes an N-channel transistor, the common potential supply circuit includes a P-channel transistor, the N-channel transistor includes a first gate electrode connected to the second wiring line, a first source electrode connected to the low potential wiring line, and a first drain electrode connected to the first wiring line, and the P-channel transistor includes a second gate electrode connected to the second wiring line, a second source electrode connected to the common wiring line, and a second drain electrode connected to the position detection wiring line.

11. A display device comprising:

the display substrate according to claim 1; and a counter substrate facing the display substrate.

12. A display substrate comprising:

a first wiring line located in a display region where an image is displayed;

a second wiring line located in a non-display region where the image is not displayed;

a first circuit unit located in the non-display region and including a first output section connected to the first wiring line and a first input section connected to the second wiring line; and a second circuit unit located in the non-display region and connected to the second wiring line but not connected to the first wiring line, wherein:

the second circuit unit is located adjacent to the first circuit unit along the second wiring line in the non-display region, and the first circuit unit is elongated in a direction intersecting the second wiring line, wherein the display substrate further includes, in the non-display region:

a third wiring line extending parallel to the second wiring line and located on one end side of the first circuit unit in a longitudinal direction; and a fourth wiring line extending parallel to the second wiring line and located on another end side of the first circuit unit in the longitudinal direction, wherein the second circuit unit is located within a range sandwiched between the third wiring line and the fourth wiring line.

13. A display device comprising:

the display substrate according to claim 12; and a counter substrate facing the display substrate.

14. A display substrate comprising:

a first wiring line located in a display region where an image is displayed;

a second wiring line located in a non-display region where the image is not displayed;

a first circuit unit located in the non-display region and including a first output section connected to the first wiring line and a first input section connected to the second wiring line;

a second circuit unit located in the non-display region and connected to the second wiring line but not connected to the first wiring line;

a third wiring line intersecting the first wiring line in the display region;

a switching element connected to the first wiring line and the third wiring line in the display region;

a pixel electrode connected to the switching element in the display region;

a first signal supply unit connected to the first wiring line and configured to supply an image signal to the first wiring line in the non-display region; and a second signal supply unit connected to the third wiring line and configured to supply a scanning signal to the third wiring line in the non-display region, wherein:

the second circuit unit is located adjacent to the first circuit unit along the second wiring line in the non-display region, a plurality of first wiring lines, including the first wiring line, is arranged side by side, the second wiring line is located intersecting the plurality of first wiring lines, and the first circuit unit is connected to the plurality of first wiring lines, is interposed between the first signal supply unit and the plurality of first wiring lines, and forms a switch circuit configured to distribute the image signal supplied from the first signal supply unit to the plurality of first wiring lines.

15. The display substrate according to claim 14, further comprising:

a power source wiring line extending along the second wiring line in the non-display region, wherein the second wiring line is a switch wiring line connected to the first circuit unit and configured to supply a switch signal for switching the first wiring line that is configured to supply the image signal, and the second circuit unit is connected to both the switch wiring line and the power source wiring line and forms a third protection circuit configured to protect the switch circuit from an electrostatic discharge.

16. A display device comprising:

the display substrate according to claim 14; and a counter substrate facing the display substrate.

* * * * *